(12) United States Patent
Tanaka

(10) Patent No.: US 6,717,879 B2
(45) Date of Patent: Apr. 6, 2004

(54) SEMICONDUCTOR MEMORY DEVICE REQUIRING REFRESH OPERATION

(75) Inventor: Shinji Tanaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/369,506

(22) Filed: Feb. 21, 2003

(65) Prior Publication Data

US 2004/0047221 A1 Mar. 11, 2004

(30) Foreign Application Priority Data

Sep. 6, 2002 (JP) ...................................... 2002-261343

(51) Int. Cl.[7] ................................................ G11C 7/00
(52) U.S. Cl. ................... 365/222; 365/233; 365/230.03
(58) Field of Search ................................. 365/222, 203, 365/230.03, 230.06, 230.08, 189.01

(56) References Cited

U.S. PATENT DOCUMENTS 5,627,791 A * 5/1997 Wright et al. ............... 365/222
5,901,101 A * 5/1999 Suzuki et al. ............... 365/222
6,137,743 A * 10/2000 Kim ........................... 365/222
6,636,449 B2 * 10/2003 Matsuzaki .................. 365/222

FOREIGN PATENT DOCUMENTS

JP 7-64864 3/1995
JP 7-211061 8/1995

OTHER PUBLICATIONS

U.S. patent application Ser. No. 10/223,000, Tanaka, filed Aug. 19, 2002.

* cited by examiner

*Primary Examiner*—Gene Auduong
(74) *Attorney, Agent, or Firm*—McDermott, Will & Emery

(57) ABSTRACT

A sense amplifier band placed between two memory cell arrays includes: equalize circuits equalizing bit line pairs of the first memory cell array; and equalize circuits equalizing bit line pairs of the second memory cell array; and in addition, equalize circuits for initializing sense amplifiers. The sense amplifiers are initialized by equalize signals in pulse in response to an instruction of activation of one word line of the first and second memory cell arrays. Therefore, since data read out in the previous time is held in the sense amplifier, the data held in the sense amplifier can be read out at high speed without activation of a word line.

11 Claims, 18 Drawing Sheets

SEMICONDUCTOR MEMORY DEVICE REQUIRING REFRESH OPERATION

BACKGROUND OF THE INVENTION

1. Field of the Invention

The present invention relates to a semiconductor memory device capable of reading at high speed.

2. Description of the Background Art

A semiconductor memory device used mainly in a recent computer, such as a synchronous dynamic random access memory (SDRAM), performs a read operation with a combination of an activate command (ACT command) activating a word line and a read command (RD command) reading a value stored in a sense amplifier. Performing a burst operation outputting data at plural column addresses continuously, SDRAM can outputs data without a pause even if RD commands for the same word line are continuously inputted.

In a case where a read/write operation is performed on a memory cell connected to another word line, however, it is required that after a word line activated currently is deactivated, an objective word line is activated. Since a time is necessary for the operation, read-out data is interrupted somewhere in the course, thereby reducing an effective value of a transfer rate.

In SDRAM, in order to prevent reduction in a transfer rate, a memory region is divided into sections called memory banks each capable of operating independently. In a case where accesses are performed to memory cells at plural row addresses in the same memory bank, however, the effect of division of a memory region into memory banks has not been able to be obtained.

FIG. 21 is a circuit diagram showing a configuration in the neighborhood of a sense amplifier band of a prior art SDRAM.

Referring to FIG. 21, there are placed memory cell arrays MA#00 and MA#11 sharing a sense amplifier band SABX on both sides thereof in which plural sense amplifiers are disposed like a band. Memory cell array MA#00 includes plural memory cells Cell00, Cell10, Cell01 and Cell11 , . . . arranged in a matrix. Each memory cell includes: a capacitor 16 whose one end is fixed to a self-plate potential Vcp at a constant potential; and a transistor 18, connected between a corresponding bit line and the other end of capacitor 16, and having a gate connected to a corresponding word line.

Sense amplifier band SABX includes: a sense amplifier 962; an equalize circuit 922; and a connection circuit 964, all corresponding to a bit line pair BL0 and /BL0. Sense amplifier band SABX further includes: a sense amplifier 963; an equalize circuit 923; and a connection circuit 965, all corresponding to a bit line pair BL1 and /BL1.

Sense amplifier band SABX further includes: an isolation gate 960, becoming conductive in response to activation of a signal BLTG0 to connect bit line pair BL0 and /BL0 to equalize circuit 922 and sense amplifier 962, while isolating sense amplifier 962 and equalize circuit 922 from bit line pair BL0 and /BL0 in response to deactivation of signal BLTG0; and an isolation gate 961, connecting bit line pair BL1 and /BL1 to sense amplifier 963 and equalize circuit 923 in response to activation of signal BLTG0, while isolating sense amplifier 963 and equalize circuit 923 from bit line pair BL1 and /BL1 in response to deactivation of signal BLTG0.

Note that sense amplifier 962 and equalize circuit 922 are also used by bit line pair BL10 and /BL10 included in memory cell array MA#11.

For this reason, sense amplifier band SABX further includes: an isolation gate 966, connecting bit line pair BL10 and /BL10 to sense amplifier 962 and equalize circuit 922 in response to activation of a signal BLTG1, while isolating sense amplifier 962 and equalize circuit 922 from bit line pair BL10 and /BL10 in response to deactivation of signal BLTG1; and an isolation gate 967, connecting bit line pair BL11 and /BL11 to sense amplifier 963 and equalize circuit 923 in response to activation of signal BLTG1, while isolating sense amplifier 963 and equalize circuit 923 from bit line pair BL11 and /BL11 in response to deactivation of signal BLTG1.

In order to reduce a layout area for sense amplifiers, there has been generally well used a shared sense amplifier configuration in which two bit line pairs are disposed on both sides of a sense amplifier.

A sense amplifier is controlled by drive signals S0 and /S0. Since signals S0 and /S0 perform an independent operation in each block, they are differentiated from those for other blocks by attaching each block number thereto. Therefore, for example, a drive signal corresponding to block BLOCK0 is indicated with S0 and a drive signal corresponding to block BLOCK1 is indicated with S1.

Equalize circuits 922 and 923 each include: a transistor being connected to a complementary bit line pair in response to a signal BLEQ and two transistors, being conductive in response to signal BLEQ to couple two bit lines constituting a bit line pair to a potential VBL.

Connection circuits 964 and 965 connect corresponding bit lines to local IO lines LIO and /LIO in response to activation of respective column select lines CSL0 and CSL1.

Data read-out onto local IO lines LIO and /LIO are transmitted onto global IO lines GIO and /GIO through a connection circuit 968 becoming conductive in response to signal IOSW0 and given to an input/output circuit 14.

FIG. 22 is a circuit diagram showing a configuration of a sense amplifier control circuit 1005 generating internal signals mainly used in control of a sense amplifier band of a prior art SDRAM.

Referring to FIG. 22, a control circuit 1002 receives a command CMD and an address ADDRESS, and, in a case where activate command ACT and a precharge command PRE as commands are given externally, when address ADDRESS corresponding to memory block BLOCK0 is inputted, outputs signals ACT0 and PRE0 generated in response to the inputs.

Here, since memory block BLOCK0 is handled as a representative, there will be shown only a configuration associated with signal B0SEL selecting memory block BLCK0 below. For convenience in description, inputted commands are all directed to bank 0 as an object.

Sense amplifier control circuit 1005 includes: a gate circuit 1038 detecting that signal ACT0 is at H level and row addresses RA5 and RA6 are both at L level to activate an output thereof to L level; an inverter 1040 receiving an output of gate circuit 1038; and an SR latch circuit 1042, being set in response to an output of inverter 1040, and being reset in response to signal PRE0. Signal B0SEL indicating selection of memory block BLOCK0 is outputted from the Q output of SR latch circuit 1042.

Sense amplifier control circuit 1005 further includes: a gate circuit 1012 activating an output thereof to L level when signals B0SEL and ACT0 are both at H level and signal RA4 is at L level; an inverter 1014 receiving an output of gate circuit 1012 to invert; a delay circuit 1028 receiving signal PRE0 to delay; and an SR latch circuit 1016, being set in response to an output of delay circuit 1028, and being reset in response to an output of inverter 1014 to output signal BLTG1 from the Q output thereof.

Sense amplifier control circuit 1005 further includes: a NAND circuit 1018 receiving signals RA4, B0SEL and ACT0; an inverter 1020 receiving an output of NAND circuit 1018 to invert; an SR latch circuit 1022, being set in response to an output of delay circuit 1028, and being reset in response to an output of inverter 1020 to output signal BLTG0 from the Q output thereof; and an SR latch circuit 1024, being set in response to an output of delay circuit 1028, and being reset in response to signal ACT0 to output equalize signal BLEQ.

Sense amplifier control circuit 1005 further includes: a delay circuit 1026 receiving signal ACT0; a delay circuit 1030 receiving an output of delay circuit 1026; a NAND circuit 1032 receiving an output of delay circuit 1030 and signal B0SEL; an inverter 1034 receiving an output of NAND circuit 1032 to invert; an SR latch circuit 1036, being set in response to an output of inverter 1034, and being reset in response to an output of delay circuit 1028 to output signal S0 from the Q output thereof; and an SR latch circuit 1044, being set in response to an output of delay circuit 1026, and being reset in response to signal PRE0 to output a signal RAE from the Q output thereof.

Signal RAE is a signal for activating a row decoder 1046 decoding a row address. Row decoder 1046 activates any of word lines WL00 to WL7F in response to activation of signal RAE.

FIG. 23 is an operating waveform diagram for describing operation in a prior art sense amplifier band SABX.

Referring to FIGS. 21 and 23, in an initial state at a time t0, signals BLTG0 and BLTG1 are both at H level and isolation gates 960, 961, 966, and 967 connect senses amplifiers 962 and 963 to corresponding bit lines. At this time, since signal BLEQ is at H level, equalize circuits 922 and 923 are active and bit line pairs are coupled to potential VBL, which is one half of power supply potential VDD.

Drive signals S0, /S0, S1 and /S1 are set to potential VBL. Column select lines CSL0 and CSL1 are both at L level, connection circuits 964 and 965 are both in a non-conductive state to isolate the bit lines and local IO lines LIO from each other.

When, at a time t1, activate command ACT as command CMD is given, signals BLEQ and signal BLTG1 both change from H level to L level. Equalize circuits 922 and 923 are deactivated to cease equalize operations. Isolation gates 966 and 967 isolate bit line pairs BL10 and /BL10, and BL11 and /BL11 from corresponding sense amplifiers.

After a prescribed delay time corresponding to delay circuit 1026 of FIG. 22 elapses, word line WL00 corresponding to a designated row address is activated. Transistors included in memory cells Cell00 and Cell01 become conductive to read out potentials of each memory cell onto corresponding bit lines.

Then, after a delay time corresponding to delay circuit 1030 elapses, drive signals S0 and /SO assume H level and L level, respectively, to activate sense amplifiers. A sense amplifier is activated to amplify a potential difference on a bit line pair.

At a time t2, read command RD and address 00 are inputted externally. Then, column select line CSL0 corresponding to the address is activated to H level to cause connection circuit 964 to be conductive and data amplified by sense amplifier 962 is transmitted to a local IO line pair. In succession, signal IOSW0 is activated to H level to cause connection circuit 968 to be conductive and potentials on a local IO line pair are transmitted to an input/output circuit 14 through a global IO line pair.

When, at a time t3, precharge command PRE is given externally, word line WL00 is deactivated to L level immediately thereafter, and, after a delay time corresponding to delay circuit 1028 of FIG. 22 elapses, signal BLTG1 is set to H level, signal BLEQ is set to H level, signals S0 and /SO are set to an equalize state.

At a time t4, activate command ACT and address 30 are inputted externally. In response to the inputting, word line WL30 is activated to H level and data is read out from a memory cell in a similar manner to the operation at time t1 to perform a sense operation.

At a time t5, write command WRT and address 00 are inputted externally. In response to the inputting, signal IOSW1 and column select line CSL0 are set to H level to write data given from input/output circuit 14 to a memory cell through a global IO line and a local IO line.

At a time t6, precharge command PRE is again inputted externally. In response to the inputting, word line WL30 is deactivated to L level and signals BLTG and BLEQ are set to H level to set a bit line pair to potential VBL. Drive signals S1 and /S1 are both set to potential VBL to enter a standby state.

At a time t8, read command RD and address 01 are inputted externally. In response to the inputting, column select line CSL1 is activated to H level and signal IOSW0 is activated to H level to transfer a potential amplified by a sense amplifier in a similar manner to the case at time t2 to input/output circuit 14 through a local IO line and a global IO line.

In a case where reading or writing is performed on memory cells connected to different word lines in the same bank, a necessity arises for three commands ACT, RD and PRE or ACT, WRT and PRE in each cycle of reading or writing. In this case, since a requirement occurs for a time period three times that in a case where reading is repeated from continuous addresses, an effective data transfer rate is greatly reduced.

Measures to cope with this problem were proposed in the prior art as shown in patent application publications such as Japanese Patent Laying-Open No. 11-250653, No. 11-317072 and No. 2000-137982.

For example, if a latch circuit is provided at a position adjacent to a sense amplifier and data of the sense amplifier is transferred to the latch circuit to be held there, reading of data read out prior to initialization of the sense amplifier can also be performed at high speed from the latch circuit after the initialization of the sense amplifier. However, there remains a demerit of increase in chip area for placement of the latch circuit next to the sense amplifier.

A technique disclosed in Japanese Patent Laying-Open No. 11-250653 adopts a configuration in which plural sense amplifiers are provided to one set of bit line pairs. This technique also has a great demerit of increase in chip area in similar manner, leading to a low possibility of actual usage of products reflecting the techniques.

A technique disclosed in the publication of Japanese Patent Laying-Open No. 11-317072 proposes two architectures in a memory adopting the shared sense amplifier scheme. The first architecture is to activate plural word lines in respective plural blocks by which sense amplifiers are not shared on a basis of one word line per each block. The second architecture is that if a second word line of a second block commonly using the same sense amplifier together with a first block including a first word line selected already is selected successively to the first word line, activation of the second word line and equalization of the sense amplifier are performed in parallel to each other. The first architecture, however, is the same as division of a bank into small units. Any of the first and second architecture has an extremely great number of row addresses to be managed, so a problem occurs that an excessive load is imposed on the memory controller side.

A technique disclosed in the publication of Japanese Patent Laying-Open No. 2000-137982 is an application filed for an improvement memory called as FCRAM having a high speed cycle, wherein since initialization of a sense amplifier is performed during reading, an architecture is required for transferring data of a burst length in parallel to buffers, also resulting in a great demerit of increase in chip area.

SUMMARY OF THE INVENTION

It is an object of the present invention to provide a semiconductor memory device having an improved effective data transfer rate in a case where reading and writing are continuously performed on memory cells connected to different word lines in the same bank.

According to an aspect of the present invention, a semiconductor memory device includes: a first memory cell array; a second cell array; a sense amplifier band; and a control circuit.

The first memory cell array includes: a group of plural first memory cells arranged in a matrix; a first bit line pair; and a group of first word lines provided so as to intersect with the first bit line pair. The second memory cell array includes: a group of plural second memory cells arranged in a matrix; a second bit line pair; and a group of second word lines provided so as to intersect with the second bit line pair. The sense amplifier band includes a sense amplifier shared by the first and second bit line pairs. The control circuit controls initialization of the sense amplifier, initialization of the first and second bit line pairs and activation of the groups of first and second word lines. The control circuit, in response to a first command, not only outputs a timing signal changing from an inactive state of one word line of the groups of first and second word lines to an active state thereof, but also cancel initialization of the first and second bit line pairs and initialize the sense amplifier for a prescribed period.

According to another aspect of the present invention, a semiconductor memory device includes: a first memory block; a second block; a switch circuit; and a control circuit.

The first memory block includes: a first memory cell array including a group of plural first memory cells arranged in a matrix, a first bit line pair, and a group of first word lines provided so as to intersect with the first bit line pair; a second memory cell array including a group of plural second memory cells arranged in a matrix, a second bit line pair, and a group of second word lines provided so as to intersect with the second bit line pair; and a first sense amplifier band including a first sense amplifier shared by the first and second bit line pairs.

The second memory block includes: a third memory cell array including a group of plural third memory cells arranged in a matrix, a third bit line pair, and a group of third word lines provided so as to intersect with the third bit line pair; a fourth memory cell array including a group of plural fourth memory cells arranged in a matrix, a fourth bit line pair, and a group of fourth word lines provided so as to intersect with the fourth bit line pair; and a second sense amplifier band including a second sense amplifier shared by the third and fourth bit line pairs.

The switch circuit is provided between the first and second memory blocks and connects the second bit line pair to the third bit line pair. The control circuit controlling the first and second sense amplifiers and the switch circuit to cause data to transfer between the first and second sense amplifiers.

Accordingly, a main advantage of the present invention is that since data read out into a sense amplifier is held till a word line activation instruction is issued, the data held there can be read at high speed prior to activation of a word line.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 22 is a circuit diagram showing a configuration of a sense amplifier control circuit 1005 generating internal signals mainly used in control of a sense amplifier band of a prior art SDRAM; and FIG. 23 is an operating waveform diagram for describing operation in a prior art sense amplifier band SABX.

DESCRIPTION OF THE PREFERRED EMBODIMENTS

Detailed description will be given of embodiments of the present invention below with reference to the accompanying drawings. Note that the same symbols show the same or corresponding constituents through the drawings.

First Embodiment

Figure 1:
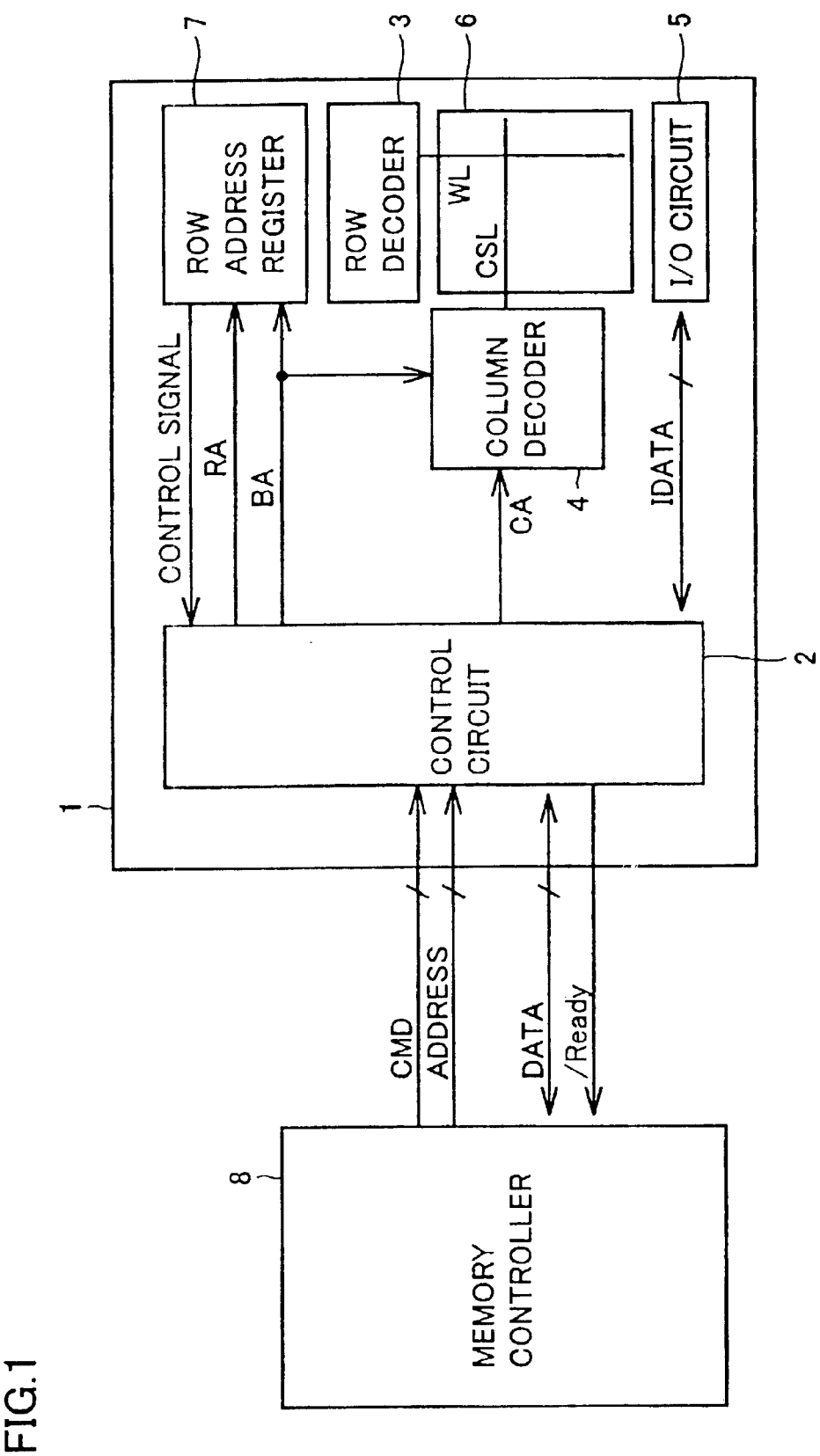
FIG. 1 is a block diagram showing a configuration of a semiconductor memory device of a first embodiment of the present invention.

FIG. 1 is a block diagram showing a configuration of a semiconductor memory device of a first embodiment of the present invention.

Referring to FIG. 1, semiconductor memory device 1 receives a command CMD, an address ADDRESS and data DATA from a memory control device 9. Semiconductor memory device 1 includes: a control circuit 2, a row decoder 3; a column decoder 4, a sense amplifier control circuit 5; an input/output circuit 6; and a memory cell array 7. When command control signal CMD and address signal ADDRESS are transmitted to semiconductor memory device from memory control device 9, semiconductor memory device 1, in response, performs supply/reception of data DATA with memory control device 9. A bank address, for convenience in description, is omitted and description is hereafter limited to a case where a command is given only to a bank 0, while actually memory cell array 7 is divided into plural banks and an address signal includes a bank address designating a bank.

Figure 2:
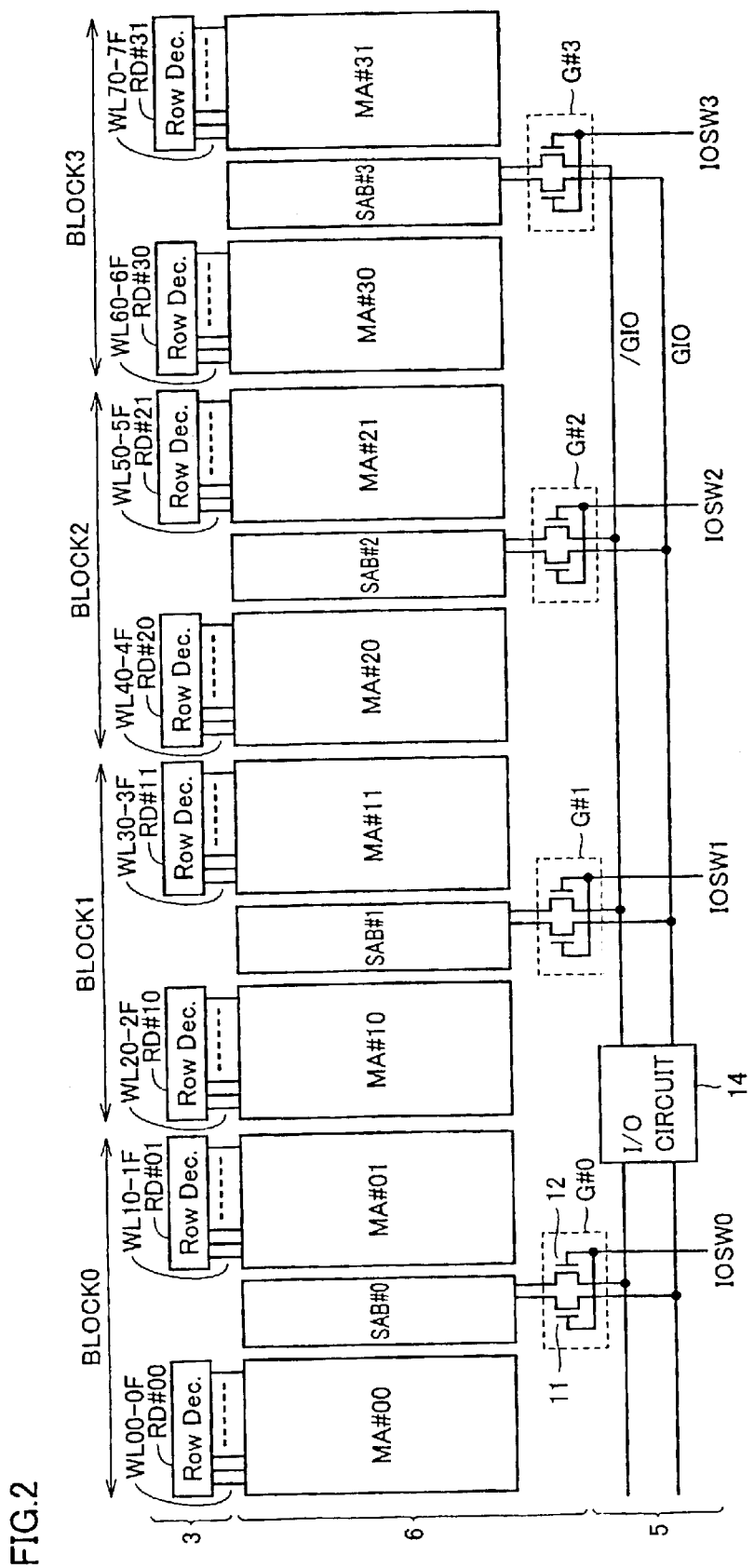
FIG. 2 is a diagram showing array placement of a memory cell array 7.

FIG. 2 is a diagram showing array placement of a memory cell array 7.

Referring to FIG. 2, there is shown an array configuration as a model for description. Description, in the present specification, is given only of a configuration of one bank 0, while usually SDRAM has plural banks each capable of being operated independently.

Memory cell array 7 includes memory blocks BLOCK0, BLOCK1, BLOCK2, . . . Memory block BLOCK0 includes: a sense amplifier band SAB#0; memory cell arrays MA#00 and MA#01, sharing sense amplifier band SAB#0, and disposed on both sides thereof.

Memory block BLOCK1 includes: a sense amplifier band SAB#1; memory cell arrays MA#10 and MA#11, sharing sense amplifier band SAB#1, and disposed on both sides thereof.

Memory block BLOCK2 includes: a sense amplifier band SAB#2; memory cell arrays MA#20 and MA#21, sharing sense amplifier band SAB#2, and disposed on both sides thereof.

Row decoder 3 includes: a row decoder RD#00 controlling word lines WL00 to WL0F provided correspondingly to memory cell array MA#00; a row decoder RD#01 controlling word lines WL10 to WL1F provided correspondingly to memory cell array MA#01; a row decoder RD#10 controlling word lines WL20 to WL2F provided correspondingly to memory cell array MA#10; a row decoder RD#11 controlling word lines WL30 to WL3F provided correspondingly to memory cell array MA#11; a row decoder #20 controlling word lines WL40 to WL4F provided correspondingly to memory cell array MA#20; and a row decoder RD#21 controlling word lines WL50 to WL5F provided correspondingly to memory cell array MA#21.

That is, memory cell arrays are disposed on both sides of a sense amplifier band so as to sandwich the sense amplifier band therebetween. Each memory cell array is provided with sixteen word lines which can be differentiated by row address signals RA0 to RA3. One memory block is divided into two regions disposed on left and right sides of a sense amplifier band residing at the center therebetween and designated by row address signal RA4. There are provided connection gate circuits G#0 to G#2 each connecting local IO lines LIO and global IO lines GIO to each other in each corresponding block.

Note that, though not shown in FIG. 2, there are available 16 column addresses designated by signals CA0 to CA3. Column select lines CSL0 to CSLF not shown in the figure intersect with word lines at a right angle and provided commonly to plural memory cell arrays shown in the figure.

Figure 3:
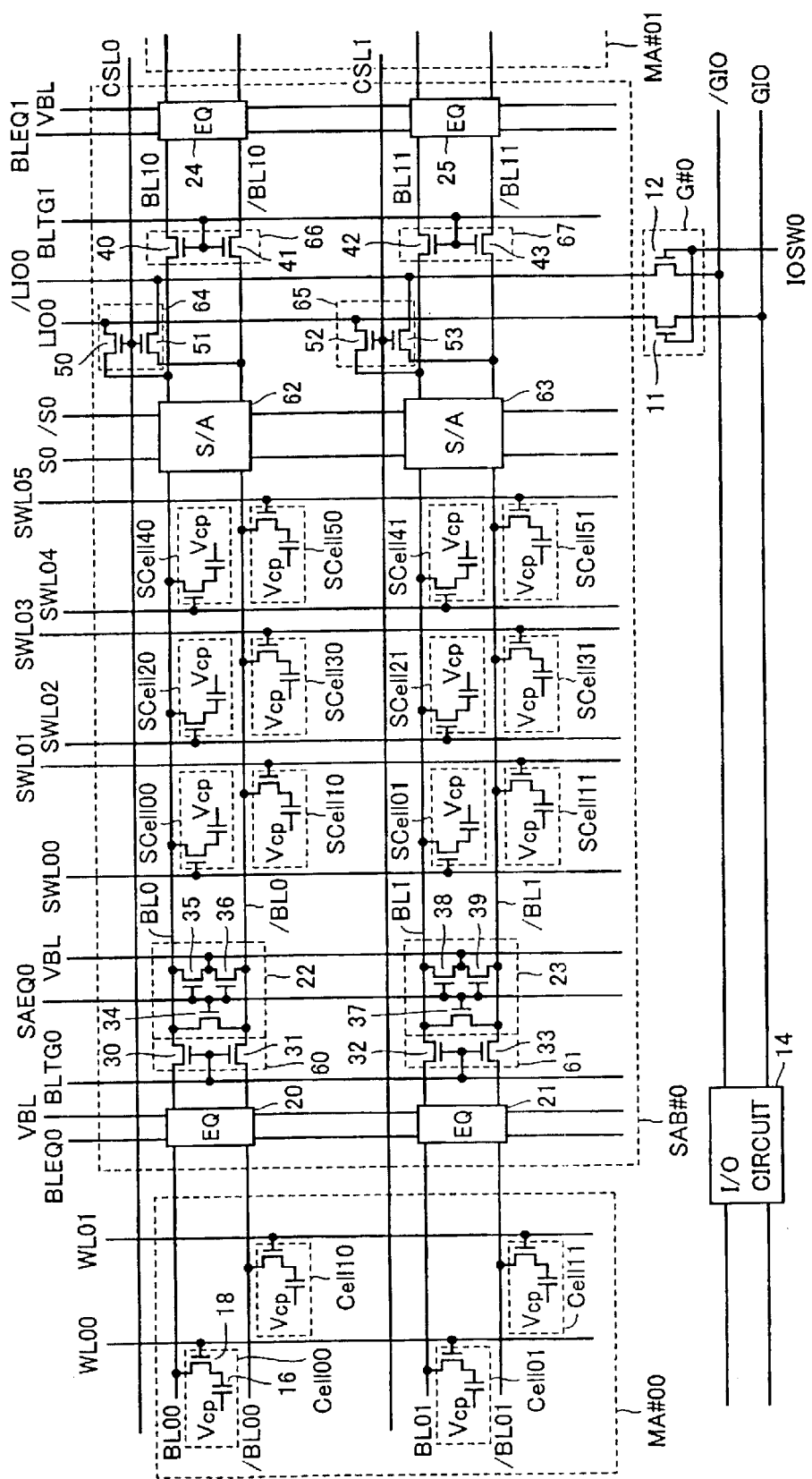
FIG. 3 is a circuit diagram showing a configuration in the neighborhood of a sense amplifier band of semiconductor memory device 1 of the first embodiment.

FIG. 3 is a circuit diagram showing a configuration in the neighborhood of a sense amplifier band of semiconductor memory device 1 of the first embodiment.

Referring to FIG. 3, memory cell arrays MA#00 and MA#11 obtained by division are disposed on both sides of sense amplifier band SAB#0.

Memory cell array MA#00 includes: a memory cell00 provided correspondingly to an intersection between word line WL0 and bit line BL00; a memory Cell 10 provided correspondingly to an intersection between word line WL1 and bit line /BL00; a memory Cell01 provided correspondingly to an intersection between word line WL0 and bit line BL01; and a memory Cell11 provided correspondingly to an intersection between word line WL1 and bit line /BL01.

Memory Cell00 includes: a capacitor 16 one end of which is coupled with a cell-plate potential Vcp; and a transistor 18, connected between the other end of capacitor 16 and a corresponding bit line, and the gate of which is connected to a corresponding word line. Configurations similar to memory cell Cell00 are used in memory cells Cell10, Cell01 and Cell11, so no description is repeated of each of configurations of the memory cells.

Memory cell array MA#11 has a configuration similar to that of memory cell array MA#00, so no description is repeated.

Sense amplifier band SAB#0 includes: sense amplifiers 62 and 63; and equalize circuits 20, 22 and 24; isolation gate circuits 60 and 66; and a connection circuit 64 provided correspondingly to sense amplifier 62.

Equalize circuit 22 equalizes a sense amplifier for initialization in response to activation of a signal SAEQ0. A potential VBL is given to equalize circuit 22 as an equalize potential.

Equalize circuit 22 includes: an N-channel MOS transistor 34, connected between bit line BL0 and bit line /BL0, and receiving signal SAEQ0 at the gate thereof; an N-channel MOS transistor 35, connected between a node provided with potential VBL and bit line BL0, and receiving signal SAEQ0 at the gate thereof; and an N-channel MOS transistor 36, connected between the node provided with potential VBL and bit line /BL0, and receiving signal SAEQ0 at the gate thereof.

Isolation gate circuit 60 includes: an N-channel MOS transistor 30, connected between bit line BL0 and bit line BL00, and receiving a signal BLTG0 at the gate thereof; and an N-channel MOS transistor 31, connected between bit line /BL0 and bit line /BL00, and receiving signal BLTG0 at the gate thereof. Isolation gate circuit 66 includes: an N-channel MOS transistor 40, connected between bit line BL0 and bit line BL10, and receiving a signal BLTG1 at the gate thereof; and an N-channel MOS transistor 41, connected between bit line /BL0 and bit line /BL10, and receiving signal BLTG1 at the gate thereof.

Connection circuit 64 includes: an N-channel MOS transistor 50, connected between local IO line LIO and bit line BL0, and the gate of which is connected to column select line CSL0; and an N-channel MOS transistor 51, connected between local IO line /LIO and bit line /BL0, and the gate of which is connected to column select line CSL0.

Equalize circuits 20 and 24 are different from equalize circuit 22 in that equalize circuits 20 and 24 receive signal BLEQ instead of signal SAEQ0, but have circuit configuration of the interior thereof similar to that of equalize circuit 22, so neither of descriptions thereof is not repeated. However, since bit line pair BL0 and /BL0 equalized by equalize circuit 22 are smaller in capacitance than bit lines BL00, /BL00, BL10 and /BL10 to which a memory cell array is connected, three transistors included in equalize circuit 22 is smaller in size than the transistors included in each of equalize circuits 20 and 24.

Sense amplifier band SAB#0 further includes: equalize circuits 21, 23, and 25 provided correspondingly to sense amplifier 63, isolation gate circuits 61 and 67; and a connection circuit 65.

Equalize circuit 23 includes: an N-channel MOS transistor 37, connected between bit line BL1 and a bit line /BL1, and receiving signal SAEQ0 at the gate thereof; an N-channel MOS transistor 38, connected between a node provided with potential VBL and bit line BL1, and receiving signal SAEQ0 at the gate thereof; and an N-channel MOS transistor 39, connected between the node provided with potential VBL and bit line /BL1, and receiving signal SAEQ0 at the gate thereof.

Isolation gate circuit 61 includes: an N-channel MOS transistor 32, connected between bit line BL1 and bit line BL01, and receiving a signal BLTG0 at the gate thereof; and an N-channel MOS transistor 33, connected between bit line /BL1 and bit line /BL01, and receiving signal BLTG0 at the gate thereof. Isolation gate circuit 67 includes: an N-channel MOS transistor 42, connected between bit line BL1 and bit line BL11, and receiving a signal BLTG1 at the gate thereof; and an N-channel MOS transistor 43, connected between bit line /BL1 and bit line /BL11, and receiving signal BLTG1 at the gate thereof.

Connection circuit 65 includes: an N-channel MOS transistor 52, connected between local IO line LIO and bit line BL1, and the gate of which is connected to column select line CSL1; and an N-channel MOS transistor 53, connected between local IO line /LIO and bit line /BL1, and the gate of which is connected to column select line CSL1.

Equalize circuits 21 and 25 are different from equalize circuit 23 in that equalize circuits 21 and 25 receive signal BLEQ instead of signal SAEQ0, but have circuit configuration of the interior thereof similar to that of equalize circuit 23, so neither of descriptions thereof is repeated. However, since bit line pair BL1 and /BL1 equalized by equalize circuit 23 are smaller in capacitance than bit lines BL01, /BL01, BL11 and /BL11 to which memory cell arrays are connected, three transistors included in equalize circuit 23 is smaller in size than the transistors included in each of equalize circuits 21 and 25.

Data read out onto local IO lines LIO and /LIO by a sense amplifier is further read out onto global IO lines GIO and /GIO through a gate circuit G#0 and transmitted to input/output circuit 14.

Gate circuit G#0 includes: an N-channel MOS transistor 10, connected between local IO line LIO and global IO line GIO, and receiving signal IOSW0 at the gate thereof; and an N-channel MOS transistor 11, connected between local IO line /LIO and global IO line /GIO, and receiving signal IOSW0 at the gate thereof.

Then, description will be given of assignment of addresses of semiconductor memory device 1.

Figure 4:
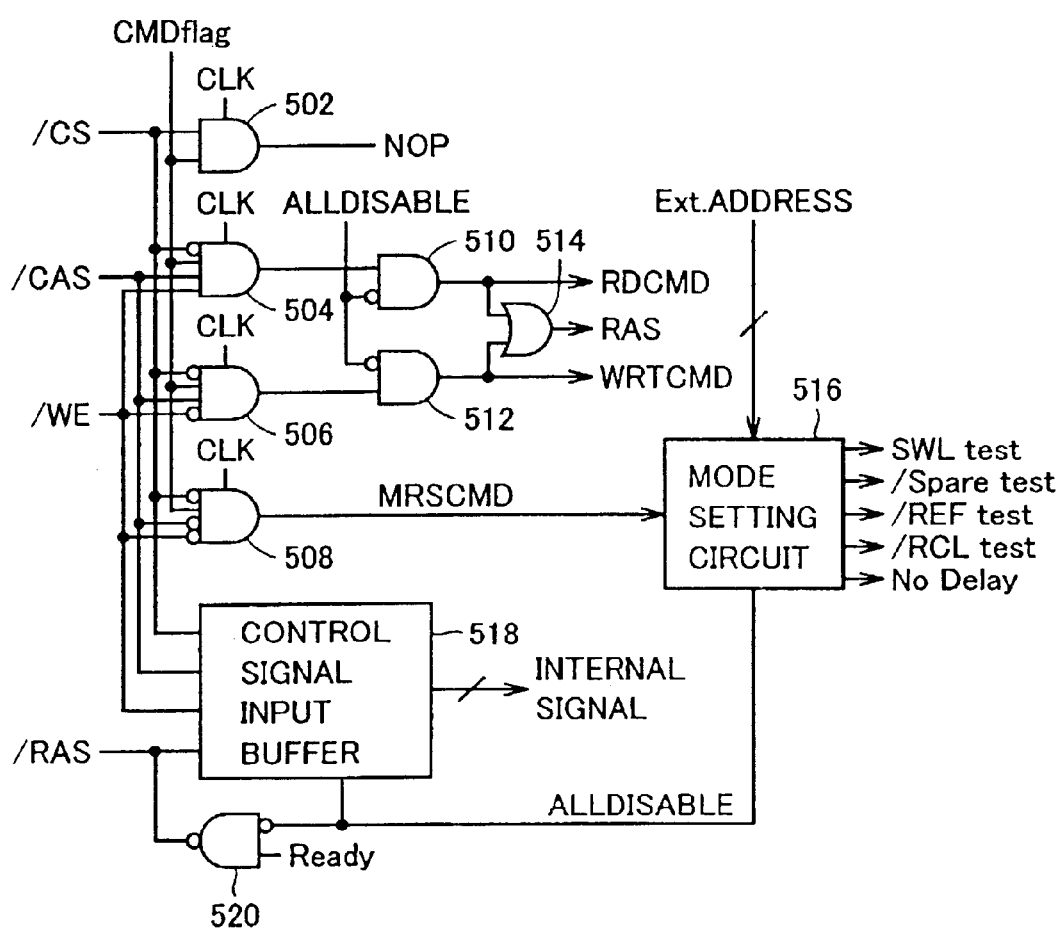
FIG. 4 is a table for describing assignment of row addresses.

FIG. 4 is a table for describing assignment of row addresses.

Referring to FIG. 4, address signals A0 to A6 given externally, when given simultaneously with a prescribed activate command ACT, are internally recognized as row address RA0 to RA6. A word line in a memory cell array is selected by row address signals RA0 to RA3. For example, if (RA3, RA2, RA1, RA0) is (0000), a word line WL(0) is designated; while if (RA3, RA2, RA1, RA0) is (0001), a word line WL(1) is designated; and while if (RA3, RA2, RA1, RA0) is (1111), a word line WL(F) is designated.

With row address signal RA4, one of left and right regions in a block is designated. If 0 is given as row address signal RA4, the left region is designated, while if 1 is given, the right region is designated.

Row address signal RA5 and RA6 are used for designation of a block. For example, if (RA6, RA5)=(00), block BLOCK0 is designated, while if (RA6, RA5)=(01), block BLOCK1 is designated.

Figure 5:
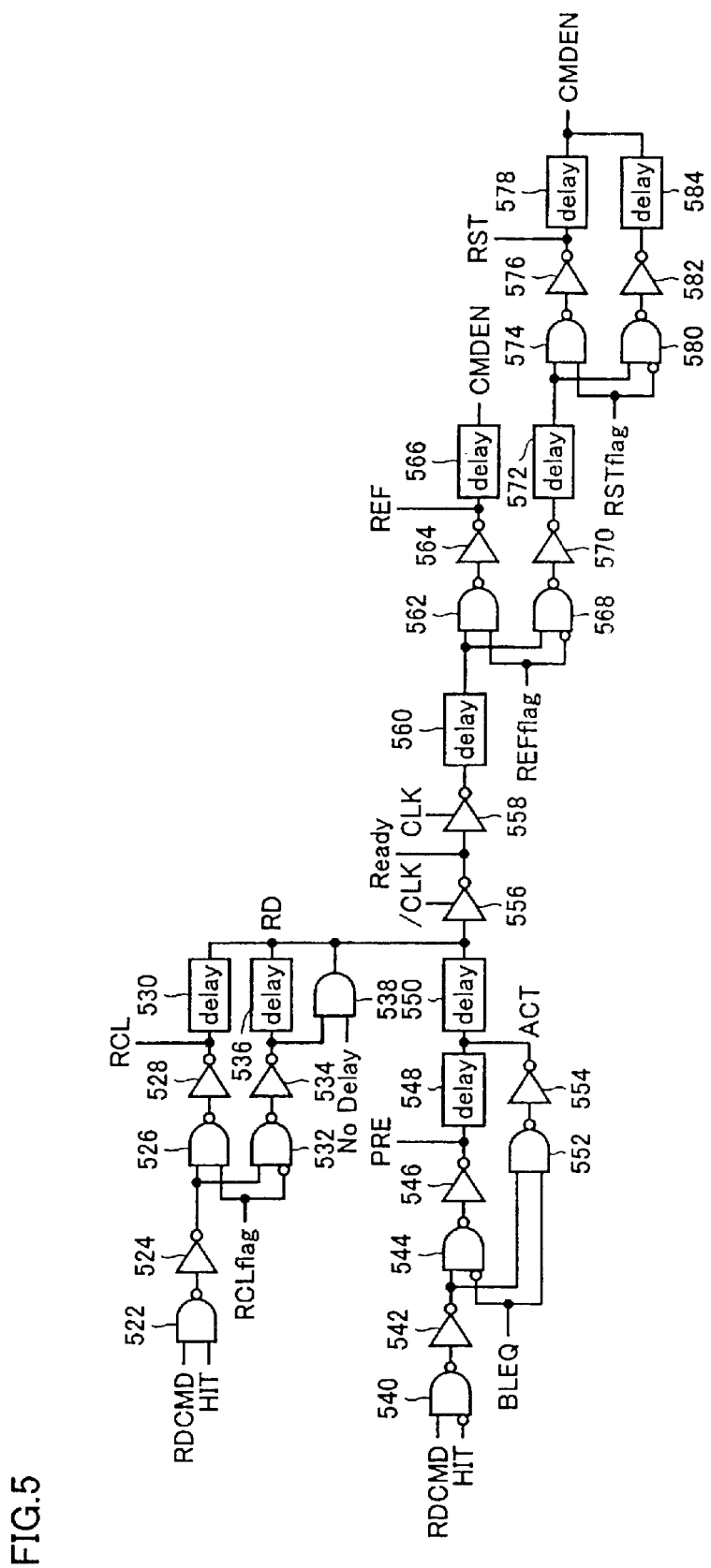
FIG. 5 is a table for describing assignment of column addresses.

FIG. 5 is a table for describing assignment of column addresses.

Referring to FIG. 5, when address signals A0 to A6 are given externally together with read command RD or write command WRT, address signals A0 to A6 are recognized as column address CA0 to CA6. Column address signals CA0 to CA3 are a signal for selecting a column select line. For example, if (0000) is given as (CA3, CA2, CA1, CA0), a column CSL(0) is selected, while (0001) is given, a column select line CSL(1) is selected and while (1111) is given, a column select line (F) is selected.

Column address signal CA4, in the present invention, is used in designation for direct reading a signal from a sense amplifier without driving a word line. If column address signal CA4 is 0, an ordinary operation is designated, while if column address CA4 is 1, direct reading from a sense amplifier is designated.

Column address signals CA5 and CA6 are signals for designating a block in which a sense amplifier used for reading therefrom resides. When signal CA4 is set to 1, data is read out from a sense amplifier of block BLOCK0 if (CA6, CA5)=(00). If (CA6, CA5)=(01), data is read out directly from a sense amplifier of block 1.

Figure 6:
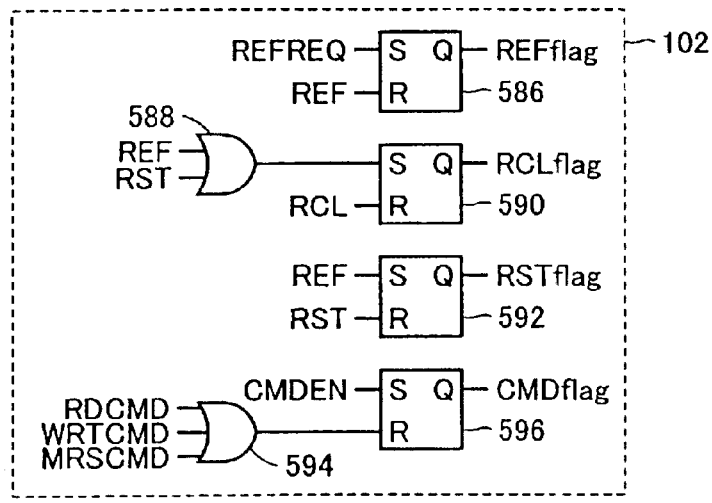
FIG. 6 is a circuit diagram showing a configuration of a sense amplifier control circuit 5 in FIG. 1.

FIG. 6 is a circuit diagram showing a configuration of a sense amplifier control circuit 5 in FIG. 1.

Referring to FIG. 6, there is shown a configuration necessary for control of selection of block BLOCK0.

Sense amplifier control circuit 5 includes a signal generating circuit 147 receiving an internal address signal IADDRESS and signal RD0 from control circuit 2 to output signal B0SEL selecting a block BLOCK0.

Signal generating circuit 147 includes: an OR circuit 154 receiving row address signals RA5 and RA6; a gate circuit 148 receiving signals CA4 and RD0 and an output of OR circuit 154; an inverter 150 receiving an output of gate circuit 148 to invert; and an SR latch circuit 152 receiving an output of inverter 150 at the set input thereof, and receiving clock signal CLK at the reset input thereof. Gate circuit 148 is a circuit activating an output thereof to L level when signals CA4 and RD0 are at H level and an output of OR circuit 154 is at L level.

Signal generating circuit 147 further includes: a gate circuit 156 receiving an output of delay circuit 102 and an output of OR circuit 154; an inverter 158 receiving an output of gate circuit 156 to invert; an SR latch circuit 160 receiving an output of inverter 158 at the set input thereof, and receiving clock signal CLK at the reset input thereof; and an OR circuit 162 receiving outputs of SR latch circuits 152 and 160 to output signal B0SEL. Gate circuit 156 is a circuit activating an output thereof to L level when an output of delay circuit 102 is at H level and an output of OR circuit 154 is at L level.

Sense amplifier control circuit 5 further includes: delay circuits 102, 104 and 106 connected in series, and receiving signal ACT0 given from control circuit 2.

Sense amplifier control circuit 5 further includes: an SR latch circuit 112, receiving signal ACT0 at the set input thereof, and receiving an output of delay circuit 104 at the reset input thereof; an NAND circuit 108 receiving an output of delay circuit 106 and signal B0SEL; an inverter 110 receiving an output of NAND circuit 108 to invert; an NAND circuit 114 receiving signal B0SEL and an output of SR latch circuit 112; and an inverter 116 receiving an output of NAND circuit 114 to invert.

Sense amplifier control circuit 5 further includes: a delay circuit 124 delaying a signal PRE0 outputted from control circuit 2; a delay circuit 126 delaying a signal PALL outputted from control circuit 2; an OR circuit 128 receiving an output of delay circuit 124 and an output of delay circuit 126; a delay circuit 144 receiving an output of delay circuit 126 to further delay the output; and an SR latch circuit 146, being set in response to an output of delay circuit 126, and being reset in response to an output of delay circuit 144.

Sense amplifier control circuit 5 further includes: an OR circuit 118 receiving an output of inverter 116 and an output of SR latch circuit 146 to output signal SAEQ0; an SR latch circuit 120, being set in response to an output of inverter 110, and being reset in response to an output of OR circuit 118; and a drive circuit 122 driving sense amplifier drive signals S0 and /S0 in response to an output of SR latch circuit 120.

Sense amplifier control circuit 5 further includes: a gate circuit 130 receiving an output of delay circuit 104, signals B0SEL and RA4; an inverter 132 receiving an output of gate circuit 130 to invert; and an SR latch circuit 136, being set in response to an output of inverter 132, and being reset in response to an output of OR circuit 128. Gate circuit 130 is a circuit assuming an output is at L level when an output of delay circuit 104 and signal B0SEL are at H level and signal RA4 is at L level.

Sense amplifier control circuit 5 further includes: an NAND circuit 138 receiving an output of delay circuit 104 and signals B0SEL and RA4; an inverter 140 receiving an output of NAND circuit 138 to invert; an SR latch circuit 142, being set in response to an output of inverter 140, and being reset in response to an output of OR circuit 128 to output signal BLTG1; and an SR latch circuit 134, being set in response to an output of OR circuit 128, and being reset in response to signal ACT0 to output signal BLEQ.

Sense amplifier control circuit 5 further includes: an OR circuit 164 receiving signal PRE0 and PALL; an SR latch circuit 166, being set in response to an output of delay circuit 102, and being reset in response to an output of OR circuit 164 to output a signal RAE; and a signal generating circuit 168 outputting a signal IOSW0 in response to internal address signal IADDRESS and signals WRT0 and RD0.

Signal RAE activates row decoder 3. Row decoder 3, when being activated, activates one of word lines WL00 to WL7F in response to row address RA.

Figure 7:
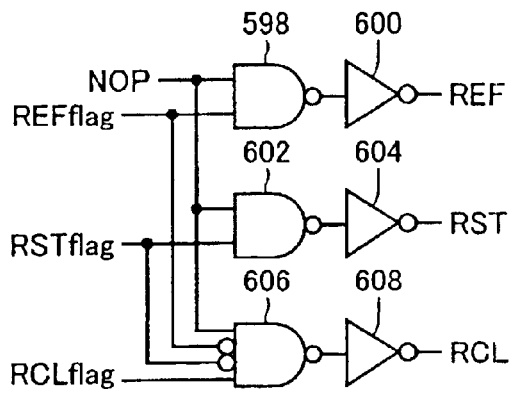
FIG. 7 is an operating waveform diagram for describing operation in semiconductor memory device of the first embodiment.

FIG. 7 is an operating waveform diagram for describing operation in semiconductor memory device of the first embodiment.

Note that, for simplification in description, operation is performed on one bank address. In addition, a burst length is set one clock.

Referring to FIGS. 3 and 7, in an initial state at a time t0, signals BLTG0 and BLTG1 are both at L level. Therefore, transistors 30 to 33 and 40 to 43 are all in a non-conductive state.

Since signal BLEQ is at H level, equalize circuits 20, 21, 24 and 25 are active, a bit line pair is initialized to a potential VBL, which is one half of a power supply VDD. Sense amplifier drive signals S0 and /S0 are both set at potential VBL and sense amplifiers 62 and 63 each are in an inactive state. Signal SAEQ0 is at L level and equalize circuits 22 and 23 each are deactivated. Column select lines CSL0 and CSL1 are at L level and transistors 50 to 53 are in a non-conductive state.

At a time t1, activate command ACT is inputted as command signal CMD and 00 is inputted as address signal ADDRESS. Then, signal BLEQ changes from H level to L level. Equalize circuits 20, 21, 24 and 25 are thereby deactivated. Signal SAEQ0 changes to H level and signals S0 and /S0 are both set to potential VBL. Word line WL00 corresponding to a row address designated by row decoder 3 activated after a period corresponding to delay circuit 102 of FIG. 6 elapses changes from L level to H level.

If word line WL00 is activated, transistors included in memory cells Cell00 and Cell01 become conductive to thereby cause electric charges accumulated in capacitors 16 to be transmitted onto bit lines BL00 and BL01.

Moreover, signal BLTG0 changes to H level after a prescribed time corresponding to delay circuit 104 elapses and signal SAEQ0 changes to L level.

That is, equalize circuits 22 and 23 operate for a prescribed period during a period when signal SAEQ0 is pulse-like at H level to perform initialization of sense amplifiers. When signal BLTG0 changes from L level to H level, data on bit line pairs are transmitted into sense amplifiers 62 and 63 through transistors 30 to 33. Thereafter, signals S0 and /S0 are activated to H level and L level, respectively, to cause sense amplifiers 62 and 63 to amplify potentials on the bit line pairs.

At a time t2, read command RD and address 00 are inputted externally. Then, column select line CSL0 is pulse-like activated to cause transistors 50 and 51 to be conductive. Potentials of sense amplifier 62, in response, are transmitted to a local IO line pair. Then, signal IOSW0 assumes H level to cause transistors 10 and 11 to be conductive and to thereby transmit potentials on local IO lines LIO and /LIO to input/output circuit 14 through global IO lines GIO and /GIO.

At a time t3, precharge command PRE is inputted externally. Then, a word line is deactivated to L level in response to deactivation of signal RAE of FIG. 6. Signal BLEQ changes to H level after a delay time corresponding to delay circuit 124 elapses and signal BLTG0 changes to L level. Then, potentials on a bit line pair change back to potential VBL, but, since transistors 30 to 33 each are in a non-conductive state, sense amplifiers 62 and 63 can maintain states thereof where data read out from memory cells are held as if signals S0 and /S0 are held at H level and L level, respectively.

Then, at time t4, activate command ACT and address 30 are inputted externally. Word line WL30, in response, is activated from L level to H level, data of a corresponding memory cell is read out onto a bit line and sense amplifier of block BLOCK1 is initialized for a prescribed period by signal SAEQ1 to thereafter perform a sense operation.

At a time t5, write command WRT, address 00 and write data are inputted externally. Signal IOSW1, in response, is activated to H level to cause column select line CSL0 to be activated to H level. Then, data from input/output circuit 14 is written to a corresponding memory cell through global IO line GIO, local IO line LIO and bit line BL.

At a time t6, read command RD and address 11 are inputted externally. Upper bit A4 of the address is used in designation for directly reading data held in a sense amplifier. That is, designation is effected on reading from a sense amplifier corresponding to column address CA=1 in block BLOCK0. Therefore, column select line CSL1 is activated to H level, signal IOSW0 is activated to H level and data held in sense amplifier 63, in response, is transmitted to input/output circuit 14 through local IO line LIO and global IO line GIO.

At a time t7, write command WRT, address 01 and write data are inputted externally. Signal IOSW1, in response, is activated to H level to cause column select line CSL1 to be activated to H level. Then, data from input/output circuit 14 is written to a corresponding memory cell through global IO line GIO, local IO line LIO and bit line BL.

As can be seen from comparison in the operating waveform diagram, in a prior art operation, which is described in FIG. 23, in a case where access is made to memory cells connected to plural word lines, precharge command PRE and activate command ACT are required prior to each read command RD or each write command WRT. In the operation of the semiconductor memory device of the first embodiment shown in FIG. 7, however, no activate command ACT is required in a second time or times subsequent thereto associated with a read operation and data held in sense amplifiers have only to be read out.

Note that since a latency in a read operation has a large influence, an increase in a burst length causes the effect of direct reading from sense amplifiers to be further enhanced, while a burst length is set to one clock in the present embodiment.

While access to another block is of a write operation, an operation can also be ensured in a similar manner thereto in a case of a read operation, that is, when a read operation is performed at time t5.

In the semiconductor memory device of the first embodiment, as described above, even in a case where many accesses are made to almost the same bank, data of memory cells connected to an once-activated word line can be read out by one instruction if reading from a word line is first performed with a single activate command to hold read-out data in sense amplifiers. Therefore, an effective transfer rate can be held high.

Moreover, since the present invention has a light penalty in terms of area required, a standard memory and a memory according to the present invention can be selectively formed using the common chip layout with sufficient certainty. It is easy not only to invalidate an extended address CA4 inputted together with read command RD but also to change a timing for equalizing a sense amplifier so as to start when a precharge command is inputted in a similar manner to a prior art memory.

As methods in which a standard memory and a memory according to the present invention are formed selectively in layout, the following are considered: a method using a program written for options of metal interconnects or laser trimming in a wafer process; and fixing of potentials on internal pads or fixing of potentials on specific terminals is performed in an assembly process.

Furthermore, a configuration can also be adopted in which whether a memory device is operated as a standard memory or a memory according to the present invention is selected by a register set command after power on.

In the semiconductor memory device of the first embodiment, as described above, a bit line pair is initialized after a word line is caused to be non-selected, but sense amplifiers are not yet initialized at the timing thereof. The initialization of sense amplifiers is effected when one of word lines in a memory block corresponding to the sense amplifiers is activated in the next time. In such an architecture, sense amplifiers of each memory block hold data of memory cells connected to a word line activated in the previous time. Therefore, reading the held data can be performed directly from the sense amplifiers without activating a word line. Since a row-related operation is not necessary, the reading is performed at high speed.

Even in a prior art DRAM, it is possible to leave sense amplifiers holding data in a standby state while keeping a word line active for a long time in the expectation of a page operation, but, in the case, since selection of a different word line requires inputting of activate command ACT subsequent to inputting of precharge command PRE, reading is delayed by a time for precharge.

In the first embodiment, since a word line is deactivated in the same timing as a standard memory and a bit line pair having a large capacitance and requiring a time for equalization has been equalized, any of memory blocks may have a timing at which activate command ACT is inputted, similar to a standard memory. The first embodiment is different from a prior art DRAM in that, in the first embodiment, an equalize circuit dedicated to each sense amplifier is necessary and equalization of a sense amplifier is started after activation of a word line, but since a capacitance of a sense amplifier is small, a penalty in terms of time is light. Furthermore, an area for an equalize circuit is considered not to result in a great loss.

Second Embodiment

In the first embodiment, it is necessary for the memory control device to manage row addresses corresponding to data held in sense amplifiers of the semiconductor memory device. For this reason, required functions of the memory control device are extremely complex, leading to a problem to impose an excessively heavy load on the memory control device. The second embodiment is to cope with this problem.

Figure 8:
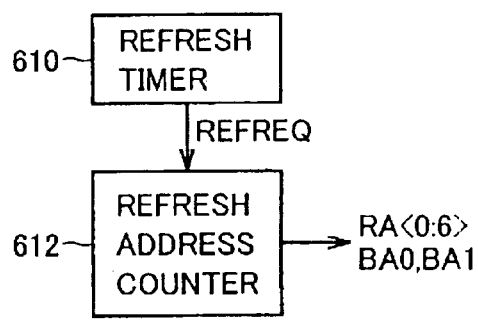
FIG. 8 is a block diagram showing a configuration of a semiconductor memory device 1A of a second embodiment.

FIG. 8 is a block diagram showing a configuration of a semiconductor memory device 1A of a second embodiment.

Referring to FIG. 8, semiconductor memory device 1A of the second embodiment has a configuration in which the control circuit 2 and sense amplifier control circuit 5 in semiconductor memory device 1 shown in FIG. 1 are replaced with a control circuit 2A and a sense amplifier control circuit 5A, respectively. Semiconductor memory device 1A further includes a row address comparing section 8A, which is another difference of semiconductor memory device 1A from semiconductor memory device 1. The other parts of the configuration are similar to corresponding parts of the configuration of the first embodiment; therefore, none of descriptions thereof is repeated.

Semiconductor memory device 1A of the second embodiment holds a row address corresponding to a word line being currently active and a row address corresponding to a memory cell whose data is held by a sense amplifier in the interior thereof. Semiconductor memory device 1A has a function to compare a row address designated externally with a row address held therein to notify a result of the comparison to outside. With such a function thereof, no necessity arises for managing an address for activation/deactivation of a word line of a memory, thereby enabling realization of an optimal control.

Description will be given on these aspects of semiconductor memory device 1A shown in the second embodiment in which a control method thereof is different from a general SDRAM.

First of all, no precharge command exists except for precharge all command PALL. Inputting of command SEN is infallibly required 2 clocks before read command RD. Activate command ACT is infallibly required 2 clocks before write command WRT.

Inputting of command ACT and command SEN are because of a necessity for making distinct a row address corresponding to read command RD/write command WRT from the others of plural active rows present at the same bank.

Activate command ACT is a command to infallibly activate a word line and used in a write operation. A once activated word line maintains its active state till another word line is activated in the next time within the same memory block in the expectation of consecutive write operations (burst writing).

Command SEN, though similar to activate command ACT in a way of usage, does not activate a word line in case where data of a memory cell corresponding to a row address is already held in a sense amplifier. Command SEN is used in a read operation. A word line activated by command SEN is automatically deactivated after completion of a sense operation and a bit line pair is caused to be in an equalize state. After data reading ends, a word line is in an inactive state, so that no access to a memory is enabled.

When precharge all command PALL is inputted, all sense amplifiers are restored to initial states thereof.

Row address comparing section 8A of FIG. 8 holds a row address of an activated memory cell and a row address corresponding to data held in a sense amplifier in the interior thereof. When a row address is inputted externally, row address comparing section 8A compares address information held therein with the inputted address information. In a case where another row address in a memory block corresponding to the inputted row address is currently active, a signal IntBUSY is fed back to control circuit 2A. On the other hand, row address comparing section 8A feeds back a signal Ready to control circuit 2A when an inputted row address corresponds to a memory cell whose data is held in a sense amplifier. Control circuit 2A, when given busy signal IntBUSY from row address comparing section 8A, outputs a signal BUSY to outside and demands memory control device 9 for a second input of the command.

Figure 9:
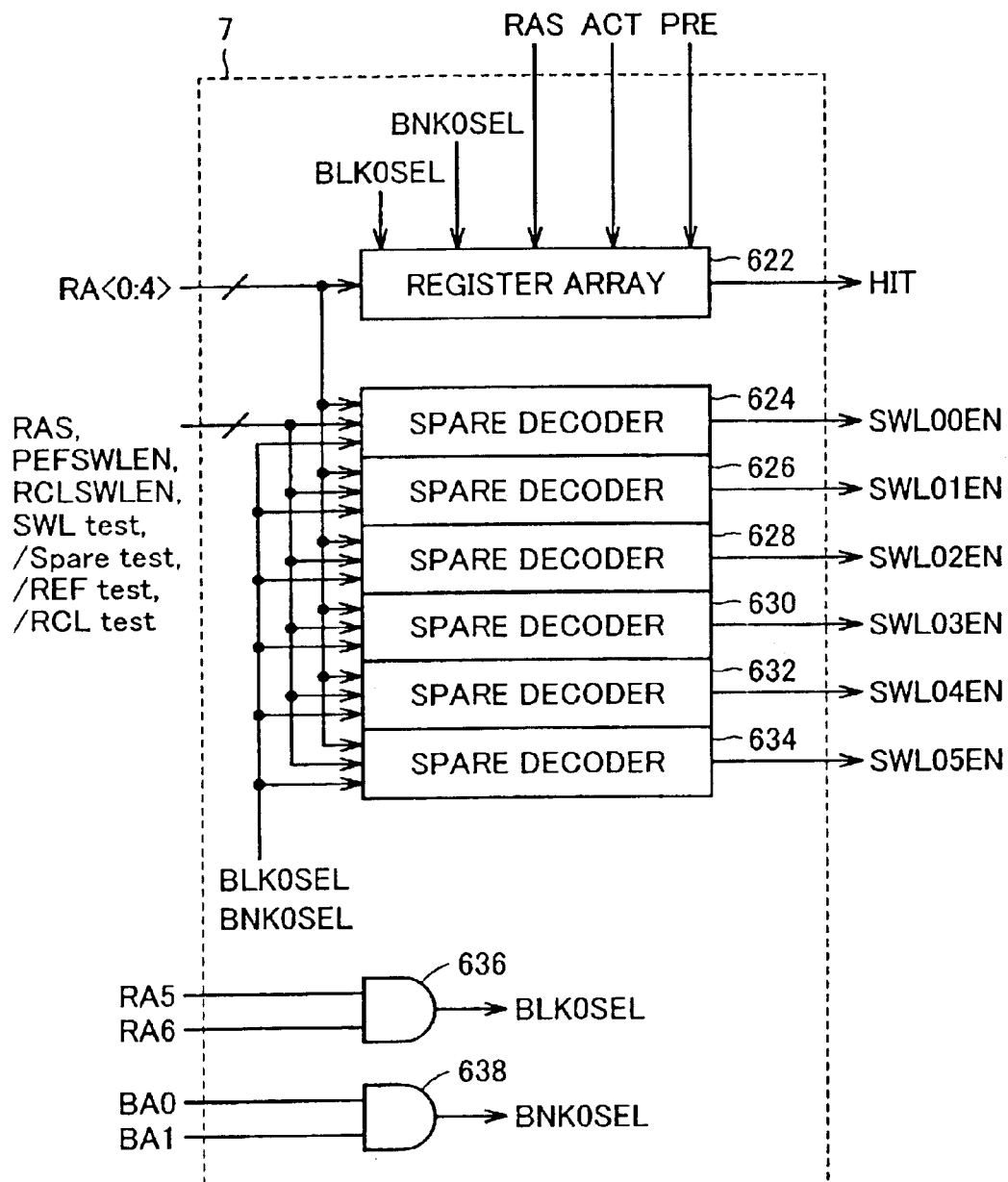
FIG. 9 is a circuit diagram showing a configuration of a row address comparing section 8A in FIG. 8.

FIG. 9 is a circuit diagram showing a configuration of a row address comparing section 8A in FIG. 8.

Referring to FIG. 9, row address comparing section 8A includes: an address comparing section 202 comparing an inputted row address with a row address held in the interior thereof; an internal command signal generating section 204 outputting internal command signals ACT0, PRE0 and others in response to signals SENREQ and ACTREQ; and a control signal outputting section 206 outputting control signals in response to outputs of address comparing section 202 and internal command signal generating section 204.

Address comparing section 202 includes: register arrays 210 to 213 corresponding to respective memory blocks BLOCK0 to BLOCK3. Internal command signal generating section 204 includes: an NAND circuit 222 receiving signals SEN0REQ and HIT; an inverter 224 receiving an output of NAND circuit 222 to invert; a 3-input NAND circuit 226 receiving signals ACT0REQ, HIT and WLON; an inverter 228 inverting an output of NAND circuit 226; an OR circuit 230 receiving an output of inverter 224 and an output of inverter 228; and an SR flip-flop circuit 232, being set in response to an output of OR circuit 230, and being reset in response to clock signal CLK to output signal Ready.

Internal command signal generating section 204 further includes: a gate circuit 234 receiving signals SEN0REQ, WLON and HIT; an inverter 236 receiving an output of gate circuit 234 to invert; a gate circuit 238 receiving signals ACT0REQ and WLON; an inverter 240 receiving an output of gate circuit 238 to invert; an OR circuit 242 receiving an output of inverter 236 and an output of inverter 240; and an SR flip-flop circuit 244, being set in response to an output of OR circuit 242, and being reset in response to clock signal CLK to output signal ACT0.

Gate circuit 234 detects that signal SEN0REQ is at H level, signal WLON is at L level and signal HIT is at L level to activate an output thereof to L level. Gate circuit 238 detects that signal ACT0REQ is at H level and signal WLON is at L level to activate an output thereof to L level.

Internal command signal generating section 204 includes: a clocked inverter 246, being activated in response to clock signal /CLK, and receiving an output of inverter 236 to invert; a clocked inverter 248, being activated in response to clock signal CLK, and receiving an output of clocked inverter 246 to invert; a clocked inverter 250, being activated in response to clock signal /CLK, and receiving an output of clocked inverter 248 to invert; and a clocked inverter 252, being activated in response to clock signal CLK, and receiving an output of clocked inverter 250 to invert.

Internal command signal generating section 204 further includes; a gate circuit 254 receiving signals SEN0REQ, WLON and HIT; an inverter 256 receiving an output of gate circuit 254 to invert; a gate circuit 258 receiving signals ACT0REQ, HIT and WLON; an inverter 260 receiving an output of gate circuit 258 to invert; and an OR circuit 262 receiving an output of inverter 256 and an output of inverter 260.

Gate circuit 254 detects that signal SEN0REQ and signal WLON are both at H level and signal HIT is at L level to activate an output thereof to L level. Gate circuit 258 detects that signal ACT0REQ and signal WLON are both at H level and signal HIT is at L level to activate an output thereof to L level.

Internal command signal generating section 204 further includes: a gate circuit 264 receiving a signal INBURST and an output of OR circuit 262; an inverter 266 receiving an output of gate circuit 264 to invert; and an SR flip-flop circuit 268, being set in response to an output of inverter 266, and being reset in response to clock signal CLK. A gate circuit 264 detects that signal INBURST is at L level and an output of OR circuit 262 is at H level to activate an output thereof to L level.

Internal command signal section 204 further includes: an NAND circuit 270 receiving an output of OR circuit 262 and signal INBURST; an inverter 272 receiving an output of NAND circuit 270 to invert; an SR flip-flop circuit 274, being set in response to an output of inverter circuit 272, and being reset in response to clock signal CLK to output signal NOP0; and an OR circuit 276 receiving an output of clocked inverter 252 and an output of SR flip-flop circuit 268 to output signal PRE0.

Control signal outputting section 206 includes: a 4-input OR circuit 282 receiving signal HIT0 to HIT3 to output signal HIT; a 4-input OR circuit 284 receiving signals INBURST0 to INBURST3 to output signal INBURST; a 4-input OR circuit 286 receiving signals WLON0 to WLON3 to output signal WLON; and a 3-input OR circuit 288 receiving signals ACT0, PRE0 and NOP0 to output signal IntBUSY.

Figure 10:
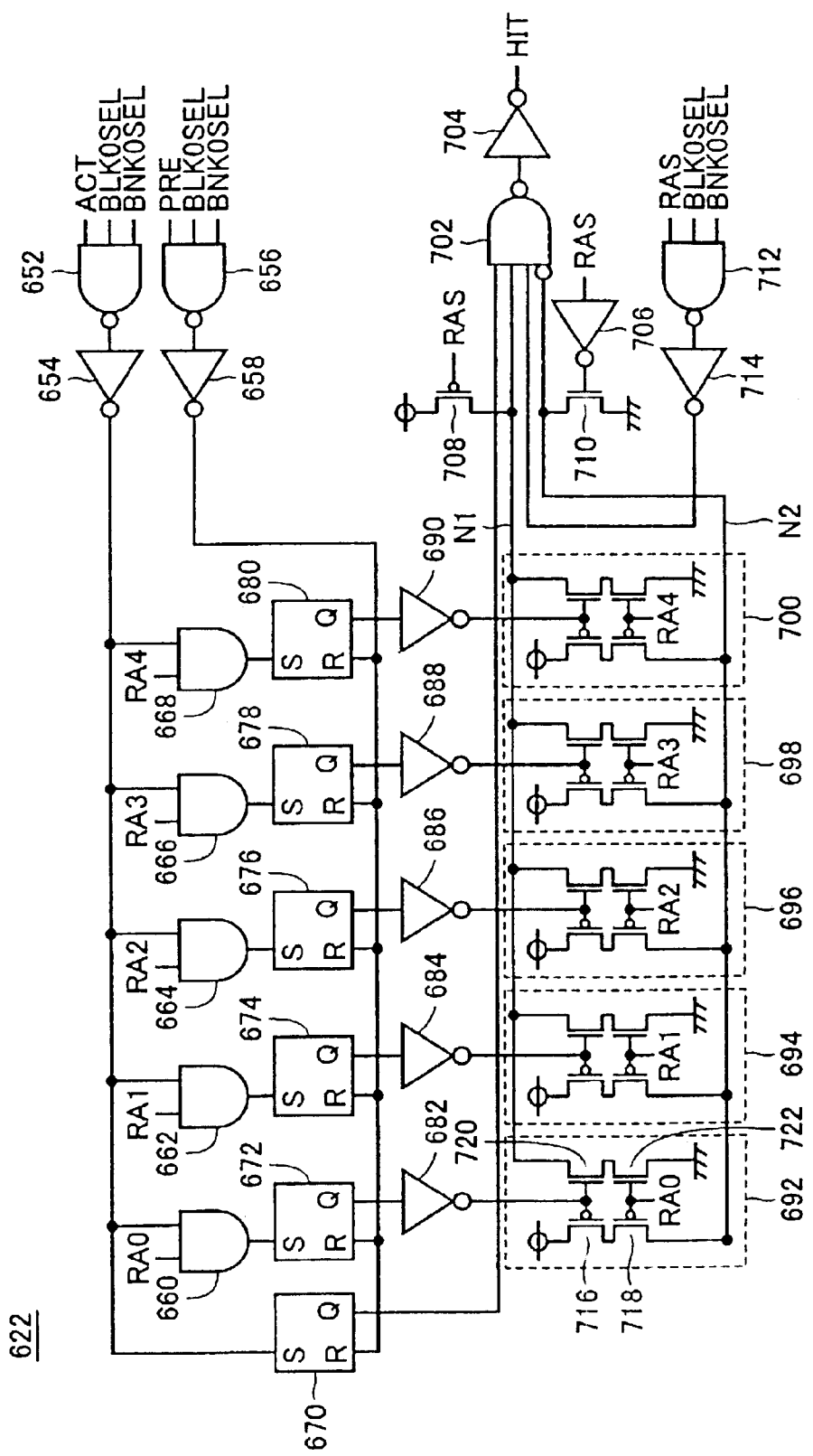
FIG. 10 is a circuit diagram showing a configuration of a register array 210 in FIG. 9.

FIG. 10 is a circuit diagram showing a configuration of a register array 210 in FIG. 9.

Referring to FIG. 10, register array 210 includes: a NAND circuit 302 receiving signals ACT0 and B0SEL; an inverter 304 receiving an output of NAND circuit 302 to invert; an SR flip-flop circuit 306, being set in response to an output of inverter 304, and being reset in response to signal BLEQ0; a NAND circuit 308 receiving an output of SR flip-flop circuit 306 and signal B0SEL; and an inverter 309 receiving an output of NAND circuit 308 to invert the output and to output signal WLON0.

Register array 210 further includes: AND circuits 310 to 314, receiving an output of inverter 304 at one inputs thereof, and receiving row address signals RA0 to RA4 at the respective other inputs thereof; and flip-flop circuits 320 to 324 being set in response to outputs of respective AND circuits 310 to 314. SR flip-flop circuits 320 to 324 are all reset in response to a signal SAEQ0.

Register array 210 further includes: a resistor 344 connected between a power supply node and a node N11; a resistor 346 connected between a ground node and a node N00; an inverter 342 receiving signal B0SEL to convert; and an address bit comparing sections 330 to 334, connected in parallel between node N11 and node N00, and comparing row address signals RA0 to RA4 with respective inputted values in the previous time.

Address bit comparing section 330 includes: P-channel MOS transistors 352, 354 and 356 connected in series between power supply node and node N00; and N-channel MOS transistors 358, 360 and 362 connected in series between node N11 and ground node.

An output of SR flip-flop circuit 320 is given to the gate of P-channel MOS transistor 352, inputted row address RA0 is given to the gate of P-channel MOS transistor 354 and an output of inverter 342 is given to the gate of P-channel MOS transistor 356. Signal B0SEL is given to the gate of N-channel MOS transistor 358, an output of SR flip-flop circuit 320 is given to the gate of N-channel MOS transistor 360 and inputted row address signal RA0 is given to the gate of N-channel MOS transistor 362.

Though address bit comparing sections 331 to 334 are different from address bit comparing section 330 in that, to address bit comparing sections 331 to 334, row address signals RA1 to RA4 are given instead of inputted row address signals RA0 and outputs of SR flip-flop circuits 321 to 324 are given instead of an output of SR flip-flop circuit 320, a configuration of each of address bit comparing sections 331 to 334 is similar to that of address bit comparing section 330, so none of descriptions thereof is repeated.

Register array 210 includes a gate circuit 348 detecting that node N11 is at H level and node N00 is at L level to activate an output thereof to L level; and an inverter 350 inverting an output of gate circuit 348 to output signal HIT0.

Register array 210 further includes: an OR circuit 364 receiving signal RD0 and signal WRT0; NAND circuit 366 receiving an output of OR circuit 364 and signal B0SEL; an inverter 368 receiving an output of NAND circuit 366 to invert; clocked inverters 370 to 380, connected in series with each other, and receiving an output of inverter 368; and an SR flip-flop circuit 382, being set in response to an output of inverter 368, and being reset in response to clocked inverter 380 to output signal INBURST0.

Clocked inverters 370, 374 and 378 are activated when clock signal CLK is at H level. On the other hand, clocked inverters 372, 376 and 380 are activated when clock signal /CLK is at H level.

Here, referring to FIGS. 9 and 10, brief description will be given of operation in row address comparing section 8A.

When ACT is inputted as a command from memory control device 9, signal ACTREQ from control circuit 2A is activated for the row address comparing section 8A. In FIG. 9, signal ACT0REQ is activated for block BLOCK0. When signal HIT is at H level and signal WLON is at H level, a corresponding word line is activated, so the row address comparing section 8A activate signal Ready to await write command WRT sent from memory control device 9 in succession.

On the other hand, when signal WLON is at L level, a word line is required to be activated, therefore signal ACT0 is activated by SR flip-flop circuit 244.

When signal HIT is at L level and signal WLON is at H level, a designated memory block is in use; therefore busy signal BUSY is outputted. In this case, when signal INBURST is at L level, signal PRE0 is simultaneously activated, while in a case where signal INBURST is at H level, signal PRE0 is not activated to cause no precharge.

Then, description will be given of a case where command SEN is given from memory control device 9 prior to a read command. When command SEN is given, control circuit 2A transmits row address signal RA0 to RA4 and signal SEN0REQ to row address comparing section 8A. When row addresses are in coincidence with held addresses and signal HIT assumes H level, row address comparing section 8A outputs signal Ready to await read command RD to be sent in succession.

On the other hand, when signal HIT is at L level and signal WLON is at L level, a necessity arises for activating a word line, therefore signal ACT0 is activated to activate a word line, and signal PRE0 is automatically activated 2 clocks thereafter to deactivate the word line.

When signal HIT is at L level and signal WLON is at H level, a memory block is in use, so signal BUSY is activated, and if, at this time, signal INBURST is at L level, signal PRE0 is simultaneously activated. When signal INBURST is at H level, signal PRE0 is not activated to cause no precharge.

Figure 11:
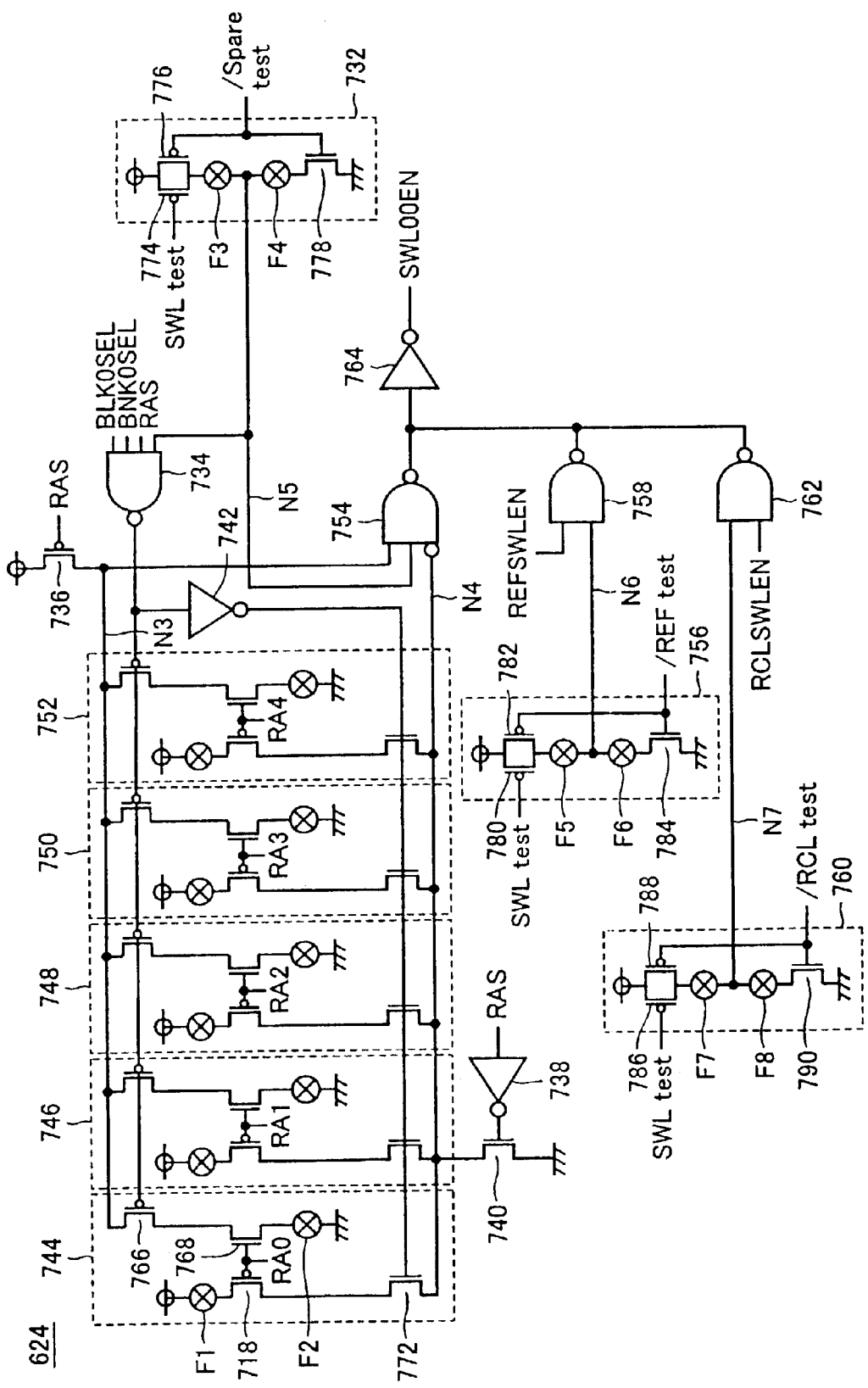
FIG. 11 is a circuit diagram for describing a configuration of a sense amplifier control circuit 5A in FIG. 8.

FIG. 11 is a circuit diagram for describing a configuration of a sense amplifier control circuit 5A in FIG. 8.

Referring to FIG. 11, control circuit 2A outputs signals ACT0REQ, SEN0REQ, RD0, WRT0 and PALL in response to command CMD inputted externally. For convenience in description, a bank address is omitted and commands for use in bank 0 are shown.

Sense amplifier control circuit 5A is different from sense amplifier control circuit 5 shown in FIG. 6 in that sense amplifier control circuit 5A includes a NAND circuit 402 receiving signal B0SEL and signal PRE0 in addition to the configuration of sense amplifier control circuit 5 and an output of NAND circuit 402 is given to delay circuit 124 and OR circuit 164.

Furthermore, sense amplifier control circuit 5A is different from sense amplifier control circuit 5 in that sense amplifier control circuit 5A includes a signal generating circuit 404 instead of signal generating circuit 147. The other parts of the configuration of sense amplifier control circuit 5A are similar to corresponding parts of the sense amplifier control circuit 5 of FIG. 6, so neither of descriptions thereof is repeated.

Signal generating circuit 404 includes: an OR circuit 406 receiving signals ACT0REQ and SEN0REQ; an OR circuit 408 receiving signal Ready and an output of delay circuit 102; an OR circuit 410 receiving signals RA5 and RA6; a gate circuit 412 receiving outputs of OR circuits 408 and 410; and an inverter 416 receiving an output of gate circuit 412 to invert; and an SR flip-flop circuit 418, being set in response to an output of inverter 416, and being reset in response to clock signal CLK.

Gate circuit 412 detects that an output of OR circuit 408 is at H level and an output of OR circuit 410 is at L level to activate an output thereof to L level.

Signal generating circuit 404 further includes: a gate circuit 414 receiving outputs of OR circuits 410 and 406; an inverter 420 receiving an output of gate circuit 414 to invert; and an SR flip-flop circuit 422, being set in response to an output of inverter 420, and being reset in response to clock signal CLK. Gate circuit 414 detects that an output of OR circuit 410 is at L level and an output of OR circuit 406 is at H level to activate an output thereof to L level.

Signal generating circuit 404 further includes: 4 clocked inverters 424 to 430, connected in series with each other, and receiving an output of SR flip-flop circuit 418; and a 3-input OR circuit 432 receiving outputs of SR flip-flop circuits 418 and 422, and an output of clocked inverter 430 to output signal B0SEL. Clocked inverters 424 and 428 are activated to perform invert operations when clock signal /CLK is at H level. On the other hand, clocked inverters 426 and 430 are inverted to perform invert operations when clock signal CLK is at H level.

Figure 12:
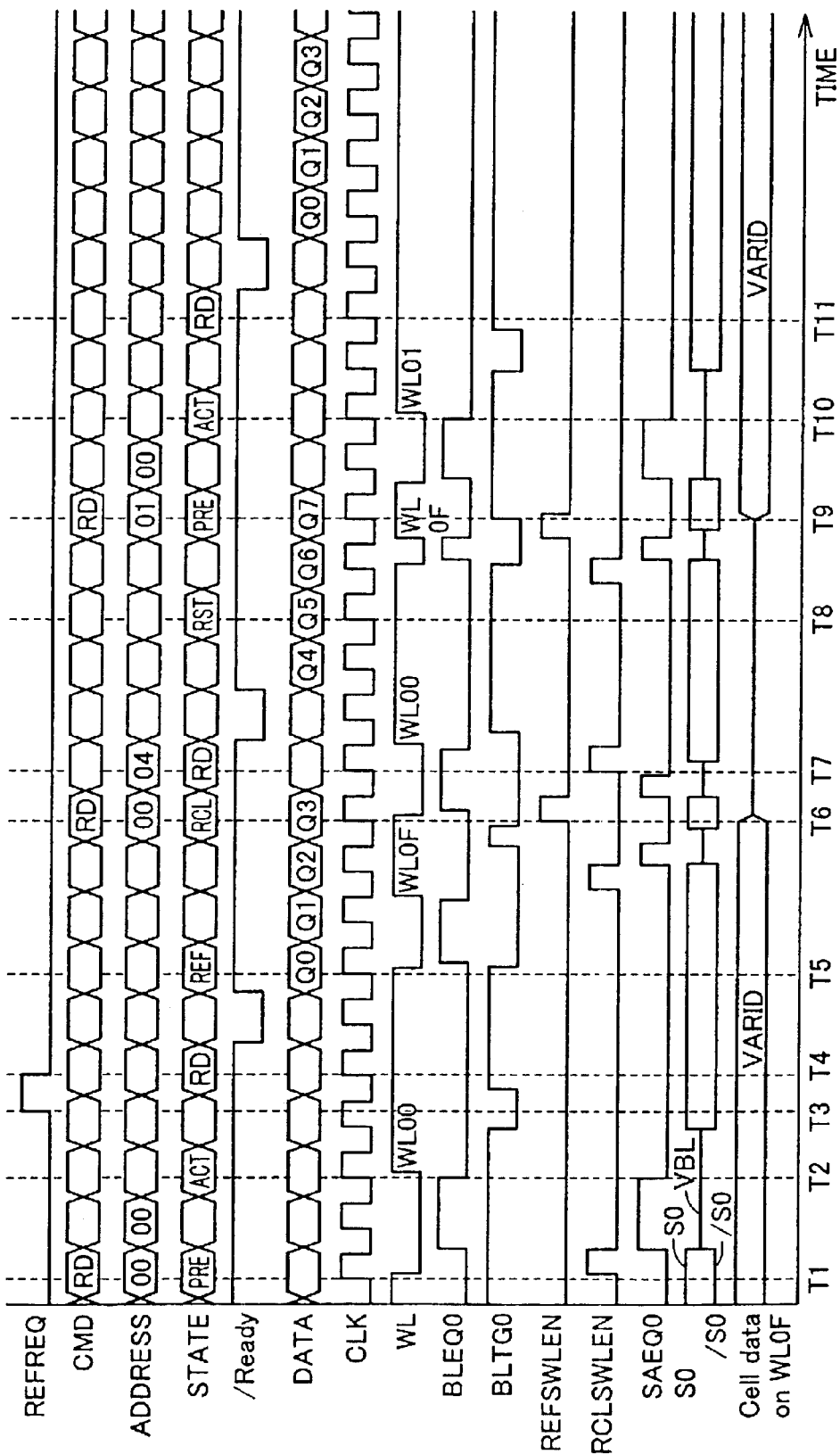
FIG. 12 is an operating waveform diagram for describing operation in semiconductor memory device of the second embodiment.

FIG. 12 is an operating waveform diagram for describing semiconductor memory device 1A of the second embodiment.

Referring to FIG. 12, at a time t1 command SEN and address 00 are inputted externally. This is an input at a first time, so no data is held in a sense amplifier. Hence, actually activation is performed on a word line. That is, word line WL00 of the word lines is selected and activated to H level.

Subsequent to this, similar to the case of the first embodiment, a sense amplifier is pulsewise equalized in response to signal SAEQ0 and signal BLTG0 is activated from L level to H level, followed by a sense operation. When the sense operation is completed, a word line activated by command SEN is automatically deactivated and equalization of a bit line pair is started in response to activation of signal BLEQ0.

At time t2 read command RD and address 00 is inputted. In response to the inputting, column select lines CSL0, CSL1, CSL2 and CSL3 are sequentially activated to read out data read-out into and held in sense amplifiers to outside.

At a time t3 command SEN and address 00 are inputted again.

Since data of a memory cell corresponding to address 00 is already held in a sense amplifier, row address comparing section 8A activate signal Ready for control circuit 2A. In this case, no necessity arises for any of row related operations.

At a time t4 read command RD and address 04 are inputted. Column select lines CSL4, CSL5, CSL6 and CSL7 are sequentially activated according to column addresses to read out data held in sense amplifiers. With the above operation performed, data Q0 to Q7 is outputted as output signals to outside.

In succession to this, at a time t5 activate command ACT and address 20 are inputted in order to perform a write operation. Since memory block 1 is in an inactive state, a word line corresponding to the row address is activated. That is, word line WL 20 is selected and activated from L level to H level. A sense amplifier is pulsewise equalized by signal SAEQ0 at the same time as activation of the word line and a separation gate is opened in response to signal BLTG1, followed by a sense operation.

Since burst writing is performed even after the sense operation is completed, word line WL20 activated to H level maintains its active state.

At a time t6 write command WRT and address 00 are inputted. Then, write data D0 to D3 is sequentially given externally. In response to this, data is written to memory cells designated by word line WL20 and column select lines CSL0, CSL1, CSL2 and CSL3.

At a time t7 activate command ACT and address 20 are inputted externally.

In memory block BLOCK1, however, since word line WL20 is in an active state and a write operation in its course, another word line cannot be activated. Therefore, row address comparing section 8A outputs IntBUSY to control circuit 2A. Furthermore, memory block BLOCK1 is currently in a burst operation, a precharge operation cannot be performed either. Therefore, even if activate command ACT is given externally, NOP (no operation) occurs in terms of internal operation. In this case, this situation is notified to memory control device 9 outside using signal BUSY.

At a time t8, activate command ACT and address 21 are again inputted externally. Since, in memory block BLOCK1, word line WL20 is still currently in an active state, row address comparing section 8A outputs signal IntBUSY in a similar manner to a case at time t7. However, since a burst operation is over, a precharge operation is started in the semiconductor memory device.

At a time t9, activate command ACT and address 21 are inputted again. Since memory block BLOCK1 is in an inactive state, word line WL21 is activated.

At a time t10 write command WRT and address 00 are inputted. Then, data is sequentially written to memory cells designated by word line 21 and column select lines CSL0, CSL1, CSL2 and CSL3.

At a time t11 command SEN and address 00 are inputted. In this case, since data is already read out into sense amplifiers, row address comparing section 8A performs notification for acceptance of a command with signal Ready. None of row-related operations is necessary, so acceptance of read command is immediately enabled.

At a time t12 read command RD and address 08 are inputted. In response to this, column select lines CSL8, CSL9, CSLA and CSLB are sequentially activated to read out data held in sense amplifiers.

The semiconductor memory device of the second embodiment, as described above, has the row address comparing section in the interior thereof to perform management of row addresses. Therefore, no necessity arises for managing row addresses on the memory control device side such as in a chip set. There is no chance that a sense amplifier holding effective data is deactivated because of shortage of a managing ability for row addresses on the chip set side. Thus the semiconductor device of the second embodiment can attain the maximum performance as a semiconductor memory device.

Note that in a case where the row address information is managed in a memory device, a time required for reading or writing is different between a case where activation of a word line is actually required and a case where not required. A necessity arises for separately providing a function to notify the difference to outside. The chip set, when an access request from CPU occurs, determines whether or not a word line at an address of interest is activated on the basis of a signal from a memory device without determining it with a register of the chip set itself. Therefore, no necessity arises for controlling and managing of activation/deactivation of a word line on the chip set side, thereby enabling an optimal word line control on the memory device side.

In the semiconductor memory device of the second embodiment, there are ensured a small number of activate operations of word line and decrease in combinations of discharge and charge, thereby enabling reduction in power consumption.

Third Embodiment

Important in a semiconductor memory device is a balance between simplicity of control and high speed operation. In order to realize simple control, there also arise a case where a prior art control scheme over SDRAM has to be observed that no row-related operation can be performed in a bank during a period when activation of a word line for writing is performed in the bank. Even in such a case, it is possible to realize high speed activation of a word line for reading.

Figure 13:
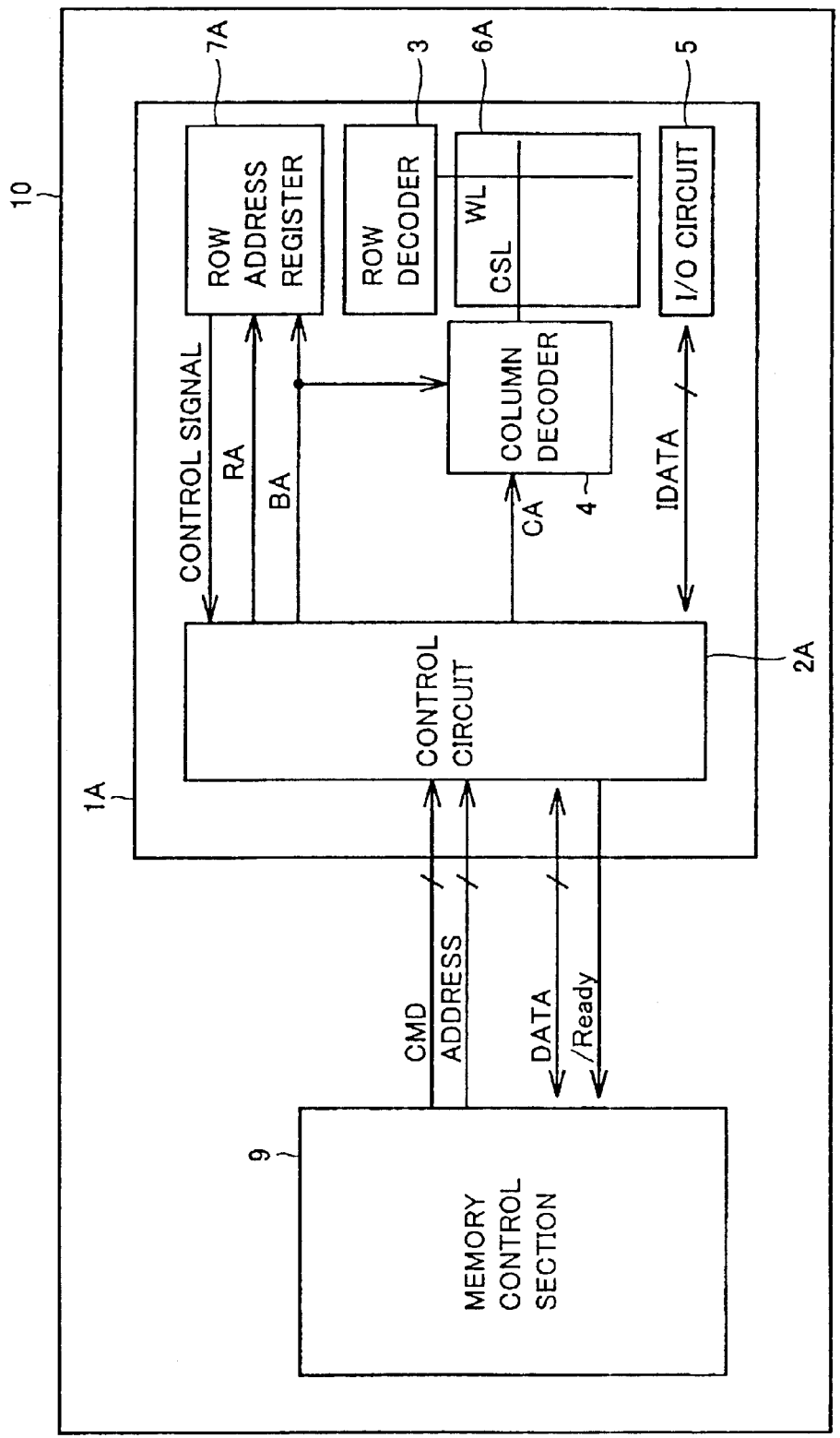
FIG. 13 is a diagram showing placement of memory cell arrays of a semiconductor memory device of a third embodiment.

FIG. 13 is a diagram showing placement of memory cell arrays of a semiconductor memory device of a third embodiment.

Referring to FIG. 13, there are shown BLOCK0 and BLOCK1 as representatives for memory blocks and there are placed switch arrays connecting corresponding bit lines therebetween in response to signal ARTG01 between memory blocks BLOCK0 and BLOCK1.

The other parts of the configuration are similar to corresponding parts of the configuration of described in FIG. 2, so none of description thereof is repeated.

Figure 14:
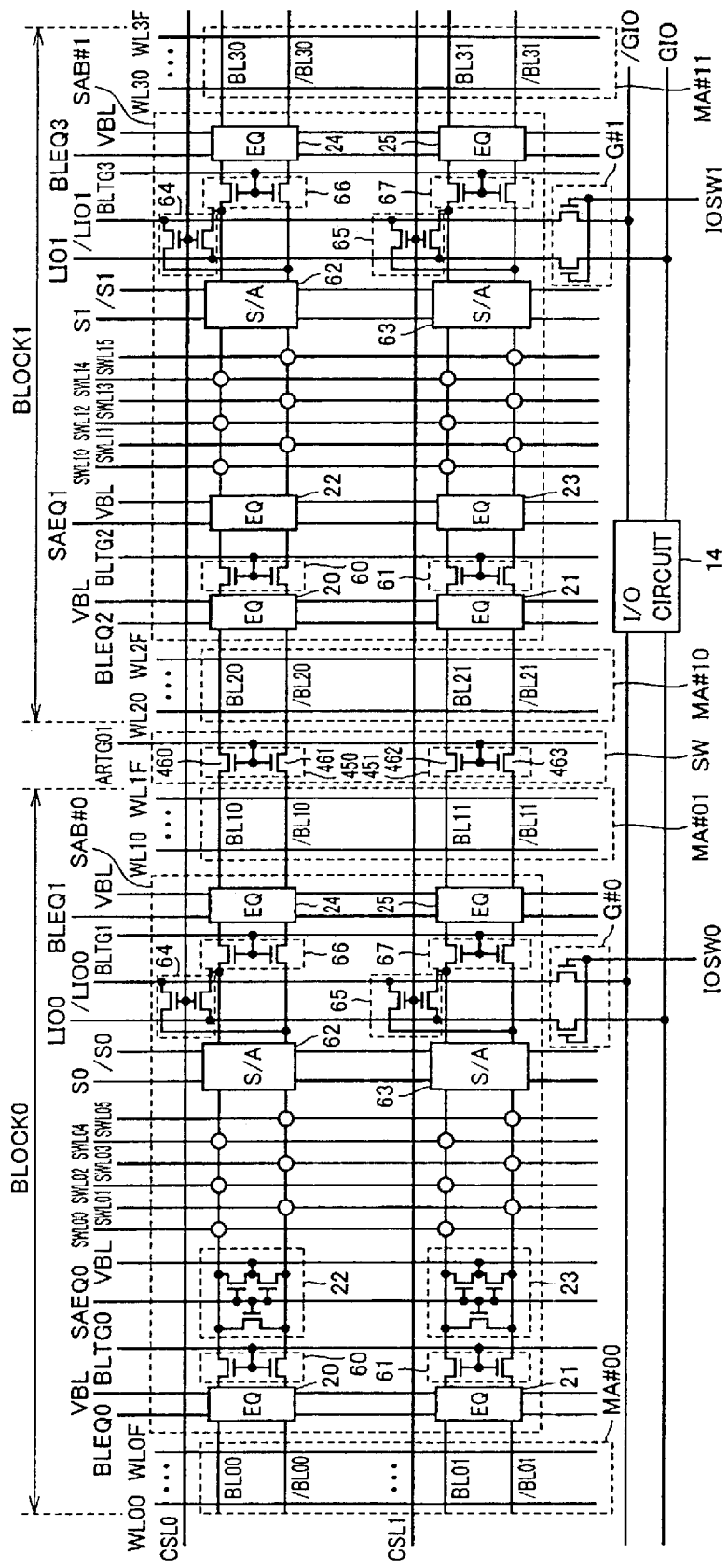
FIG. 14 is a circuit diagram showing a detailed configuration of a memory cell array.

FIG. 14 is a circuit diagram showing a detailed configuration of a memory cell array.

Referring to FIG. 14, memory block BLOCK0 includes; memory cell arrays MA#00 and MA#01; and a sense amplifier band SAB#0 placed between memory cell arrays MA#00 and MA#01 and shared thereby. Memory block BLOCK1 includes; memory cell arrays MA#10 and MA#11; and a sense amplifier band SAB#1 placed between memory cell arrays MA#10 and MA#11 and shared thereby. Since sense amplifier band SAB#0 has a configuration similar to the configuration described in FIG. 3, no description thereof is repeated. Since sense amplifier band SAB#1 also has a configuration similar to the configuration of sense amplifier band SAB#0, no description thereof is repeated.

Note that sense amplifier band SAB#1 is different in that a control signal corresponding to block BLOCK1 is given thereto instead of a control signal corresponding to block BLOCK0.

A switch array SW is placed between memory cell array MA#01 and memory cell array MA#10.

Switch array SW includes: a connection circuit 450 connecting bit line pair BL10 and /BL10 and bit line pair BL20 and /BL20 therebetween; and a connection circuit 451 connecting bit line pair BL11 and /BL11 and bit line pair BL21 and /BL21 therebetween.

Connection circuit 450 includes: an N-channel MOS transistor 460 connected between bit line BL10 and bit line BL20; and an N-channel MOS transistor 461 connected between bit line /BL10 and bit line /BL20, and connection circuit 451 includes: an N-channel MOS transistor 462 connected between bit line BL11 and bit line BL21; and an N-channel MOS transistor 463 connected between bit line /BL11 and bit line /BL21. N-channel MOS transistors 460 to 463 all receive signal ARTG01 at the gates thereof.

Figure 15:
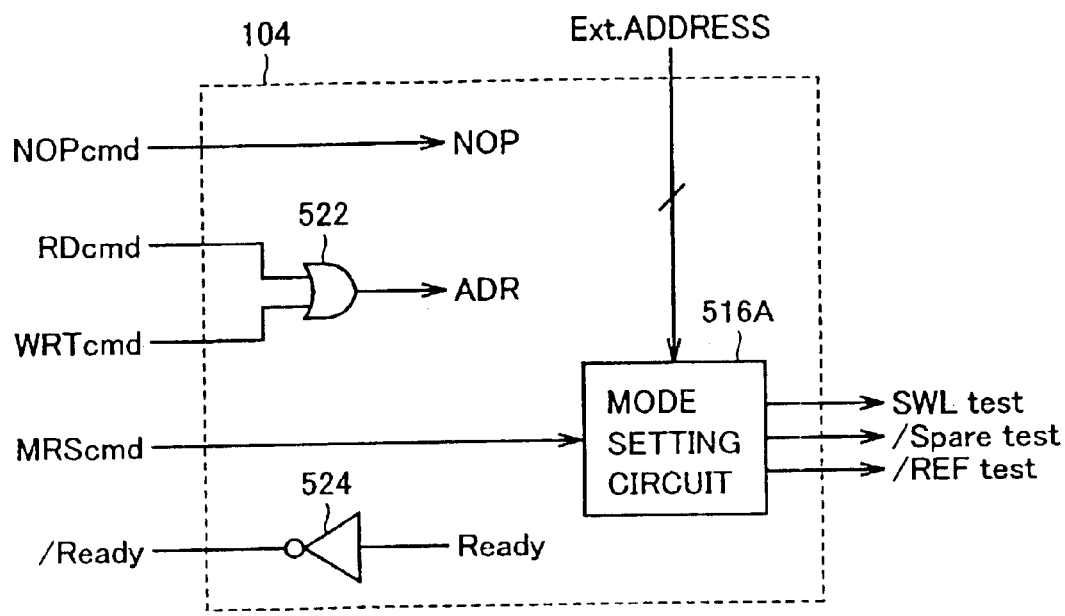
FIG. 15 is a block diagram showing a configuration of a sense amplifier control circuit 5B used in the third embodiment.

FIG. 15 is a block diagram showing a configuration of a sense amplifier control circuit 5B used in the third embodiment.

Referring to FIG. 15, sense amplifier control circuit 5B includes a reference timing generating section 502, outputting signal RAE causing a row address to be in an enable state in response to signals ACT0, SEN0, PRE0 and PALL, and signal BLEQ instructing equalization of bit lines and further outputting reference timing signals ACTD1 to ACTD3, SEND1 to SEND7, ACTSEN, ACTSEND1 to ACTSEND3, PRED1, PALLD1, PALLD2 and PCD1.

Sense amplifier control circuit 5B further includes: a sense amplifier control section 504 outputting signals S0, /S0, SAEQ0, S1, /S1 and SAEQ1; a isolation gate control section 506 outputting signals ARTG01 and BLTG0 to BLTG3 for controlling isolation gates provided to bit lines in response to row address signal /RA4, clock select signals B0SEL and B1SEL, and an output of a reference timing generating section; and an IOSW control section 508 outputting signals CAE, IOSW0, IOSW1, B0SEL and B1SEL, in response to signals RD0, WRT0 and IADDRESS.

Figure 16:
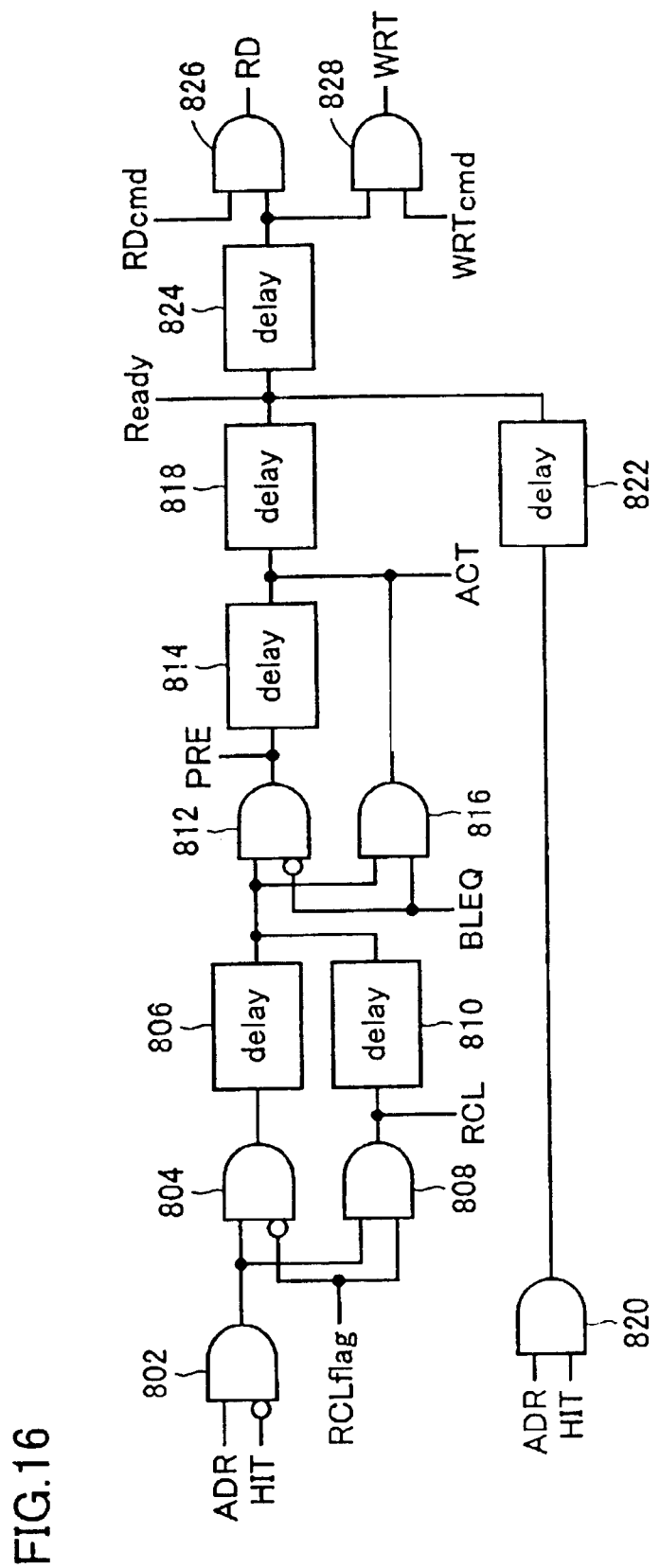
FIG. 16 is a circuit diagram showing a configuration of a reference timing generating section 502 in FIG. 15.

FIG. 16 a circuit diagram showing a configuration of a reference timing generating section 502 in FIG. 15.

Referring to FIG. 16, reference timing generating section 502 includes: a delay circuit 510 delaying signal ACT0 to output signal ACTD1; a delay circuit 512 delaying signal ACTD1 to output signal ACTD2; a delaying circuit 514 delaying signal ACTD2 to output signal ACTD3; and a delaying circuit 516 delaying signal ACTD3.

Reference timing generating circuit 502 further includes: a delay circuit 520 delaying signal SEN0 to output signal SEND1; a delay circuit 522 delaying signal SEN1 to output signal SEND2; a delay circuit 524 delaying signal SEND2 to output signal SEND3; and a delay circuit 526 delaying signal SEND3.

Reference timing generating section 502 further includes: an OR circuit 530 receiving signal ACT0 and signal SEN0 to output a signal ACTSEN; an OR circuit 532 receiving signal ACTD1 and signal SEND1 to output a signal ACT-SEND1; an OR circuit 534 receiving signal ACTD2 and signal SEND2 to output a signal ACTSEND2; an OR circuit 536 receiving signal ACTD3 and signal SEND3 to output a signal ACTSEND3; and an OR circuit 538 receiving outputs of delay circuits 516 and 526 to output signal a SEND4.

Reference timing generating section 502 further includes: a delay circuit 540 delaying a signal SEND4 to output a signal SEND5; a delay circuit 542 delaying a signal SEND5 to output a signal SEND6; and a delay circuit 544 delaying a signal SEND6 to output a signal SEND7.

Reference timing generating section 502 further includes: a delay circuit 546 delaying signal PRE0 to output signal PRED1; a delay circuit 552 delaying signal PALL to output signal PALLD1; a delay circuit 554 delaying signal PALLD1 to output signal PALLD2; an OR 550 receiving and delaying signal PC to output a signal PCD1.

Reference timing generating section 502 further includes: an OR circuit 556 receiving signals PALL and PRE0; an SR flip-flop circuit 558, being set in response to signal ACTD1, and being reset in response to an output of OR circuit 556; an SR flip-flop circuit 560, being set in response to signal SEND1, and being reset in response to signal SEND7; and an OR circuit 562 receiving outputs of SR flip-flop circuits 558 and 560 to output signal RAE.

Reference timing generating section 502 further includes: an OR circuit 564 receiving signal SEND7 and signal PCD1; and an SR flip-flop circuit 566, being set in response to an output of OR circuit 564, and being reset in response to signal ACTSEN to output signal BLEQ.

Description will be given of a signal RAE which is a main signal generated in a circuit of FIG. 16.

Signal RAE is activated by signal ACTD1 outputted in response to activate command and deactivated when a precharge command is inputted. On the other hand, signal RAE, when command SEN is inputted, is activated in response to activation of signal SEND1 after a prescribed delay time elapsed and deactivated after a prescribed time elapses since flip-flop circuit 560 is reset in response to signal SEND7. An activation timing of a word line is defined by an active period of signal RAE.

In such a way, reference timing generating section 502 generates reference timings in the row-related operations on the basis of combination of outputs of plural delay circuits delaying signals ACT0, SEN0, PRE0 and PALL.

Figure 17:
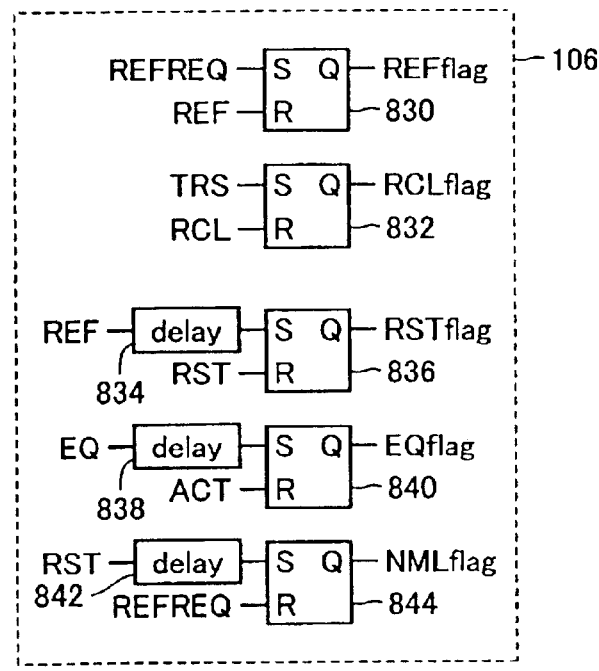
FIG. 17 is a circuit diagram showing a configuration of a sense amplifier control section 504 in FIG. 15.

FIG. 17 is a circuit diagram showing a configuration of a sense amplifier control section 504 in FIG. 15.

Referring to FIG. 17, sense amplifier control section 504 includes: a sense amplifier control signal generating circuit 570 outputting signals S0, /S0 and SAEQ0 for performing control of sense amplifier band SAB#0; and a sense amplifier control signal generating circuit 571 outputting signals S1, /S1 and SAEQ1 for performing control of sense amplifier band SAB#1.

Sense amplifier control signal generating circuit 570 includes: a NAND circuit 574 receiving signals B1SEL and SEND6; an inverter 576 receiving a output of NAND circuit 574 to invert; an SR flip-flop circuit 572, being set in response to signal SEND4, and being reset in response to signal SEND5; a NAND circuit 578 receiving signal B1SEL and an output of SR flip-flop circuit 572; an inverter 580 receiving an output of NAND circuit 578 to invert; an SR flip-flop circuit 582, being set in response to signal PALLD1, and being reset in response to signal PALLD2; an OR circuit 584 receiving an output of inverter 580 and an output of SR flip-flop circuit 582; and an SR flip-flop circuit 586, being set in response to an output of inverter 576, and being reset in response to an output of OR circuit 584.

Sense amplifier control signal generating circuit 570 further includes: a NAND circuit 588 receiving signals ACTSEND3 and B0SEL; an inverter 590 receiving an output of NAND circuit 588 to invert; an SR flip-flop circuit 592, being set in response to signal ACTSEN, and being reset in response to signal ACTSEND2; a NAND circuit 594 receiving signal B0SEL and an output of SR flip-flop circuit 592; an inverter 596 receiving an output of NAND circuit 594 to invert; an OR circuit 598 receiving an output of SR flip-flop circuit 582 and an output of inverter 596; and an SR flip-flop circuit 600, being set in response to an output of inverter 590, and being reset in response to an output of OR circuit 598.

Sense amplifier control signal generating circuit 570 further includes: an OR circuit 602 receiving outputs of SR flip-flop circuits 586 and 600; a drive circuit 604 driving signals S0 and /S0 in response to an output of OR circuit 602; and an OR circuit 606 receiving outputs of OR circuits 584 and 598 to output signal SAEQ0.

Sense amplifier control signal generating circuit 571 is different from sense amplifier control signal generating circuit 570 in that in the configuration of sense amplifier control signal generating circuit 571, signal B0SEL is received instead of signal B1SEL, signal B1SEL is received instead of signal B0SEL and signals S1, /S1 and SAEQ1 are outputted instead of signals S0, /S0 and SAEQ0, but has a configuration similar to that of sense amplifier control signal generating circuit 570, so no description thereof is repeated.

In such a manner, sense amplifier control section 504 performs control of equalization, activation and deactivation of a sense amplifier in a memory block designated by a block select signal on the basis of reference timings in operations given from reference timing generation section 502.

Figure 18:
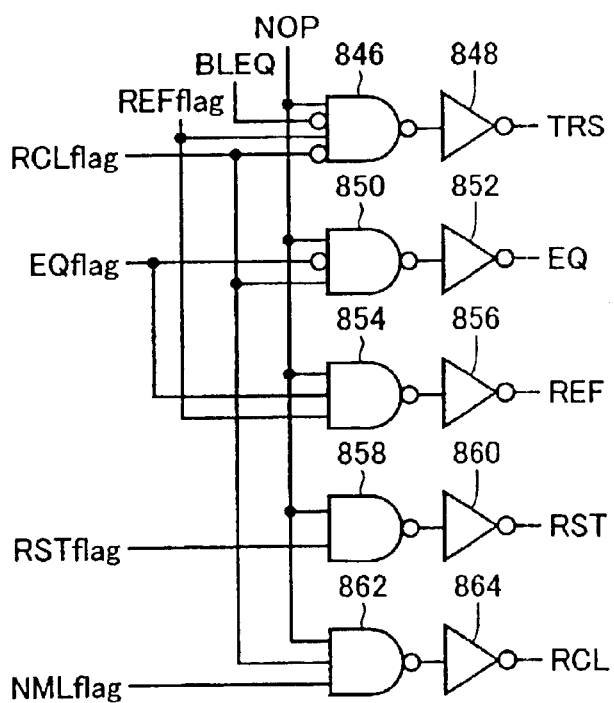
FIG. 18 is a circuit diagram showing a configuration of an isolation gate control section 506 in FIG. 15.

FIG. 18 is a circuit diagram showing a configuration of an isolation gate control section 506 in FIG. 15.

Referring to FIG. 18, isolation gate control section 506 includes: a signal generating circuit 610 outputting signals BLTG0 and BLTG1 for performing control of an isolation gate of memory block BLOCK0; a signal generating circuit 612 outputting signals BLTG2 and BLTG3 for performing control of an isolation gate of memory block BLOCK1; and a signal generating circuit 614 outputting signal ARTG01 for performing control of a switch array placed between memory blocks BLOCK0 and BLOCK1.

Signal generating circuit 610 includes: a 3-input NAND circuit 620 receiving signals ACTD2, B0SEL and RA4; an inverter 622 receiving an output of NAND circuit 620 to invert; and an SR flip-flop circuit 624, being set in response to an output of inverter 622, and being reset in response to signal PCD1.

Signal generating circuit 610 further includes: a 3-input NAND circuit 626 receiving signals SEND2, B0SEL and RA4; an inverter 628 receiving an output of NAND circuit 626 to invert; and an SR flip-flop circuit 630, being set in response to an output of inverter 628, and being reset in response to signal SEND7.

Signal generating circuit 610 further includes: a gate circuit 632 activating an output thereof to L level when signals SEND4 and B0SEL are both at H level and signal RA4 is at L level; an inverter 634 receiving an output of gate circuit 632 to invert; and an SR flip-flop circuit 636, being set in response to an output of inverter 634, and being reset in response to signal SEND7. Signal generating circuit 610 further includes: a NAND circuit 638 receiving signals SEND5 and B1SEL; an inverter 640 receiving an output of NAND circuit 638 to invert; an SR flip-flop circuit 642, being set in response to an output of inverter 640, and being reset in response to signal SEND7; and a 4-input OR circuit 643 receiving outputs of SR flip-flop circuits 624, 630, 636 and 642 to output signal BLTG1.

Signal generating circuit 610 further includes: a gate circuit 644 detecting that signals ACTD2 and B0SEL are at H level and signal RA4 is at L level to activate an output thereof to L level; inverter 646 receiving an output of gate circuit 644 to invert; and an SR flip-flop circuit 648, being set in response to an output of inverter 646, and being reset in response to signal PCD1.

Signal generating circuit 610 further includes: a gate circuit 650 detecting that signals SEND2 and B0SEL are at H level and signal RA4 is at L level to activate an output thereof to L level; an inverter 652 receiving an output of gate circuit 650 to invert; an SR flip-flop circuit, being set in response to an output of inverter 652, and being reset in response to signal SEND7; and an OR circuit 656 receiving outputs of SR flip-flop circuits 648 and 654 to output signal BLTG0.

Signal generating circuit 612 includes: a gate circuit detecting that signals ACTD2 and B1SEL are at H level and signal RA4 is at L level to activate an output thereof to L level; an inverter 662 receiving an output of gate circuit 660 to invert; and an SR flip-flip circuit 664, being set in response to an output of inverter 662, and being reset in response to signal PCD1.

Signal generating circuit 612 further includes: a gate circuit 666 detecting that signals SEND2 and B1SEL are at H level and signal RA4 is at L level to activate an output thereof to L level; an inverter 668 receiving an output of gate circuit 666 to invert; and an SR flip-flop circuit 670, being set in response to an output of inverter 668, and being reset in response to signal SEND7.

Signal generating circuit 612 further includes: a NAND circuit 672 receiving signals SEND4, B1SEL and RA4; an inverter 674 receiving an output of NAND circuit 672 to invert; and an SR flip-flop circuit 676, being set in response to an output of inverter 674, and being reset in response to signal SEND7.

Signal generating circuit 612 further includes: a NAND circuit 678 receiving signals SEND5 and B0SEL; an inverter 680 receiving an output of NAND circuit 678 to invert; an SR flip-flop circuit 682, being set in response to an output of inverter 680, and being reset in response to signal SEND7; and a 4-input OR circuit receiving outputs of SR flip-flop circuits 664, 670, 676 and 682 to output signal BLTG2.

Signal generating circuit 612 further includes: a 3-input NAND circuit 686 receiving signals ACTD2, B1SEL and RA4; an inverter 688 receiving an output of NAND circuit 686 to invert; an SR flip-flop circuit 690, being set in response to an output of inverter 688, and being reset in response to signal PCD1; a 3-input NAND circuit 692 receiving signals SEND2, B1SEL and RA4; an inverter 694 receiving an output of NAND circuit 692 to invert; an SR flip-flop circuit 696, being set in response to an output of inverter 694, and being reset in response to signal SEND7; and an OR circuit 698 receiving outputs of SR flip-flop circuits 690 and 696 to output signal BLTG3.

Signal generating circuit 614 includes: a NAND circuit 700 receiving signals SEND4 and B0SEL; an inverter 702 receiving an output of NAND circuit 700 to invert; an SR flip-flop circuit 704, being set in response to an output of inverter 702, and being reset in response to signal SEND7; a NAND circuit 706 receiving signals SEND4 and B1SEL; an inverter 708 receiving an output of NAND circuit 706 to invert; an SR flip-flop circuit 707, being set in response to an output of inverter 708, and being reset in response to signal SEND7; and an OR circuit 709 receiving outputs of SR flip-flop circuits 707 and 704 to output signal ARTGO1.

Signals BLTG0 and BLTG3 have no relation with control in a case where data held in a sense amplifier is transferred to an adjacent memory block.

On the other hand, signal BLTG1 has a relation with control of transfer of data held in a sense amplifier to an adjacent memory block. Therefore, in order to generate signal BLTG1, there are provided gate circuit 632, inverter 634, SR flip-flop circuit 636, NAND circuit 638, inverter 640 and SR flip-flop circuit 642 in addition to a circuit corresponding to a circuit configuration generating signal BLTG0.

Similarly, signal BLTG2 has a relation with control of transfer of data held in a sense amplifier to an adjacent memory block. Therefore, in order to generate signal BLTG2, there are provided NAND circuits 672 and 678, inverters 674 and 680, and SR flip-flop circuits 676 and 682 in addition to a circuit corresponding to a circuit configuration generating signal BLTG3.

Figure 19:
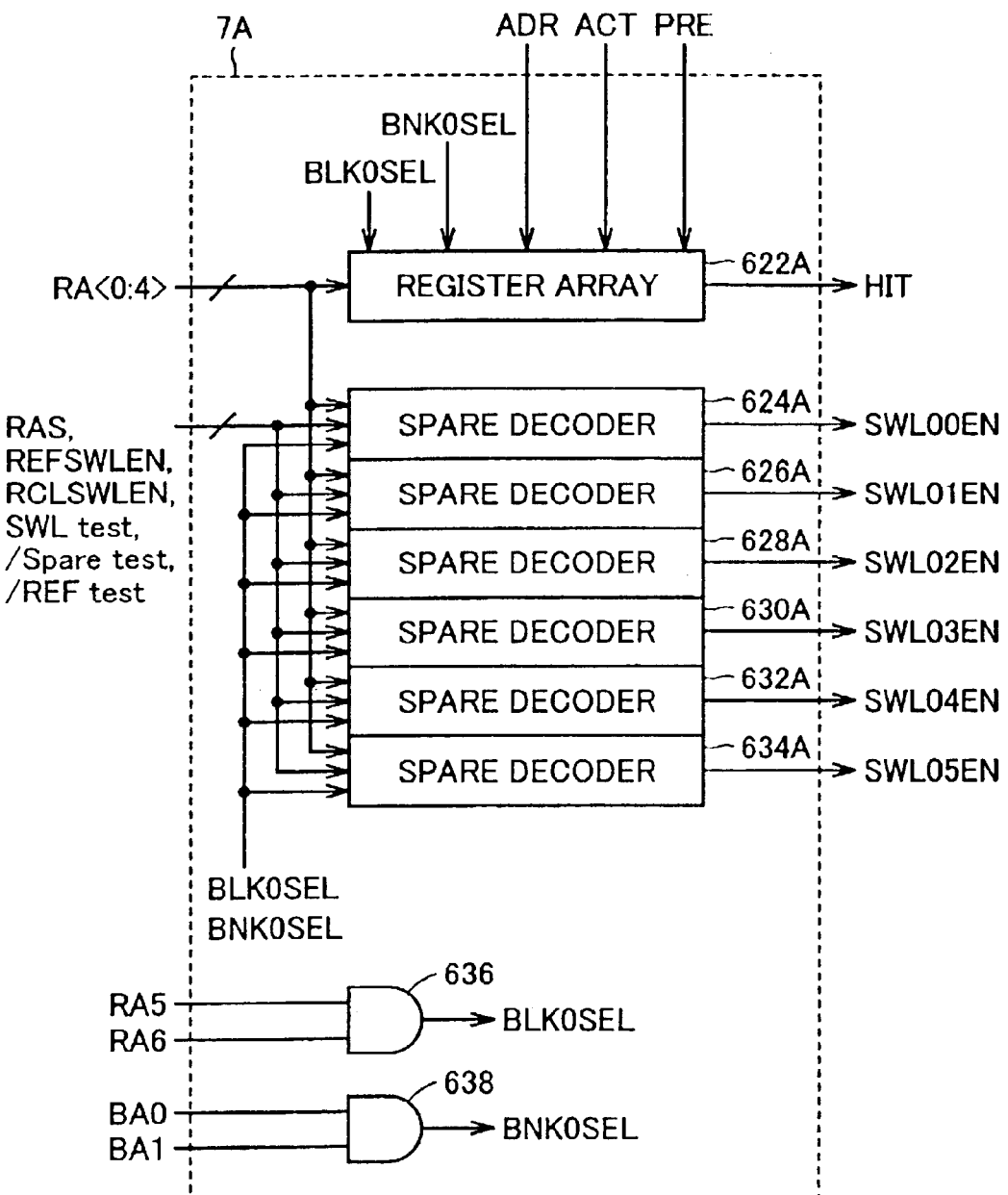
FIG. 19 is a circuit diagram showing a configuration of an IOSW control section 508 in FIG. 15.

FIG. 19 is a circuit diagram showing a configuration of an IOSW control section 508 in FIG. 15.

Referring to FIG. 19, IOSW control section 508 includes: a signal generating circuit 710 outputting signals B0SEL and B1SEL for selecting a block in response to row address signals RA5 and RA6; a signal generating circuit 712 outputting signal CAE for activating a column decoder in response to signal WRT0 and RD0 and signals WIOSW and RIOSW, being pulsewise activated, and corresponding to a burst operation; and a signal generating circuit 714 outputting signals IOSW0 and IOSW1.

Signal generating circuit 710 includes: an OR circuit 720 receiving signals RA5 and RA6; an inverter 722 receiving an output of OR circuit 720 to invert; a NAND circuit 724 receiving an output of inverter 722 and signal ACTSEN; an inverter 726 receiving an output of NAND circuit 724 to invert; and an SR flip-flop circuit 728, being set in response to an output of inverter 726, and being reset in response to clock signal CLK.

Signal generating circuit 710 further includes: clocked inverters 730 to 736, connected in series with each other, and receiving an output of SR flip-flop circuit 728; and an OR circuit 738 receiving an output of SR flip-flop circuit 728 and an output of clocked inverter 736 to output signal B0SEL.

Clocked inverters 730 and 734 each perform an invert operation in response to activation of signal clock /CLK Clocked inverters 732 and 736 each perform an invert operation in response to activation of signal clock CLK.

Signal generating circuit 710 further includes: a gate circuit 740 detecting that signal RA5 is at H level and signal RA6 is at L level to activate an output thereof to L level; an inverter 742 receiving an output of gate circuit 740 to invert; a NAND circuit 744 receiving an output of inverter 742 and signal ACTSEN; an inverter 746 receiving an output of NAND circuit 744 to invert; and an SR flip-flop circuit 748, being set in response to an output of inverter 746, and being reset in response to clock signal CLK.

Signal generating circuit 710 further includes: clocked inverters 750 to 756, connected in series with each other, and receiving an output of SR flip-flop circuit 748; and an OR circuit 758 receiving an output of SR flip-flop circuit 748 and an output of clocked inverter 756 to output signal B1SEL.

Clocked inverters 750 and 754 perform invert operations in response to activation of clock signal /CLK. Clocked inverters 752 and 756 perform invert operations in response to activation of clock signal CLK.

Signal generating circuit 712 includes: a pulse generating circuit 760 generating a pulse signal corresponding to a burst operation in response to signal WRT0; a pulse generating circuit 762 generating a pulse signal corresponding to a burst operation in response to signal RD0; an OR circuit 764 receiving signal WCSL from pulse generating circuit 760 and signal RCSL form pulse generating circuit 762 to output signal CAE to a column decoder 4; an OR circuit 766 receiving signals INBURSTW and INBURSTR from respective pulse circuits 760 and 762; a NAND circuit 768 receiving an output of OR circuit 766 and signal B0SEL; an inverter 770 receiving an output of NAND circuit 768 to invert the output and to output signal INBURST0; a NAND circuit 772 receiving an output of OR circuit 766 and signal B1SEL; and an inverter 774 receiving an output of NAND circuit 772 to invert the output and to output signal INBURST1.

Pulse generating circuit 762 includes: 6 clocked inverters 780 to 790, connected in series with each other, and receiving signal RD0; and an SR flip-flop circuit 794, being set in response to signal RD0, and being reset in response to an output of clocked inverter 790 to output signal INBURSTR. Clocked inverters 780, 784 and 788 are activated in response to clock signal CLK to perform invert operations. Clocked inverters 782, 786 and 790 are activated in response to clock signal /CLK to perform invert operations.

Pulse generating circuit 762 further includes: a 4-input OR circuit 792 receiving outputs of clocked inverters 780, 784 and 788 and signal RD0; delay circuits 796, 798, 800 and 804 connected in series with each other, and receiving an output of OR circuit 792; an SR flip-flop circuit 802, being set in response to an output of delay circuit 796, and being set in response to an output of delay circuit 800 to output signal RCSL; and an SR flip-flop circuit 806, being set in response to an output of delay circuit 798, and being reset in response to an output of delay circuit 804 to output signal RIOSW.

Pulse generating circuit 760 is different from pulse generating circuit 762 in that pulse generating circuit 760 receiving signal WRT0 instead of signal RD0 and outputs signals INBURSTW, WIOSW and WCSL instead of signals INBURSTR, RCSL and RIOSW, but a configuration therein is similar to that of pulse generating circuit 762, so no description thereof is repeated.

Signal generating circuit 714 includes: a NAND circuit 810 receiving signals ACTSEN and B0SEL; an inverter 812 receiving an output of NAND circuit 810 to invert; a gate circuit 814 detecting that signals INBURST0 and RIOSW are at H level and an output of inverter 812 is at L level to activate an output thereof to L level; and an inverter 816 receiving an output of gate circuit 814 to invert.

Signal generating circuit 714 further includes: a NAND circuit 818 receiving signal ACTSEN and B1SEL; an inverter 820 receiving an output of NAND circuit 818 to invert; a 3-input NAND circuit 822 receiving signals INBURST1 and RIOSW and an output of inverter 820; and an inverter 824 receiving an output of NAND circuit 822 to invert.

Signal generating circuit 714 further includes: a NAND circuit 826 receiving signals INBURST0 and WIOSW; an inverter 828 receiving an output of NAND circuit 826 to invert; and a 3-input OR circuit 830 receiving outputs of inverters 816, 824 and 828 to output signal IOSW0.

Signal generating circuit 714 further includes: a NAND circuit 832 receiving signals ACTSEN and B1SEL; an inverter 834 receiving an output of NAND circuit 832 to invert; a gate circuit 836 detecting that signals INBURST1 and RIOSW are both at H level and an output of inverter 834 is at L level to activate an output thereof to L level; and an inverter 838 receiving an output of gate circuit 836 to invert.

Signal generating circuit 714 further includes: a NAND circuit 840 receiving signals ACTSEN and B0SEL; an inverter 842 receiving an output of NAND circuit 840 to invert; a 3-input NAND circuit 844 receiving signals INBURST0 and RIOSW and an output of inverter 842; and an inverter 846 receiving an output of NAND circuit 844 to invert.

Signal generating circuit 714 further includes: a NAND circuit 848 receiving signal INBURST1 and WIOSW; an inverter 850 receiving an output of NAND circuit 848 to invert; and a 3-input OR circuit 852 receiving outputs of inverters 838, 846 and 850 to output signal IOSW1.

Description will be given of main signals generated in the circuit of FIG. 19.

Signal INBURSTR is a signal generated in response to signal RD0 and staying at H level for a period of a burst length. Signals RCSL and RIOSW are signals each activated as pulses in the same number as the number of data outputted during a burst period in response to signal RD0.

Similarly, signal INBURSTW is a signal generated in response to signal WRT0 and staying at H level for a period of a burst length. Signals WCSL and WIOSW are signals each activated as pulses in the same number as the number of data outputted during a burst period in response to signal WRT0.

Signal IOSW0 is outputted in the following three cases:

A first case is a case where signal INBURST0=H and signal RIOSW=H, and memory block BLOCK0 is in a state having accepted neither of command ACT and command SEN.

A second case is a case where signal INBURST1=H and signal RIOSW=H, and memory block BLOCK1 is in a state having accepted command ACT and command SEN.

A third case is a case where signal INBURST0=H and signal WIOSW=H.

Similarly, signal IOSW1 is outputted in the following three cases:

A first case is a case where signal INBURST1=H and signal RIOSW=H, and memory block BLOCK1 is in a state having accepted neither of command ACT and command SEN.

A second case is a case where signal INBURST0=H and signal RIOSW=H, and memory block BLOCK0 is in a state having accepted command ACT and command SEN.

A third case is a case where signal INBURST1=H and signal WIOSW=H.

By controlling signals IOSW0 and IOSW1 in such ways, one of IOSW0 and IOSW1 on a selected memory block side is usually activated to output, while a gate circuit of an adjacent memory block is opened to continue data outputting when command ACT or command SEN is inputted to a memory block selected during a burst operation.

Figure 20:
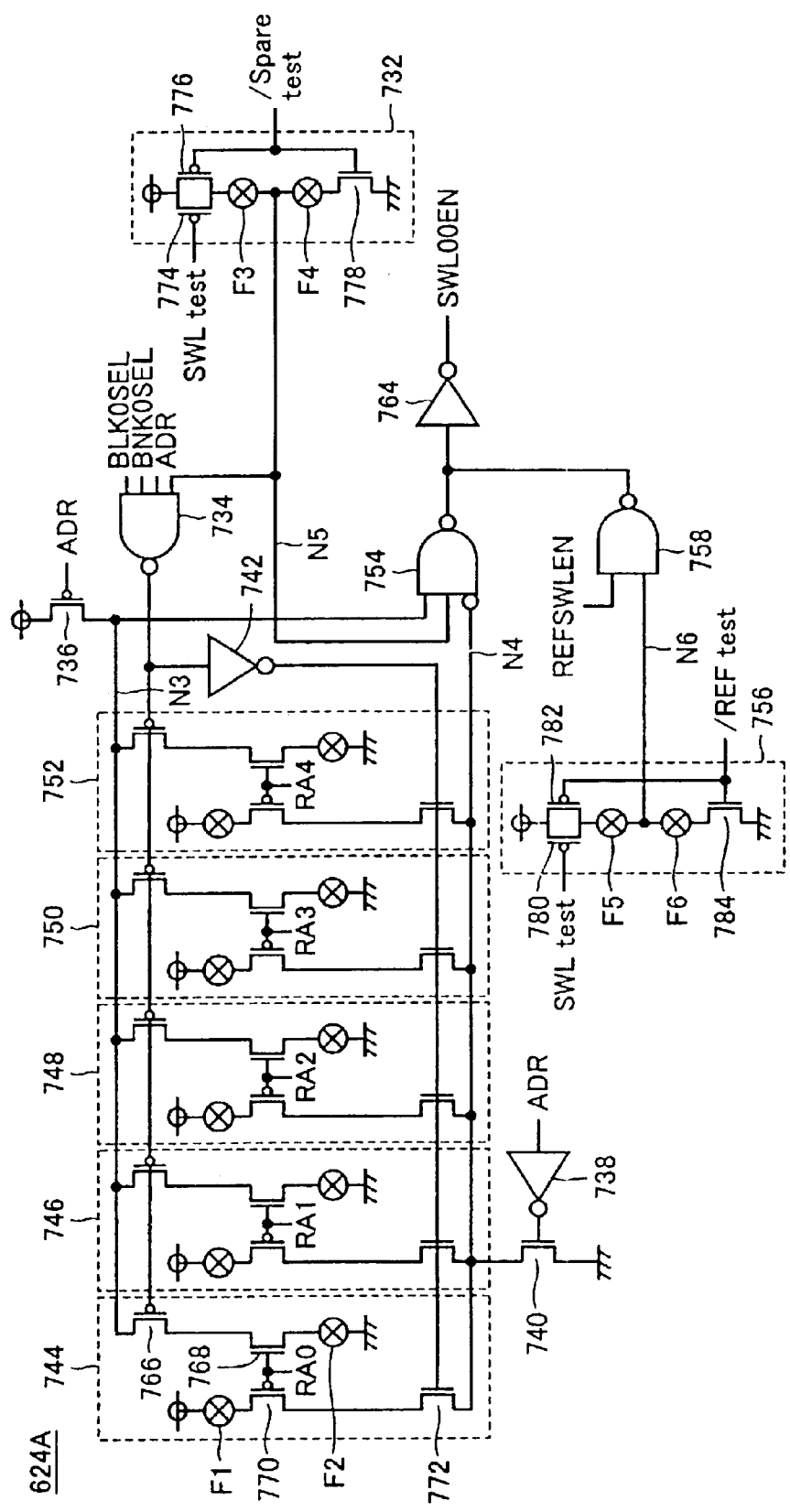
FIG. 20 is an operating waveform diagram for describing operation in the semiconductor memory device of the third embodiment.

FIG. 20 is an operating waveform diagram for describing the semiconductor memory device of the third embodiment.

Referring to FIGS. 14 and 20, description will be given of an example in which a read operation is performed from plural word lines belonging to the same memory block. Note that a burst length is set to 4 clocks.

In an initial state at time t0, signal BLEQ is at H level. Signals SAEQ0 and SAEQ1 are both at L level. Signals BLTG0, BLTG1 and BLTG2 are all at L level. Signals S0, S1, /S0 and /S1 are all at potential VBL (one half of power supply potential VDD).

At a time t1, command SEN and address 00 are inputted. In response to this, signal BLEQ changes from H level to L level. Furthermore, signal SAEQ0 is pulsewise activated. In response to this, bit lines BL00 and /BL00, BL01 and /BL01 of FIG. 14 each assumes a high impedance state. Sense amplifiers 62 and 63 are initialized.

Word line WL00 corresponding to address 00 is activated to H level and data of a memory cell is read out onto Bit line BL00. Thereafter, signal BLTG0 is activated from L level to H level to transmit potentials on bit line pairs to sense amplifiers 62 and 63.

Then, signal S0 and /S0 are activated to H level and L level, respectively, a potential difference of the bit line pair is amplified in sense amplifiers 62 and 63.

Since no effective data is stored in sense amplifiers 62 and 63 included in memory block BLOCK1, an operation is started that data obtained by amplification of sense amplifiers 62 and 63 included in memory block BLOCK0 is transferred to sense amplifiers 62 and 63 included in Memory block BLOCK1.

Signals BLTG1 and ARTG01 are activated from L level to H level and potentials on bit line pair, obtained by amplification of a sense amplifier, are transferred to memory block BLOCK1 side. That is, a potential on bit line BL00 is transmitted onto bit line BL10 and further transmitted onto bit line BL20. Similarly, a potential on bit line /BL00 is transmitted onto bit line /BL10 and further transmitted onto bit line /BL20.

Thereafter, signal SAEQ1 is pulsewise activated to H level to initialize sense amplifiers 62 and 63 included in sense amplifier band SAB#1. Thereafter, signal BLTG2 is activated from L level to H level and signal S1 and /S1 are activated to H level and L level, respectively, to amplify a potential difference between bit lines BL20 and /BL20. Since the potential difference is originally the difference between bit lines BL00 and /BL00, sense amplifier 62 of sense amplifier band SAB#0 and sense amplifier 62 of sense amplifier band SAB#1 hold the same potential difference value as each other.

Since word line WL00 is activated in response to command SEN, wore line WL00 is automatically deactivated when a prescribed time elapses and data has been read out to sense amplifiers.

When data transfer is completed, signals BLTG0, ARTG01, BLTG1 and BLTG2 are set to L level while signal BLEQ is set to H level.

The above operations are performed in response to inputting of command SEN at time t1.

At a time t2, in parallel of the operations, command RD and address 00 are inputted externally. Data corresponding to column addresses 00 to 03 are read out because of a burst length of 4 clocks.

Column select line CSL0 is activated to H level in response to inputting of command RD and sense amplifiers 62 of sense amplifier bands SAB#0 and SAB#1 are connected to respective local IO line pairs LIO0 and LIO1.

Signal IOSW0 is driven to H level to connect local IO line LIO0 to global IO line GIO and data held in sense amplifier 62 of sense amplifier band SAB#0 is transmitted to input/output circuit 14 through local IO line LIO0 and global IO line pair GIO.

In succession, according to a burst operation, column select line CSL1 is activated to H level to connect sense amplifiers 63 in sense amplifier bands SAB#0 and SAB#1 to respective local IO lines LIO0 and LIO1.

Signal IOSW0 is activated to H level to connect local IO line LIO0 to global IO line GIO, data of sense amplifier 63 in sense amplifier band SAB#0 is transmitted to input/output circuit 14 through local IO line LIO0 and global IO line GIO.

At a time t3, command SEN and address 01 are inputted. In response to this, signal BLEQ is set to L level and signal SAEQ0 is pulsewise activated to H level. Equalization of a bit line pair ceases to initialize a sense amplifier.

Since, at this time, a read operation is somewhere in its course, a necessity exists for reading out data continuously, whereas sense amplifiers 62 and 63, having been holding data, of memory block BLOCK0 is initialized. At a time t2, data of sense amplifiers 62 and 63 on the memory block BLOCK0, however, has all been transferred onto the memory block BLOCK1 side by activating signal ARTG01, thereby enabling continuation of the read operation from sense amplifiers 62 and 63 on the block BLOCK1.

According to the burst operation, column select line CSL2 is activated to H level to connect a sense amplifier not shown to a local IO line pair.

Signal IOSW1 is activated to H level instead of signal IOSW0 to connect local IO line LIO0 to global IO line GIO. Data of a sense amplifier on the memory block BLOCK1 side is transmitted to input/output circuit 14 through local IO line LIO1 and global IO line GIO. The first two pulses of signal IOSW0 are outputted from OR circuit 830 through gate circuit 814 and inverter 816 and the second two pulses of IOSW1 following the first two pulses are outputted from OR circuit 852 through NAND circuit 844 and inverter 846 in response to inputting of activate command to memory block BLOCK0 somewhere in the course of outputting of the first two pulses of signal IOSW0.

Further in succession, column select line CSL3 and signal IOSW1 are activated to H level to thereby transmit data of a corresponding sense amplifier not shown is transmitted to input/output circuit 14 through local IO line LIO1 and global IO line GIO.

Operation associated with a word line are preformed in a similar manner to a case at time t1. First of all, word line WL01 is activated to H level to read out data of a memory cell. In order to transmit data read into a sense amplifier, signal BLTG0 is driven to H level. Signals S0 and /S0 are set to H level and L level, respectively, to cause the sense amplifier to amplify a potential difference on a bit line pair.

Transfer of data from a sense amplifier on memory block BLOCK0 side to a sense amplifier on memory block BLOCK1 side is performed in a similar manner to that on inputting of command SEN at a time t1. First of all, signals ARTG01 and BLTG1 are set to H level and signals S1 and /S1 are both set to potential VBL. Then, signal SAEQ1 is pulsewise activated to H level. Thereafter, signal BLTG2 is set to H level, and signals S1 and /S1 are set to H level and L level, respectively, to cause sense amplifiers 62 and 63 in sense amplifier band SAB#1 to amplify data transferred from memory block BLOCK0 thereto, and, after the data transfer is completed, signals BLTG0, ARGT01, BLTG1 and BLTG2, and word line W01 are set to L level and signal BLEQ is set to H level.

In succession, at a time t4, read command RD and address 00 are inputted.

Dissimilar to the previous time, since command SEN is not inputted at the last stage of a read operation, there is conducted a burst read operation similar to that of a common SDRAM. That is, column select lines CSL0, CSL1, CSL2 and CSL3 are sequentially pulsewise activated to H level. Then, signal IOSW0 is pulsewise activated 4 times in response to activation of respective column select lines. Local IO line LIO0 is connected to global IO line GIO and data of sense amplifiers 62 and 63, and sense amplifiers corresponding to column select lines CSL2 and CSL3, not shown, in sense amplifier band SAB#0 are transmitted to input/output circuit 14 through local IO line LIO0 and global IO line GIO.

Description will be given of a write operation at a time t5 and thereafter. First of all, command ACT and address 01 are inputted.

There is performed an operation similar to activation of a word line in response to command SEN at time t1. First of all, word line WL01 is activated to H level to read data of a memory cell. Then, signal BLTG0 is set to H level, signals S0 and /S0 are set to H level and L level, respectively, to cause a sense amplifier to amplify a potential difference on a bit line pair.

Furthermore, transfer of data from a sense amplifier on memory block BLOCK0 side to a sense amplifier on memory block BLOCK1 side is performed in a similar manner to the case at time t1. Signals ARTG01 and BLTG1 are set to H level, signals S1 and /S1 are both set to potential VBL and signal SAEQ1 is pulsewise activated to H level.

Thereafter, signal BLTG2 is set to H level, signals S1 and /S1 are set to H level and L level, respectively, to cause sense amplifiers 62, 63, . . . in sense amplifier band SAB#1 to amplify data transferred from memory block BLOCK0 thereto and, after the data transfer is completed, signals ARTG01, BLTG1 and BLTG2 are set to L level.

At a time t6, write command WRT and address 04 are inputted.

Signal IOSW0 is set to H level, column select line CSL4 is activated to H level and a sense amplifier, not shown, corresponding to column select line CSL4 receives data through global IO line GIO and local IO line LIO0 to write the data to a memory cell.

Thereafter, column select lines CSL5, CSL6 and CSL7 are sequentially activated according to a burst operation to write data to memory cells at respective corresponding column addresses.

In a case where the semiconductor memory device according to the third embodiment is used as described above, inputting of a row address can be performed even somewhere in the course of a read operation, which enables an effective data transfer rate to be kept extremely high.

A semiconductor memory device according to the present invention has a great advantage as compared with a prior art technique in which, though providing a scheme to theoretically enable an effective transfer rate to be high, a load on the control side is great to therefore make the maximum effect not exerted.

Furthermore, in the third embodiment, common sense amplifiers are used as storage places for saved data, therefore exerting effects of less increase in layout area and restriction of demerit in an aspect of production cost to the lowest level.

The semiconductor memory device of the third embodiment has almost no increase in chip area that would be caused by addition of circuitry; therefore, no advantage arises in a cost aspect even if being used as standard DRAM. With proper means determining a specific command so as to validate a function described in the third embodiment applied, the semiconductor memory device of the third embodiment can operate as a normal SDRAM in a general system.

Moreover, a standard memory can also be selectively fabricated together on the same chip. The following techniques for selective fabrication can be thought as useful: programming with options among metal interconnects, with a laser trimmer or the like means in a wafer process, and operation switching using fixing of potentials on an internal pad or a specific terminal, or other means in an assembly step.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a first memory cell array including a group of plural first memory cells arranged in a matrix, a first bit line pair, and a group of first word lines provided so as to intersect with said first bit line pair;

a second memory cell array including a group of plural second memory cells arranged in a matrix, a second bit line pair, and a group of second word lines provided so as to intersect with said second bit line pair;

a sense amplifier band including a sense amplifier shared by said first and second bit line pairs; and a control circuit controlling initialization of said sense amplifier, initialization of said first and second bit line pairs and activation of said groups of first and second word lines, wherein said control circuit, in response to a first command, not only outputs a timing signal changing an inactive state of one word line of said groups of first and second word lines to an active state thereof, but also cancels initialization of said first and second bit line pairs and initializes said sense amplifier for a prescribed period.

2. The semiconductor memory device according to claim 1, wherein after one word line included in said groups of first and second word lines changes from an inactive state thereof to an active state thereof and data from said groups of first and second memory cells is read out into said sense amplifier, said control circuit maintains an active state of said sense amplifier till one word line included in said groups of first and second word lines changes from an inactive state thereof to an active state in the next time, and said sense amplifier holds said read-out data till one word line included in said groups of first and second word lines changes from an inactive state thereof to an active state in the next time.

3. The semiconductor memory device according to claim 1, wherein said sense amplifier band further includes:
a first bit line equalize circuit initializing potentials of said first bit line pair;
a second bit line equalize circuit initializing potentials of said second bit line pair;
a shared bit line pair on which a potential difference is amplified by said sense amplifier;
a sense amplifier equalize circuit initializing potentials on said shared bit line pair;
a first isolation gate circuit switching between a state where said first bit line pair and said shared bit line pair are connected to each other, and a state where said first bit line pair and said shared bit line pair are isolated from each other;
a second isolation gate circuit switching between a state where said second bit line pair and said shared bit line pair are connected to each other, and a state where said second bit line pair and said shared bit line pair are isolated from each other,
said semiconductor memory device further comprises a row decode circuit selecting a word line in response to an address signal from said groups of first and second word lines, and
said control circuit not only deactivates said row decode circuit, but also activates said first and second bit line equalize circuits, and not only activates said row decode circuit, but also activates said sense amplifier equalize circuit temporarily for said prescribed period.

4. The semiconductor memory device according to claim 3, wherein
said sense amplifier band further includes
a connection gate circuit connecting said shared bit line pair to an input/output line pair, and
said control circuit performs a first operation activating said connection gate circuit in response to a read instruction from outside after activating said row decode circuit and a second operation activating said connection gate circuit without activating said row decode circuit in order to output data read out already in said amplifier band.

5. The semiconductor memory device according to claim 4, wherein
said control circuit receives an instruction as to whether to perform said first operation or said second operation from outside.

6. The semiconductor memory device according to claim 4, further comprising
an address comparing section temporarily holding an address given externally as an old address to compare said old address with an address given externally later, wherein
said control circuit receives an instruction as to whether to perform said first operation or said second operation from said address comparing section.

7. A semiconductor memory device comprising:
a first memory block, said first memory block including
a first memory cell array including a group of plural first memory cells arranged in a matrix, a first bit line pair, and a group of first word lines provided so as to intersect with said first bit line pair,
a second memory cell array including a group of plural second memory cells arranged in a matrix, a second bit line pair, and a group of second word lines provided so as to intersect with said second bit line pair, and a first sense amplifier band including a first sense amplifier shared by said first and second bit line pairs;
a second memory block, said second memory block including
a third memory cell array including a group of plural third memory cells arranged in a matrix, a third bit line pair, and a group of third word lines provided so as to intersect with said third bit line pair,
a fourth memory cell array including a group of plural fourth memory cells arranged in a matrix, a fourth bit line pair, and a group of fourth word lines provided so as to intersect with said fourth bit line pair, and
a second sense amplifier band including a second sense amplifier shared by said third and fourth bit line pairs;
a switch circuit provided between said first and second memory blocks and connecting said second bit line pair to said third bit line pair; and
a control circuit controlling said first and second sense amplifiers and said switch circuit to cause data to transfer between said first and second sense amplifiers.

8. The semiconductor memory device according to claim 7, wherein
said control circuit, in response to a first command, not only outputs a timing signal changing an inactive state of one selected word line of said groups of first to fourth word lines to an active state thereof, but also cancels initialization of a bit line pair of said first to fourth bit line pairs, corresponding to said one selected word line, and initializes a sense amplifier of said first and second sense amplifiers, corresponding to said selected one word line, for a prescribed period.

9. The semiconductor memory device according to claim 7, wherein
after one selected word line included in one selected group of word lines of said groups of first to fourth word lines changes from an inactive state thereof to an active state thereof and data is read out into a sense amplifier of said first and second sense amplifiers, corresponding to said one selected group of word lines, said control circuit maintains an active state of said corresponding sense amplifier till one word line included in said selected one group of word lines changes from an inactive state thereof to an active state in the next time, and
said corresponding sense amplifier holds said read-out data in said active state.

10. The semiconductor memory device according to claim 9, wherein
said control circuit, when said data is read out into said corresponding sense amplifier, transfers said data held in said corresponding sense amplifier to the other sense amplifier of said first and second sense amplifier different from said corresponding sense amplifier.

11. The semiconductor memory device according to claim 10, wherein
when a second command activating one word line belonging to said selected group of word lines is given successively to said first command, said control circuit not only activates a word line corresponding to said second command, but performs a read operation corresponding to said first command by reading said data held in said other sense amplifier.

* * * * *

UNITED STATES PATENT AND TRADEMARK OFFICE
CERTIFICATE OF CORRECTION

PATENT NO.    : 6,717,879 B2
DATED         : April 6, 2004
INVENTOR(S)   : Shinji Tanaka It is certified that error appears in the above-identified patent and that said Letters Patent is hereby corrected as shown below:

Delete title page and substitute therefor the attached title page.

Delete columns 1-34 and substitute the attached columns 1-32.

Signed and Sealed this

Twenty-eighth Day of February, 2006

JON W. DUDAS
*Director of the United States Patent and Trademark Office*

(12) United States Patent
Tanaka

(10) Patent No.: US 6,717,879 B2
(45) Date of Patent: Apr. 6, 2004

(54) SEMICONDUCTOR MEMORY DEVICE REQUIRING REFRESH OPERATION

(75) Inventor: Shinji Tanaka, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/369,506

(22) Filed: Feb. 21, 2003

(65) Prior Publication Data
US 2004/0047221 A1 Mar. 11, 2004

(30) Foreign Application Priority Data
Sep. 6, 2002 (JP) .................................. 2002-261343

(51) Int. Cl.⁷ .................................................. G11C 7/00
(52) U.S. Cl. .................... 365/222; 365/233; 365/230.03
(58) Field of Search .............................. 365/222, 203, 365/230.03, 230.06, 230.08, 189.01

(56) References Cited

U.S. PATENT DOCUMENTS 5,627,791 A  * 5/1997 Wright et al. ............... 365/222
5,901,101 A  * 5/1999 Suzuki et al. ............... 365/222
6,137,743 A  * 10/2000 Kim .......................... 365/222
6,636,449 B2 * 10/2003 Matsuzaki ................... 365/222

FOREIGN PATENT DOCUMENTS

JP    7-64864    3/1995
JP    7-211061   8/1995

OTHER PUBLICATIONS

U.S. Appl. No. 10/223,000, filed Aug. 19, 2002, Tanaka.

* cited by examiner

*Primary Examiner*—Gene Auduong
(74) *Attorney, Agent, or Firm*—McDermott, Will & Emery

(57) ABSTRACT

A sense amplifier band arranged between two memory cell arrays includes sense amplifiers, and spare memory cells usable as backup spare memory cells for memory cells included in the memory cell arrays. Using the spare memory cells, a refresh operation is executed while being divided into two stages. Namely, refresh target data read to sense amplifiers is temporarily stored in one of the spare memory cells, read again and written to the original memory cell. As a result, high rate operation is realized at low cost and area penalty is small.

13 Claims, 18 Drawing Sheets

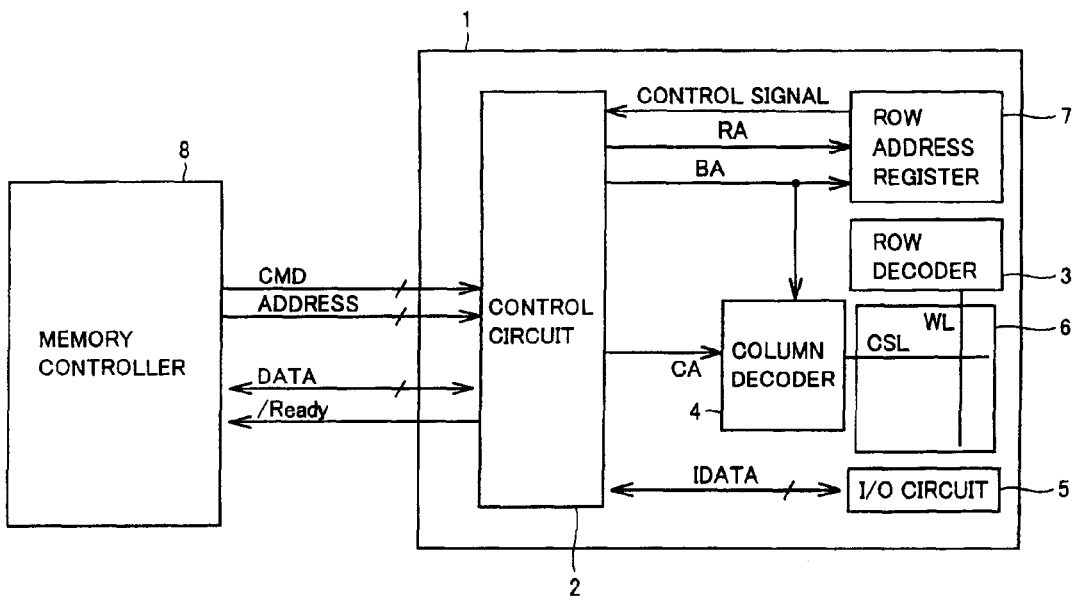

SEMICONDUCTOR MEMORY DEVICE REQUIRING REFRESH OPERATION

BACKGROUND OF THE INVENTION

1. Field of the Invention

The present invention relates to a semiconductor memory device, and more particularly to a semiconductor memory device which requires a refresh operation.

2. Description of the Background Art

A DRAM (Dynamic Random Access Memory) which is a typical semiconductor memory device, has memory cells each of which consists of one transistor and one capacitor and which has a simple structure itself. Due to this, the DRAMs are utilized in various types of systems as memories optimum for realizing the high integration and mass storage of a semiconductor device. Various types of the DRAMs have been developed so far, depending on the performances, purposes, scales and the like of the systems to which the respective DRAMs are utilized.

Recently, as a semiconductor memory device used in a computer, a synchronous dynamic random access memory (SDRAM) has been mainly employed. The SDRAM reads data by a combination of an activation command (ACT command) to activate a word line and a read command (RD command) to read a value stored in a sense amplifier. The SDRAM performs burst operation for continuously outputting data at a plurality of column addresses. Due to this, if the RD commands are continuously inputted for the same word line, the SDRAM can perform high rate operation.

Further, a pseudo SRAM (Static Random Access Memory) is sometimes used in a small-sized system. Although the pseudo SRAM is basically equal to the DRAM, it is unnecessary to input addresses in a multiplexed manner and to perform refresh operation. Therefore, the pseudo SRAM can be controlled by a system which utilizes the pseudo SRAM as an SRAM.

Meanwhile, the SRAM which is one of typical semiconductor memory devices besides the DRAM is a RAM which does not require refresh operation which is essential to the DRAM. Because of no need to perform the refresh operation, the power consumption of the SRAM is low. In addition, since the refresh operation is unnecessary, the SRAM is expected to perform high rate operation. In the normal SRAM, however, time required since the designation of an address until data is outputted to the outside of the SRAM is not so short.

Therefore, there is known a pipeline burst SRAM (PBSRAM) as the SRAM which can perform high rate operation. The PBSRAM enables pipeline operation which cannot be performed by the conventional ordinary SRAM. This pipeline operation enables the PBSRAM to perform higher rate than the conventional SRAM.

The DRAMs including the above-described SDRAMs have memory cells each of which consists of one transistor and one capacitor and which has a simple structure. Due to this, the DRAMs are optimum for the realization of the high integration and mass storage of a semiconductor device. Despite such advantages, it is normally said that the DRAM is unsuited for high rate operation.

That is, in a memory cell of the DRAM, the charges of the capacitor which correspond to stored data are leaked and gradually lost due to various factors. Namely, the stored data is lost with the passage of time. For this reason, refresh operation for temporarily reading and writing the stored data before the stored data is lost is indispensable to the DRAM. During this refresh operation, the DRAM is unable to receive an external control command, with the result that wait time for the reception of the control command generates. If a batch refresh operation is executed simultaneously to all memory cells, a period in which the external control command is not received, is elongated. Due to this, the refresh operation is normally executed for each word line.

Nevertheless, a refresh operation consists of a series of operations including that for precharging a bit line pair, reading data to the bit line pair, amplifying the data by a sense amplifier, and writing the data. These series of operations are continuously performed during the conventional refresh operation. Due to this, even if the refresh operation is executed for each word line, the external command cannot be received during the refresh operation, with the result that wait time, which cannot be ignored so as to further accelerate operation rate, disadvantageously generates.

Furthermore, as described above, according to the conventional SDRAM, the burst operation can accelerate the operation rate despite the disadvantage of the refresh operation described above. However, in order to enable this burst operation, it is necessary that the system which utilizes the SDRAM recognizes that a corresponding word line is already activated or the other word lines are not activated. In other words, the conventional SDRAM is required to make the external system to manage the row addresses of the SDRAM. This row address management is normally difficult, which disadvantageously increases the control load of the system according to the conventional SDRAM.

On the other hand, although the above-described pseudo SRAM does not require the refresh operation, it is unable to perform burst operation, with the result that high rate operation cannot be realized.

Further, the PBSRAM can realize high rate operation while utilizing the advantage of the SRAM that refresh operation is unnecessary. However, since each memory cell of the SRAM includes a plurality of bulk transistors, the memory cell is made large in size. Normally, each memory cell of the SRAM includes four or six bulk transistors. Due to this, compared with the DRAM which includes memory cells each consisting of one transistor and one capacitor, the area of memory cells is considerably large. As a result, the PBSRAM has the same disadvantage as the conventional SRAM in that sufficient storage capacity cannot be ensured. Besides, the cost of the SRAM per bit is higher than that of the DRAM and PBSRAM further includes the pipeline function which the ordinary SRAM cannot include, with the result that the cost of the PBSRAM is disadvantageously high.

SUMMARY OF THE INVENTION

The present invention has been made to solve these disadvantages. It is an object of the present invention to provide a semiconductor memory device capable of performing a high rate operation at low cost and capable of suppressing area penalty.

It is another object of the present invention to provide a semiconductor memory device which does not require row address management and which simplifies the use by a system.

According to the present invention, a semiconductor memory device which requires refresh operation, includes: a memory block; and a control circuit controlling an operation of the semiconductor memory device, wherein the memory block includes: a memory cell array including a plurality of memory cells; a plurality of word lines; a plurality of bit lines; and a sense amplifier band connected to the memory cell array through the plurality of bit line pairs, the sense amplifier band includes: a plurality of sense amplifiers provided to correspond to the plurality of bit line pairs; and a data holding circuit holding data read by the sense amplifiers, and the control circuit executes the refresh operation while dividing the refresh operation into a first operation for holding the data read to the plurality of sense amplifiers from a refresh target memory cell in the data holding circuit, and a second operation for reading the data held in the data holding circuit to the plurality of sense amplifiers, and writing the read data to the refresh target memory cell.

Therefore, according to the present invention, a period in which an external command cannot be received during the refresh operation is shortened, and operation delay caused by the refresh operation is shortened, whereby the high rate operation of the semiconductor memory device is achieved. In addition, since each memory cell is the same in configuration to that of the conventional DRAM, cost increase can be held down and a mass storage memory can be realized. Besides, since the spare memory cell can be used as the data holding circuit, it is unnecessary to provide a new circuit and area penalty can be thereby suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

Figure 21:
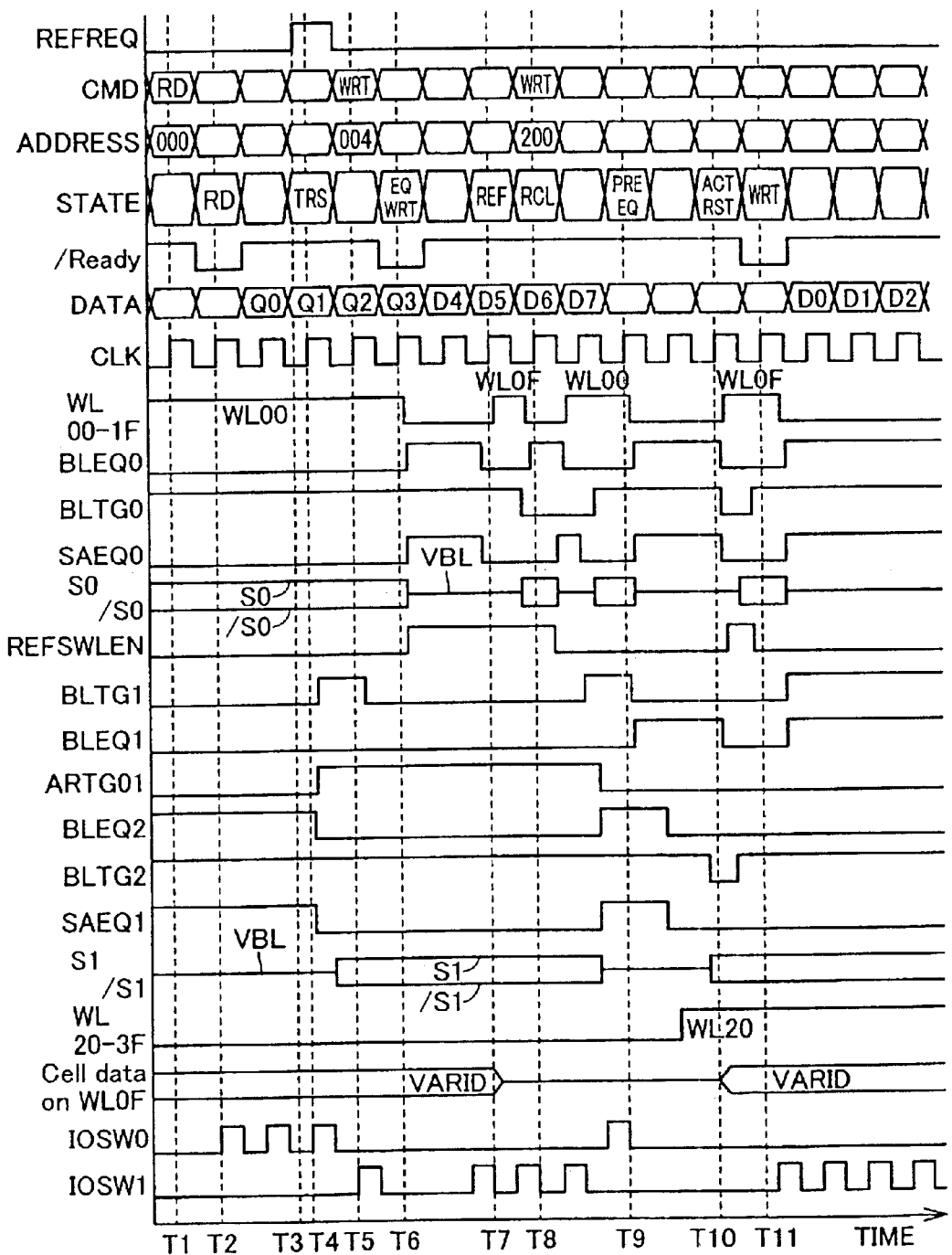
FIG. 21 is a circuit diagram showing a configuration in the neighborhood of a sense amplifier band of a prior art SDRAM.

FIG. 1 is a schematic block diagram showing the overall configuration of a semiconductor memory device according to a first embodiment of the present invention;

FIG. 2 is a schematic view showing the array arrangement of a memory cell array shown in FIG. 1;

FIG. 3 is a circuit diagram showing the configuration of the periphery of a sense amplifier band of the semiconductor memory device according to the first embodiment;

FIG. 4 is a first circuit diagram showing the configuration of a control circuit shown in FIG. 1;

FIG. 5 is a second circuit diagram showing the configuration of a control circuit shown in FIG. 1;

FIG. 6 is a third circuit diagram showing the configuration of a control circuit shown in FIG. 1;

FIG. 7 is a fourth circuit diagram showing the configuration of a control circuit shown in FIG. 1;

FIG. 8 is a fifth circuit diagram showing the configuration of a control circuit shown in FIG. 1;

FIG. 9 is a functional block diagram of a row address register shown in FIG. 1;

FIG. 10 is a circuit diagram showing the configuration of a register array shown in FIG. 9;

FIG. 11 is a circuit diagram showing the configuration of a spare decoder shown in FIG. 9;

FIG. 12 is an operation waveform view for describing the operation of the semiconductor memory device according to the first embodiment;

FIG. 13 is a schematic block diagram showing the overall configuration of a semiconductor memory device according to a second embodiment of the present invention;

FIG. 14 is a circuit diagram showing the configuration of the periphery of a sense amplifier band included in a memory cell array shown in FIG. 13;

FIG. 15 is a first circuit diagram showing the configuration of a control circuit shown in FIG. 13;

FIG. 16 is a second circuit diagram showing the configuration of a control circuit shown in FIG. 13;

FIG. 17 is a third circuit diagram showing the configuration of a control circuit shown in FIG. 13;

FIG. 18 is a fourth circuit diagram showing the configuration of a control circuit shown in FIG. 13;

FIG. 19 is a functional block diagram of a row address register shown in FIG. 13;

FIG. 20 is a circuit diagram showing the configuration of a spare decoder shown in FIG. 19; and FIG. 21 is an operation waveform view for describing the operation of the semiconductor memory device according to the second embodiment.

DESCRIPTION OF THE PREFERRED EMBODIMENTS

Hereinafter, embodiments of the present invention will be described in detail with reference to the drawings. It is noted that the same or corresponding constituent elements are denoted by the same reference symbols, respectively and will not be repeatedly described.

First Embodiment

FIG. 1 is a schematic block diagram showing the overall configuration of a semiconductor memory device according to the first embodiment of the present invention.

Referring to FIG. 1, a semiconductor memory device 1 includes a control circuit 2, a row decoder 3, a column decoder 4, an input/output circuit 5, a memory cell array 6, and a row address register 7.

Control circuit 2 receives a command CMD and an address signal ADDRESS from an external memory controller 8. Control circuit 2 outputs a row address signal RA and a column address signal CA to row address register 7 and column decoder 4, respectively, based on address signal ADDRESS, and outputs a bank address signal BA to row address register 7 and column decoder 4.

Further, if receiving command CMD and address signal ADDRESS from memory controller 8, control circuit 2 transmits and receives data DATA to and from memory controller 8. In addition, control circuit 2 transmits and receives internal data IDATA corresponding to data DATA to and from input/output circuit 5, whereby data is read and written from and to memory cell array 6.

Moreover, control circuit 2 receives a control signal related to a row address, from row address register 7, and controls the operations of the respective circuits based on the control signal. This control signal and the operation of control circuit 2 will be described later in detail. Control circuit 2 outputs a signal /Ready, which indicates the input/output timing of data DATA which differs according to the state of the row address designated by memory controller 8, to memory controller 8.

Row decoder 3 and column decoder 4 receive row address signal RA and column address signal CA from control circuit 2, decode them, and select a word line WL and a column select line CSL corresponding to row address signal RA and column address signal CA, respectively.

Input/output circuit 5 transmits and receives internal data IDATA to and from control circuit 2, and inputs and outputs data to and from memory cell array 6.

Memory cell array 6 is a group of storage elements with memory cells arranged in a matrix. Memory cell array 6 is divided into a plurality of banks which can operate independently of one another, and one of the banks is selected by bank address signal BA included in address signal ADDRESS. For the convenience of description, the bank address is sometimes omitted in the following description. Unless described otherwise, a case where a command is issued only to a bank 0 will be described.

Row address register 7 temporarily stores row address signal RA designated by memory controller 8. Thereafter, if receiving row address signal RA, row address register 7 compares received row address signal RA with stored row address signal RA, and outputs the comparison result to control circuit 2. In addition, row address register 7 manages the operation of a spare word line SWL to which a spare memory cell used as a temporary data storage circuit in memory cell array 6 is connected. The configuration and operation of row address register 7 will be described later in detail.

FIG. 2 is a schematic view showing the array arrangement of memory cell array 6 shown in FIG. 1. As already described above, although memory cell array 6 is divided into a plurality of banks, only the array configuration for one bank 0 is shown in FIG. 2.

Referring to FIG. 2, memory cell array 6 includes memory blocks BLOCK0 to BLOCK3. Memory block BLOCK0 includes a sense amplifier band SAB#0, and memory cell arrays MA#00 and MA#01 which are arranged on the both sides of sense amplifier band SAB#0, respectively and which share sense amplifier band SAB#0. Memory block BLOCK1 includes a sense amplifier band SAB#1, and memory cell arrays MA#10 and MA#11 which are arranged on the both sides of sense amplifier band SAB#1, respectively, and which share sense amplifier band SAB#1.

Memory block BLOCK2 includes a sense amplifier band SAB#2, and memory cell arrays MA#20 and MA#21 which are arranged on the both sides of sense amplifier band SAB#2, respectively, and which share sense amplifier band SAB#2. Memory block BLOCK3 includes a sense amplifier band SAB#3, and memory cell arrays MA#30 and MA#31 which are arranged on the both sides of sense amplifier band SAB#3, respectively, and which share sense amplifier band SAB#3.

Row decoder 3 includes row decoders RD#00 to RD#31 which are provided to correspond to memory cell arrays MA#00 to MA#31, respectively. Row decoder RD#00 controls word lines WL00 to WL0F, and row decoders RD#01 controls word lines WL10 to WL1F. Row decoder RD#10 controls word lines WL20 to WL2F, and row decoders RD#11 controls word lines WL30 to WL3F. Row decoder RD#20 controls word lines WL40 to WL4F, and row decoders RD#21 controls word lines WL50 to WL5F. Row decoder RD#30 controls word lines WL60 to WL6F, and row decoders RD#31 controls word lines WL70 to WL7F.

Namely, each of memory cell arrays MA#00 to MA#31 includes 16 word lines discriminated by row address signals RA0 to RA3. In one memory block, there are left and right divided memory cell arrays with the sense amplifier band arranged at the center, and one of the memory cell arrays is designated by a row address signal RA4. One of four memory blocks BLOCK0 to BLOCK3 is designated by row address signals RA5 and RA6. Further, connection gate circuits G#0 to G#3 which connect local IO lines LIO, /LIO to global IO lines GIO, /GIO, are provided in respective memory blocks BLOCK0 to BLOCK3.

Although not shown in FIG. 2, it is assumed that 16 column addresses designated by column address signals CA0 to CA3 are provided. Column select lines CSL0 to CSLF (not shown) orthogonal to the word lines are provided to be common to the memory cell arrays shown in FIG. 2.

FIG. 3 is a circuit diagram showing the configuration of the periphery of the sense amplifier band of semiconductor memory device 1 according to the first embodiment.

Referring to FIG. 3, memory cell array MA#00 includes a memory cell Cell00 which is provided to correspond to the intersection between word line WL00 and a bit line BL00, a memory cell Cell10 which is provided to correspond to the intersection between word line WL01 and a bit line /BL00, a memory cell Cell01 which is provided to correspond to the intersection between word line WL00 and a bit line BL01, and a memory cell Cell11 which is provided to correspond to the intersection between word line WL01 and a bit line /BL01.

In FIG. 3, only the four memory cells included in memory cell arrays MA#00 are shown for brevity. Actually, 256 memory cells are included in memory cell array MA#00 to correspond to word lines WL00 to WL0F and bit line pairs BL00, /BL00 to BL0F, /BL0F. In the following, the description will be made in the range as shown in FIG. 3.

Memory cell Cell00 includes a capacitor 16 which has one end connected to a cell plate potential Vcp, and an N-channel MOS transistor 18 which is connected between the other end of capacitor 16 and bit line BL00 and which has a gate connected to word line WL00. Since the configurations of memory cells Cell01, Cell10 and Cell11 are the same as that of memory cell Cell00, they will not be repeatedly described herein.

Further, since the configuration of memory cell array MA#01 is the same as that of memory cell array MA#00, it will not be repeatedly described herein.

Sense amplifier band SAB#0 includes: a sense amplifier 62; and equalization circuits 20, 22 and 24, separation gate circuits 60 and 66, a connection circuit 64, and spare memory cells SCell00, SCell10, SCell20, SCell30, SCell40 and SCell50 which are provided to correspond to sense amplifier 62.

Sense amplifier 62 is provided to correspond to bit line pair BL0, /BL0, and shared among bit line pair BL00, /BL00 connected to memory cell array MA#00 and bit line pair BL10, /BL10 connected to memory cell array MA#01. As can be seen, sense amplifier band SAB#0 has a shared sense amplifier configuration in which two bit line pairs are provided on the both sides of each sense amplifier, respectively, so as to reduce the layout area of the sense amplifiers.

Sense amplifier 62 is controlled by control signals S0, /S0. Since the sense amplifiers are controlled independently for each memory block, a drive signal for driving the sense amplifiers included in sense amplifier band SAB#0 of memory block BLOCK0 is denoted by S0. For example, a drive signal for driving the sense amplifiers included in sense amplifier band SAB#1 of memory block BLOCK1 is denoted by S1.

Equalization circuit 22 includes N-channel MOS transistors 34 to 36. N-channel MOS transistor 34 is connected between bit lines BL0 and /BL0 and the gate thereof receives a signal SAEQ0. N-channel MOS transistor 35 is connected between a node applied with a potential VBL and bit line BL0 and the gate thereof receives signal SAEQ0. N-channel MOS transistor 36 is connected between a node applied with potential VBL and bit line /BL0 and the gate thereof receives signal SAEQ0.

If signal SAEQ0 is activated, equalization circuit 22 equalizes bit line pair BL0, /BL0, which are directly connected to sense amplifier 62, to potential VBL, and initializes sense amplifier 62.

Separation gate circuit 60 includes N-channel MOS transistors 30 and 31. N-channel MOS transistor 30 is connected between bit lines BL0 and BL00, and the gate thereof receives a signal BLTG0. N-channel MOS transistor 31 is connected between bit lines /BL0 and /BL00, and the gate thereof receives signal BLTG0.

If signal BLTG0 is deactivated, separation gate circuit 60 electrically separates bit line BL0 from bit line BL00 and bit line /BL0 from bit line /BL00.

Separation gate circuit 66 includes N-channel MOS transistors 40 and 41. N-channel MOS transistor 40 is connected between bit lines BL0 and BL10, and the gate thereof receives a signal BLTG1. N-channel MOS transistor 41 is connected between bit lines /BL0 and /BL10, and the gate thereof receives signal BLTG1.

If signal BLTG1 is deactivated, separation gate circuit 66 electrically separates bit line BL0 from bit line BL10 and bit line /BL0 from bit line /BL10.

Connection circuit 64 includes N-channel MOS transistors 50 and 51. N-channel MOS transistor 50 is connected between a local IO line LIO0 and bit line BL0, and the gate thereof is connected to column select line CSL0. N-channel MOS transistor 51 is connected between a local IO line /LIO0 and bit line /BL0, and the gate thereof is connected to column select line CSL0.

If column select line CSL0 is activated, connection circuit 64 electrically connects bit line BL0 to local IO line LIO0, and bit line /BL0 to local IO line /LIO0.

Although equalization circuits 20 and 24 differ from equalization circuit 22 in that they receive signals BLEQ0 and BLEQ1 instead of signal SAEQ0, respectively, they are the same in configuration to equalization circuit 22 and will not be, therefore, repeatedly described herein. It is noted, however, that bit line pair BL0, /BL0 equalized by equalization circuit 22 are smaller in capacity than bit lines BL00, /BL00 and BL10, /BL10 to which memory cell arrays are connected. Due to this, the three transistors included in equalization circuit 22 are smaller in size than those included in equalization circuits 20 and 24.

Spare memory cell SCell00 is provided to correspond to the intersection between a spare word line SWL00 and bit line BL0, and spare memory cell SCell10 is provided to correspond to the intersection between a spare word line SWL01 and bit line /BL0. Spare memory cell SCell20 is provided to correspond to the intersection between a spare word line SWL02 and bit line BL0, and spare memory cell SCell30 is provided to correspond to the intersection between a spare word line SWL03 and bit line /BL0. Spare memory cell SCell40 is provided to correspond to the intersection between a spare word line SWL04 and bit line BL0, and spare memory cell SCell50 is provided to correspond to the intersection between a spare word line SWL05 and bit line /BL0.

Since the configurations of respective spare memory cells SCell00 to SCell50 are the same as that of memory cell Cell00, they will not be repeatedly described herein.

Spare memory cells SCell00 to SCell50 are used as spare cells for the memory cells included in memory cell arrays MA#00 and MA#01, and also used as data holding circuits which temporarily hold the data read to sense amplifier 62. Since spare memory cells SCell00 to SCell50 are arranged closer to sense amplifier 62 than memory cells Cell00 and Cell10, data is written and read to and from sense amplifier 62 at high rate.

Sense amplifier band SAB#0 also includes: a sense amplifier 63; and equalization circuits 21, 23 and 25, separation gate circuits 61 and 67, a connection circuit 65, and spare memory cells SCell01, SCell11, SCell21, SCell31, SCell41 and SCell51 which are provided to correspond to sense amplifier 63.

Sense amplifier 63 is provided to correspond to bit line pair BL1, /BL1, and shared among bit line pair BL01, /BL01 connected to memory cell array MA#00 and bit line pair BL11, /BL11 connected to memory cell array MA#01. Similarly to sense amplifier 62, sense amplifier 63 is controlled by control signals S0, /S0.

Equalization circuit 23 includes N-channel MOS transistors 37 to 39. N-channel MOS transistor 37 is connected between bit lines BL1 and /BL1 and the gate thereof receives signal SAEQ0. N-channel MOS transistor 38 is connected between a node applied with potential VBL and bit line BL1 and the gate thereof receives signal SAEQ0. N-channel MOS transistor 39 is connected between a node applied with potential VBL and bit line /BL1 and the gate thereof receives signal SAEQ0.

If signal SAEQ0 is activated, equalization circuit 23 equalizes bit line pair BL1, /BL1, which are directly connected to sense amplifier 63, to potential VBL, and initializes sense amplifier 63.

Separation gate circuit 61 includes N-channel MOS transistors 32 and 33. N-channel MOS transistor 32 is connected between bit lines BL1 and BL01, and the gate thereof receives signal BLTG0. N-channel MOS transistor 33 is connected between bit lines /BL1 and /BL01, and the gate thereof receives signal BLTG0.

If signal BLTG0 is deactivated, separation gate circuit 61 electrically separates bit line BL1 from bit line BL01 and bit line /BL1 from bit line /BL01.

Separation gate circuit 67 includes N-channel MOS transistors 42 and 43. N-channel MOS transistor 42 is connected between bit lines BL1 and BL11, and the gate thereof receives signal BLTG1. N-channel MOS transistor 43 is connected between bit lines /BL1 and /BL11, and the gate thereof receives signal BLTG1.

If signal BLTG1 is deactivated, separation gate circuit 67 electrically separates bit line BL1 from bit line BL11 and bit line /BL1 from bit line /BL11.

Connection circuit 65 includes N-channel MOS transistors 52 and 53. N-channel MOS transistor 52 is connected between local IO line LIO0 and bit line BL1, and the gate thereof is connected to column select line CSL1. N-channel MOS transistor 53 is connected between local IO line /LIO0 and bit line /BL1, and the gate thereof is connected to column select line CSL1.

If column select line CSL1 is activated, connection circuit 65 electrically connects bit line BL1 to local IO line LIO0, and bit line /BL1 to local IO line /LIO0.

Although equalization circuits 21 and 25 differ from equalization circuit 23 in that they receive signals BLEQ0 and BLEQ1 instead of signal SAEQ0, respectively, they are the same in configuration to equalization circuit 23 and will not be, therefore, repeatedly described herein. It is noted, however, that bit line pair BL1, /BL1 equalized by equalization circuit 23 are smaller in capacity than bit lines BL01, /BL01 and BL11, /BL11 to which memory cell arrays are connected. Due to this, the three transistors included in equalization circuit 23 are smaller in size than those included in equalization circuits 21 and 25.

Spare memory cell SCell01 is provided to correspond to the intersection between spare word line SWL00 and bit line BL1, and spare memory cell SCell11 is provided to correspond to the intersection between spare word line SWL01 and bit line /BL1. Spare memory cell SCell21 is provided to correspond to the intersection between spare word line SWL02 and bit line BL1, and spare memory cell SCell31 is provided to correspond to the intersection between spare word line SWL03 and bit line /BL1. Spare memory cell SCell41 is provided to correspond to the intersection between spare word line SWL04 and bit line BL1, and spare memory cell SCell51 is provided to correspond to the intersection between spare word line SWL05 and bit line /BL1.

Since the configurations of respective spare memory cells SCell01 to SCell51 are the same as that of memory cell Cell00, they will not be repeatedly described herein.

Spare memory cells SCell01 to SCell51 are used as spare cells for the memory cells included in memory cell arrays MA#00 and MA#01, and also used as data holding circuits which temporarily hold the data read to sense amplifier 63. Since spare memory cells SCell01 to SCell51 are arranged closer to sense amplifier 63 than memory cells Cell01 and Cell11, data is written and read to and from sense amplifier 63 at high rate.

The data read to local IO lines LIO0, /LIO0 by the sense amplifiers is read to global data IO lines GIO, /GIO through a gate circuit G#0, and transmitted to input/output circuit 14. Gate circuit G#0 includes N-channel MOS transistors 11 and 12. N-channel MOS transistor 11 is connected between local IO line LIO0 and global IO line GIO, and the gate thereof receives a signal IOSW0. N-channel MOS transistor 12 is connected between local IO line /LIO0 and global IO line /GIO, and the gate thereof receives signal IOSW0.

FIGS. 4 to 8 are circuit diagrams showing the configuration of control circuit 2 shown in FIG. 1. For the convenience of description, FIGS. 4 to 8 only show sections corresponding to memory block BLOCK0 of bank 0 and the sections will be described without adding symbols corresponding to the bank and the memory block unless it is necessary to do so.

Referring to FIG. 4, control circuit 2 includes AND gates 502 to 512, an OR gate 514, a mode setting circuit 516, a control signal input buffer 518, and a NAND gate 520.

AND gate 502 operates synchronously with a clock signal CLK, performs an AND operation between an internal flag CMDflag and a chip select signal /CS received as command CMD from memory controller 8, and outputs the operation result as a signal NOP. It is noted that internal flag CMDflag is a signal which is set at H (logical high) level if control circuit 2 is in a state of receiving command CMD from memory controller 8. AND gate 504 operates synchronously with clock signal CLK, performs an AND operation among the inverted signal of chip select signal /CS, internal flag CMDflag, and a column address strobe signal /CAS and a write enable signal /WE received as command CMD from memory controller 8, and outputs the operation result to AND gate 510.

AND gate 506 operates synchronously with clock signal CLK, performs an AND operation among the inverted signal of chip select signal /CS, internal flag CMDflag, column address strobe signal /CAS, and the inverted signal of write enable signal /WE, and outputs the operation result to AND gate 512. AND gate 508 operates synchronously with clock signal CLK, performs an AND operation among the inverted signal of chip select signal /CS, internal flag CMDflag, the inverted signal of column address strobe signal /CAS, and the inverted signal of write enable signal /WE, and outputs the operation result to mode setting signal 516 as a mode select command MRSCMD.

AND gate 510 performs an AND operation between the inverted signal of a signal ALLDISABLE outputted from mode setting circuit 516 and the output signal of AND gate 504, and outputs the operation result as a read command RDCMD. AND gate 512 performs an AND operation between the inverted signal of signal ALLDISABLE and the output signal of AND gate 506, and outputs the operation result as a write command WRTCMD. OR gate 514 performs an OR operation between the output signals of AND gates 510 and 512, and outputs the operation result as an internal signal RAS.

Control signal input buffer 518 is activated if signal ALLDISABLE is at H level, receives chip select signal /CS, column address strobe signal /CAS, write enable signal /WE and row address strobe signal /RAS, and outputs various internal signals to enable semiconductor memory device 1 to function as a conventional SDRAM. Namely, if signal ALLDISABLE is at H level, read command RDCMD, write command WRTCMD and internal signal RAS are not generated, control signal input buffer 518 is activated and semiconductor memory device 1 functions as the conventional SDRAM.

Mode setting circuit 516 sets the mode of semiconductor memory device 1 in accordance with address signal ADDRESS received from memory controller 8 as a mode setting signal if mode select command MRSCMD is at H level. Mode setting circuit 516 outputs signals SWL__test, /Sparc__test, /REF__test and /RCL__test, a signal No__Delay, and signal ALLDISABLE in accordance with the mode set by mode setting circuit 516.

Signals SWL__test, /Spare__test, /REF__test and /RCL__test are test signals as will be described later. Signal No__Delay is a signal for advancing the generation of a read signal RD, to be described later, by one clock. Signal ALLDISABLE is a signal for allowing semiconductor memory device 1 to function as a conventional semiconductor memory device.

NAND gate 520 performs an AND operation between the inverted signal of signal ALLDISABLE and an internal signal Ready, inverts the operation result, and outputs a signal /Ready. If signal ALLDISABLE is at L level, the output signal of NAND gate 520 is outputted to external memory controller 8 through a terminal into which row address strobe signal /RAS is inputted when semiconductor memory device 1 functions as a conventional semiconductor memory device. That is, in semiconductor memory device 1, the output terminal for signal /Ready and the input terminal for row address strobe signal /RAS which is input when semiconductor memory device 1 functions as a conventional semiconductor memory device are shared.

Referring to FIG. 5, control circuit 2 also includes a NAND gate 522 which performs an AND operation between read command RDCMD and an internal signal HIT and which outputs the inverted signal of the operation result, and an inverter 524 which outputs the inverted signal of the output signal of NAND gate 522.

Further, control circuit 2 includes a NAND gate 526 which performs an AND operation between the output signal of inverter 524 and an internal flag RCLflag and which outputs the inverted signal of the operation result, an inverter 528 which inverts the output signal of NAND gate 526 and which outputs a recall signal RCL, and a delay circuit 530 which delays the output signal of inverter 528 by one clock and which outputs read signal RD.

Furthermore, control circuit 2 includes a NAND gate 532 which performs an AND operation between the output signal of inverter 524 and internal flag RCLflag and which outputs the inverted signal of the operation result, an inverter 534 which outputs the inverted signal of the output signal of NAND gate 532, a delay circuit 536 which delays the output signal of inverter 534 by one clock and outputs read signal RD, and an AND gate 538 which performs an AND operation between the output signal of inverter 534 and signal No_Delay and which outputs the operation result as read signal RD.

Further, control circuit 2 includes a NAND gate 540 which performs an AND operation between the inverted signal of internal signal HIT and read command RDCMD and which outputs the inverted signal of the operation result, and an inverter 542 which outputs the inverted signal of the output signal of NAND gate 540.

Control circuit 2 also includes a NAND gate 544 which performs an AND operation between the inverted signal of signal BLEQ and the output signal of inverter 542 and which outputs the inverted signal of the operation result, an inverter 546 which inverts the output signal of NAND gate 544 and which outputs a precharge signal PRE, a delay circuit 548 which delays the output signal of inverter 546 by two clocks and which outputs an activation signal ACT, a NAND gate 552 which performs an AND operation between the output signal of inverter 542 and signal BLEQ and which outputs the inverted signal of the operation result, an inverter 554 which inverts the output signal of NAND gate 552 and outputs activation signal ACT, and a delay circuit 550 which delays activation signal ACT by two clocks and which outputs read signal RD.

Further, control circuit 2 includes an inverter 556 which operates synchronously with a clock signal /CLK complementary to clock signal CLK, which inverts read signal RD and which outputs signal Ready, an inverter 558 which operates synchronously with clock signal CLK and which outputs the inverted signal of the output signal of inverter 556, and a delay circuit 560 which outputs a signal delayed from the output signal of inverter 558 by one clock.

Moreover, control circuit 2 includes a NAND gate 562 which performs an AND operation between the output signal of delay circuit 560 and an internal flag REFflag and which outputs the inverted signal of the operation result, an inverter 564 which inverts the output signal of NAND gate 562 and which outputs a refresh signal REF, and a delay circuit 566 which delays the output signal of inverter 564 by three clocks and which outputs an internal signal CMDEN.

Further, control circuit 2 includes a NAND gate 568 which performs an AND operation between the output signal of delay circuit 560 and internal flag REFflag and which outputs the inverted signal of the operation result, an inverter 570 which outputs the inverted signal of the output signal of NAND gate 568, and a delay circuit 572 which outputs a signal delayed from the output signal of inverter 570 by one clock.

Control circuit 2 also includes a NAND gate 574 which performs an AND operation between the output signal of delay circuit 572 and an internal flag RSTflag and which outputs the inverted signal of the operation result, an inverter 576 which inverts the output signal of NAND gate 574 and which outputs a restore signal RST, and a delay circuit 578 which delays the output signal of inverter 576 by two clocks and which outputs internal signal CMDEN.

Furthermore, control circuit 2 includes a NAND gate 580 which performs an AND operation between the output signal of delay circuit 572 and the inverted signal of internal flag RSTflag and which outputs the inverted signal of the operation result, an inverter 582 which outputs the inverted signal of the output signal of NAND gate 580, and a delay circuit 584 which delays the output signal of inverter 582 by two clocks and which outputs internal signal CMDEN.

Internal signal HIT is a signal which is outputted from row address register 7 shown in FIG. 1, and the level of which becomes H level when a word line corresponding to the row address designated by address signal ADDRESS applied from memory controller 8 is already selected. The configuration of row address register 7 will be described later in detail.

Recall signal RCL is a signal which indicates a recall operation. The recall operation means an operation for reading the data temporarily held in the spare memory cell used as a data holding circuit again to the sense amplifier.

Read signal RD is a signal which indicates the output of the data read to the sense amplifier to the outside. If read signal RD is at H level, signal Ready is set at L (logical low) a half clock later, and H-level signal /Ready is outputted to memory controller 8. Thus, memory controller 8 can recognize data output timing. After the level of signal /Ready becomes H level, data DATA is outputted to memory controller 8.

Precharge signal PRE is a signal which indicates a precharge operation for a bit line pair. Activation signal ACT is a signal which activates a word line corresponding to the designated row address.

Refresh signal REF is a signal which indicates a refresh operation. In semiconductor memory device 1 according to the first embodiment, the refresh operation is executed in two stages. Namely, if the execution of a refresh operation is indicated, data is read from a refresh target memory cell to the sense amplifier and amplified by the sense amplifier, the amplified data is temporarily stored in the spare memory cell connected to a spare word line designated in advance, and the refresh operation is finished in the first stage. In the second stage, a restore operation to be described later is executed, the data temporarily stored in the spare memory cell is read to the sense amplifier and written to the original memory cell.

The refresh operation is executed in two stages for the following reason. Semiconductor memory device 1 is unable to receive command CMD during a refresh operation which consists of a series of operations for precharging a bit line, reading data, amplifying the data by the sense amplifier, and writing the data to the original memory cell. This generates wait time, in which no command is received, for the outside of semiconductor memory device 1. Therefore, the refresh operation is divided into two stages so that the wait time caused by the refresh operation is reduced.

Further, since the spare memory cell arranged in proximity to the sense amplifier is used as a temporary data holding circuit, data can be read and written from and to the spare memory cell at high rate. Besides, since it is unnecessary to provide a new data holding circuit near the sense amplifier, it is possible to hold down area penalty.

Restore signal RST is a signal which indicates a restore operation. The restore operation means an operation for writing the data temporarily held in the spare memory cell, again to the original memory cell by refresh signal REF.

Signal BLEQ inputted into NAND gates 544 and 552 is a signal for equalizing a bit line pair connected to the memory cell array. Signal BLEQ is set at H level by precharge signal PRE of the corresponding memory block and set at L level by activation signal ACT.

Referring to FIG. 6, control circuit 2 also includes an internal flag set circuit 102. Internal flag set circuit 102 includes SR flip-flop circuits 586, 590, 592 and 596, and OR gates 588 and 594.

SR flip-flop circuit 586 receives a refresh request signal REFREQ to be described later and refresh signal REF at a set input and a reset input, respectively, and outputs internal flag REFflag.

OR gate 588 performs an OR operation between refresh signal REF and restore signal RST, and outputs the operation result to SR flip-flop circuit 590. SR flip-flop circuit 590 receives the output signal of OR gate 588 and recall signal RCL at a set input and a reset input, respectively, and outputs internal flag RCLflag.

SR flip-flop circuit 592 receives refresh signal REF and restore signal RST at a set input and a reset input, respectively, and outputs internal flag RSTflag.

OR gate 594 performs an OR operation among read command RDCMD, write command WRTCMD and mode select command MRSCMD, and outputs the operation result to SR flip-flop circuit 596. SR flip-flop circuit 596 receives internal signal CMDEN and the output signal of OR gate 588 at a set input and a reset input, respectively, and outputs internal flag CMDflag.

Referring to FIG. 7, control circuit 2 also includes a NAND gate 598 which performs an AND operation between signal NOP and internal flag REFflag and which outputs the inverted signal of the operation result, and an inverter 600 which inverts the output signal of NAND gate 598 and which outputs refresh signal REF.

Moreover, control circuit 2 includes a NAND gate 602 which performs an AND operation between signal NOP and internal flag RSTflag and which outputs the inverted signal of the operation result, and an inverter 604 which inverts the output signal of NAND gate 602 and which outputs restore signal RST.

Further, control circuit 2 includes a NAND gate 606 which performs an AND operation among signal NOP, the inverted signal of internal flag REFflag, the inverted signal of internal flag RSTflag and internal flag RCLflag and which outputs the inverted signal of the operation result, and an inverter 608 which inverts the output signal of NAND gate 606 and which outputs recall signal RCL.

Circuit shown in FIG. 7 is activated when the circuit does not receive an operation indication by command CMD from memory controller 8 and internal flag CMDflag is at H level, i.e., when signal NOP is at H level in a non-operation state.

Referring to FIG. 8, control circuit 2 also includes a refresh timer 610 and a refresh address counter 612.

Refresh timer 610 generates refresh request signal REFREQ which requests a refresh operation in a predetermined refresh cycle, and outputs refresh request signal REFREQ to refresh address counter 612. Refresh address counter 612 counts up a refresh counter in accordance with refresh request signal REFREQ, generates row address signals RA<0:6> and bank address signals BA0 and BA1 for selecting a refresh target memory cell row.

FIG. 9 is a functional block diagram of row address register 7 shown in FIG. 1. Row address register 7 is provided for each memory block of the respective banks of memory cell array 6. In FIG. 9, the row address register corresponding to memory block BLOCK0 of bank 0 is shown.

Referring to FIG. 9, row address register 7 includes a register array 622, spare decoders 624 to 634 provided to correspond to spare word lines SWL00 to SWL05, respectively, and AND gates 636 and 638.

Register array 622 holds therein row addresses corresponding to a word line activated in response to activation signal ACT. When receiving activation signal ACT, register array 622 receives row address signals RA<0:4> corresponding to the word line activated in response to activation signal ACT from control circuit 2, and holds the row address signals until receiving next precharge signal PRE. If receiving internal signal RAS which is the logical OR between read command RDCMD and write command WRTCMD, register array 622 compares read or write target row addresses RA<0:4> which register array 622 receives together with internal signal RAS, with the held row addresses. If they coincide, register array 622 outputs internal signal HIT at H level.

Spare decoders 624 to 634 set the operation modes of corresponding spare word lines SWL00 to SWL05, and output activation signals SWL00EN to SWL05EN corresponding to spare word lines SWL00 to SWL05, respectively. Namely, each spare decoder sets the corresponding spare word line in one of a first operation mode in which the spare word line is used as a spare line for a word line, a second operation mode in which the spare word line is used as a temporary storage memory cell for temporarily storing data read in accordance with the refresh operation, and a third operation mode in which the spare word line is used as a temporary storage memory cell for temporarily storing data for a recall operation.

If the corresponding spare word lines are set in the first operation mode, spare decoders 624 to 634 internally set the row addresses corresponding to the target word lines, compare read or write target row addresses RA<0:4> received together with internal signal RAS with the internally set row addresses, and output corresponding activation signals SWL0EN to SWL5EN at H level if the row addresses coincide, respectively.

If the corresponding spare word lines are set in the second operation mode, spare decoders 624 to 634 output corresponding activation signals SWL0EN to SWL5EN at H level in response to the activation of a signal REFSWLEN, respectively. Signal REFSWLEN is a signal which is activated when the data read to the sense amplifier in accordance with the refresh operation is written to the spare memory cell connected to the spare word line, and when the data written to the spare memory cell is read again to the sense amplifier so as to restore the data in the original memory cell. Signal REFSWLEN is generated by delaying refresh signal REF or restore signal RST in control circuit 2.

If the corresponding spare word lines are set in the third operation mode, spare decoders 624 to 634 output corresponding activation signals SWL0EN to SWL5EN at H level in response to the activation of a signal RCLSWLEN, respectively. Signal RCLSWLEN is a signal which is activated when the data read to the sense amplifier is written to the spare memory cell connected to the spare word line, and when the data written to the spare memory cell is read again to the sense amplifier, during the recall operation. Signal RCLSWLEN is activated right before signal SAEQ is activated in control circuit 2.

Spare decoders 624 to 634 can test the respective operation modes before setting the operation modes. Signals SWL_test, /Spare_test, /REF_test, /RCL_test are signals for conducting tests to the respective operation modes. If signals /Spare_test, /REF_test and /RCL_test are activated while signal SWL_test is active, operation tests for the first, second and third operation modes can be conducted, respectively.

AND gate 636 performs an AND operation between row address signals RA5 and RA6, and outputs the operation result as a block select signal BLK0SEL. AND gate 638 performs an AND operation between bank address signals BA0 and BA1, and outputs the operation result as a bank select signal BNK0SEL.

In FIG. 9, the row address register corresponding to memory block BLOCK0 of bank 0 is shown. In the row address register corresponding to memory block BLOCK1 of bank 1, for example, AND gate 636 performs an AND operation between the inverted signal of row address signal RA5 and row address signal RA6 and outputs the operation result as a block select signal BLK1SEL, and AND gate 638 performs an AND operation between the inverted signal of bank address signal BA0 and bank address signal BA1 and outputs the operation result as a bank select signal BNK1SEL.

FIG. 10 is a circuit diagram showing the configuration of register array 622 shown in FIG. 9.

Referring to FIG. 10, register array 622 includes NAND gates 652 and 656, inverters 654 and 658, AND gates 660 to 668, SR flip-flop circuits 670 to 680, and inverters 682 to 690.

NAND gate 652 performs an AND operation among activation signal ACT, block select signal BLK0SEL and bank select signal BNK0SEL, and outputs the inverted signal of the operation result. Inverter 654 outputs the inverted signal of the output signal of NAND gate 652. AND gates 660 to 668 perform AND operations between row address signals RA0 to RA4 and the output signal of inverter 654, and output the operation results to SR flip-flop circuits 672 to 680, respectively.

NAND gate 656 performs an AND operation among precharge signal PRE, block select signal BLK0SEL and bank select signal BNK0SEL, and outputs the inverted signal of the operation result. Inverter 658 outputs the inverted signal of the output signal of NAND gate 656.

SR flip-flop circuit 670 receives the output signal of inverter 654 at a set input. SR flip-flop circuits 672 to 680 receive the output signals of AND gates 660 to 668 at set inputs, respectively. SR flip-flop circuits 670 to 680 receive the output signal of inverter 658 at reset inputs, respectively and the internal states of SR flip-flop circuits 670 to 680 are reset in accordance with the received signal. Inverters 682 to 690 output the inverted signals of the output signals of SR flip-flop circuits 672 to 680, respectively.

Register array 622 also includes a P-channel MOS transistor 708, an inverter 706, an N-channel MOS transistor 710, and address bit comparison circuits 692 to 700 which are connected in parallel between nodes N1 and N0.

P-channel MOS transistor 708 is connected to a power supply node and node N1, and the gate thereof receives internal signal RAS. Inverter 706 outputs the inverted signal of internal signal RAS. N-channel MOS transistor 710 is connected to node N0 and a ground node, and the gate thereof receives the output signal of inverter 706.

Address bit comparison circuit 692 includes P-channel MOS transistors 716 and 718, and N-channel MOS transistors 720 and 722. P-channel MOS transistors 716 and 718 are connected in series between a power supply node and node N0, and the gates thereof receive the output signal of inverter 682 and row address signal RA0, respectively. N-channel MOS transistors 720 and 722 are connected in series between node N1 and a ground node, and the gates thereof receive the output signal of inverter 682 and row address signal RA0, respectively.

Address bit comparison circuits 694 to 700 differ from address bit comparison circuit 692 in that row address signals RA1 to RA4 are applied to circuits 694 to 700 instead of input row address signal RA0 and the output signals of inverters 684 to 690 are applied thereto instead of the output signal of inverter 682, respectively. However, since the internal configurations of address bit comparison circuits 694 to 700 are the same as that of address bit comparison circuit 692, they will not be repeatedly described herein.

Register array 622 further includes NAND gates 702 and 712 and inverters 704 and 714.

NAND gate 712 performs an AND operation among internal signal RAS, block select signal BLK0SEL and bank select signal BNK0SEL, and outputs the inverted signal of the operation result. Inverter 714 inverts the output signal of NAND gate 712 and outputs the inverted signal to NAND gate 702.

NAND gate 702 performs an AND operation among the output signal of SR flip-flop circuit 670, the signal on node N1, the output signal of inverter 714 and the inverted signal of the signal on node N0, and outputs the inverted signal of the operation result. Inverter 704 inverts the output signal of NAND gate 702, and outputs internal signal HIT.

The operation of register array 622 will be briefly described. If memory block 0 of bank 0 is selected and activation signal ACT is activated based on address signal ADDRESS and command CMD inputted from memory controller 8, SR flip-flop circuits 672 to 680 hold row address signals RA<0:4> designated by address signal ADDRESS. As a result, the row address of the activated word line is stored in register array 622.

Thereafter, if read command RDCMD or write command WRTCMD is activated based on address signal ADDRESS and command CMD inputted from memory controller 8, address bit comparison circuits 692 to 700 compare row address signals RA<0:4> designated by address signal ADDRESS with the row addresses held in SR flip-flop circuits 672 to 680.

If the row addresses coincide, it means that the target word line is already selected, so that register array 622 outputs internal signal HIT at H level. It is noted that SR flip-flop circuits 672 to 680 reset the row addresses held therein if precharge signal PRE for precharging the corresponding bit line pairs is activated.

FIG. 11 is a circuit diagram showing the configuration of spare decoder 624 shown in FIG. 9.

Referring to FIG. 11, spare decoder 624 includes a first operation mode setting section 732, a second operation mode setting section 756, and a third operation mode setting section 760.

First operation mode setting section 732 includes P-channel MOS transistors 774 and 776, an N-channel MOS transistor 778, and fuses F3 and F4. P-channel MOS transistors 774 and 776 are connected to a power supply node and fuse F3, and the gates thereof receive signals SWL_test and /Spare_test, respectively. N-channel MOS transistor 778 is connected to fuse F4 and a ground node, and the gate thereof receives signal /Spare_test. Fuse F3 is connected between P-channel MOS transistors 774, 776 and a node N5, and fuse F4 is connected between N-channel MOS transistor 778 and a node N5.

Second operation mode setting section 756 includes P-channel MOS transistors 780 and 782, an N-channel MOS transistor 784, and fuses F5 and F6. P-channel MOS transistors 780 and 782 are connected to a power supply node and fuse F5, and the gates thereof receive signals SWL_test and /REF_test, respectively. N-channel MOS transistor 784 is connected to fuse F6 and a ground node, and the gate thereof receives signal /REF_test. Fuse F5 is connected between P-channel MOS transistors 780, 782 and a node N6, and fuse F6 is connected between N-channel MOS transistor 784 and a node N6.

Third operation mode setting section 760 includes P-channel MOS transistors 786 and 788, an N-channel MOS transistor 790, and fuses F7 and F8. P-channel MOS transistors 786 and 788 are connected to a power supply node and fuse F7, and the gates thereof receive signals SWL_test and /RCL_test, respectively. N-channel MOS transistor 790 is connected to fuse F8 and a ground node, and the gate thereof receives signal /RCL_test. Fuse F7 is connected between P-channel MOS transistors 786, 788 and a node N7, and fuse F8 is connected between N-channel MOS transistor 790 and a node N7.

First operation mode setting section 732 sets the first operation mode in which spare word line SWL00 is used as a spare line for an ordinary word line. Second operation mode setting section 756 sets the second operation mode in which spare word line SWL00 is used as a temporary storage memory cell for temporarily storing data read in accordance with refresh operation. Third operation mode setting section 760 sets the third operation mode in which spare word line SWL00 is used as a temporary storage memory cell for temporarily storing data for recall operation.

Namely, if spare word line SWL00 is used in the first operation mode, fuses F4 to F8 except for fuse F3 are cut off and spare word line SWL00 is used as a spare line for an ordinary word line. If spare word line SWL00 is used in the second operation mode, all the fuses except for fuse F5 are cut off and spare word line SWL00 is used as a temporary storage memory cell during the refresh operation. If spare word line SWL00 is used in the third operation mode, all the fuses except for fuse F7 are cut off and spare word line SWL00 is used as a temporary storage memory cell during the recall operation.

First to third operation mode setting sections 732, 756 and 760 can conduct operation tests in advance by inputting signals SWL_test, /Spare_test, REF_test, /RCL_test before cutting off the fuses as already described above.

Spare decoder 624 also includes NAND gates 734, 754, 758 and 762, a P-channel MOS transistor 736, an N-channel MOS transistor 740, inverters 738, 742 and 764, and replacement word line setting sections 744 to 752.

NAND gate 734 performs an AND operation among block select signal BLK0SEL, bank select signal BNK0SEL, internal signal RAS and the signal on node N5, and outputs the inverted signal of the operation result. Inverter 742 outputs the inverted signal of the output signal of NAND gate 734. P-channel MOS transistor 736 is connected to a power supply node and node N3, and the gate thereof receives internal signal RAS. Inverter 738 outputs the inverted signal of internal signal RAS. N-channel MOS transistor 740 is connected to node N4 and a ground node, and the gate thereof receives the output signal of inverter 738.

NAND gate 754 performs an AND operation among the signals on nodes N3 to N5, and outputs the inverted signal of the operation result. Namely, if spare word line SWL00 is used in the first operation mode and the inputted row address coincides with a row address corresponding to a replacement target word line, then NAND gate 754 outputs an L-level signal at a timing at which internal signal RAS is inputted.

NAND gate 758 performs an AND operation between the signal on node N6 and signal REFSWLEN, and outputs the inverted signal of the operation result. Namely, if spare word line SWL00 is used in the second operation mode, NAND gate 758 outputs an L-level signal at a timing at which signal REFSWLEN is received. NAND gate 762 performs an AND operation between the signal on node N7 and signal RCLSWLEN, and outputs the inverted signal of the operation result. Namely, if spare word line SWL00 is used in the third operation mode, NAND gate 762 outputs an L-level signal at a timing at which signal RCLSWLEN is received. If one of the output signals of NAND gates 754, 758 and 762 are at L level, inverter 764 outputs activation signal SWL0EN at H level.

Replacement word line setting section 744 includes P-channel MOS transistors 766 and 770, N-channel MOS transistor 768 and 772, and fuses F1 and F2.

P-channel MOS transistor 766 and N-channel MOS transistor 768 are connected in series between node N3 and fuse F2, and the gates thereof receive the output signal of NAND gate 734 and row address signal RA0, respectively. P-channel MOS transistor 770 and N-channel MOS transistor 772 are connected in series between fuse F1 node N4, and the gates thereof receive row address signal RA0 and the output signal of inverter 742, respectively. Fuse F1 is connected between a power supply node and P-channel MOS transistor 770, and fuse F2 is connected between N-channel MOS transistor 768 and a ground node.

Replacement word line setting sections 746 to 752 differ from replacement word line setting section 744 in that row address signals RA1 to RA4 are applied thereto instead of input row address signal RA0, respectively. Since the internal configurations of replacement word line setting sections 746 to 752 are the same as that of replacement line setting section 744, they will not be repeatedly described herein.

If spare word line SWL00 is used in the first operation mode, replacement word line setting sections 744 to 752 compare the row addresses inputted from the outside with the row addresses corresponding to the replacement target word line set in advance and output the comparison results, respectively.

Since the configurations of other spare decoders 626 to 634 shown in FIG. 9 are the same as that of spare decoder 624, they will not be repeatedly described herein.

FIG. 12 is an operation waveform view for describing the operation of semiconductor memory device 1 in the first embodiment. For the convenience of description, it is assumed in FIG. 12 that an operation is performed for one bank address and that a burst length is 4.

Referring to FIG. 12, it is assumed that one of word lines WL01 to WL0F is already activated and signal BLTG0 is at H level before time T1. Therefore, N-channel MOS transistors 30 to 33 are conductive, bit line pairs BL00, /BL00 are electrically connected to bit line pair BL0, /BL0 and bit line pair BL01, /BL01 are electrically connected to bit line pair BL1, /BL1, respectively. Drive signals S0 and /S0 are activated to H level and L level, respectively, and sense amplifiers 62 and 63 amplify the potentials of bit line pairs BL0, /BL0 and BL1, /BL1, respectively.

At time T1, read command RD is inputted as command CMD and a row address 00 is inputted as address signal ADDRESS. If so, row address register 7 compares the inputted row address with the row address stored therein. Since the addresses do not coincide, row address register 7 outputs internal signal HIT at L level.

If so, control circuit 2 activates precharge signal PRE. Accordingly, the activated word line is deactivated, signals BLEQ0 and SAEQ0 are activated, and drive signals S0, /S0 are both set to have potential VBL. Bit line pair BL00, /BL00, bit line pair BL0, /BL0, bit line pair BL01, /BL01, and bit line pair BL1, /BL1 are precharged with a predetermined potential.

At time T2 two clocks after time T1, control circuit 2 activates activation signal ACT. Accordingly, signals BLEQ0 and SAEQ0 are deactivated, word line WL00 is activated and activation operation is executed. Further, in accordance with the activation of activation signal ACT, row address register 7 stores row addresses RA<0:4> therein.

If data is read to bit line pair BL0, /BL0 and bit line pair BL1, /BL1 in accordance with activation signal ACT, then signal BLTG0 is temporarily deactivated, and bit line pair BL0, /BL0 are electrically separated from bit line pair BL00, /BL00 and bit line pair BL1, /BL1 are electrically separated from bit line pair BL01, /BL01. Thereafter, drive signals S0 and /S0 are activated to H level and L level, respectively, and sense amplifiers 62 and 63 amplify the potentials of bit line pair BL0, /BL0 and bit line pair BL1, /BL1, respectively.

At time T4 two clocks after time T2 at which activation signal ACT is activated, control circuit 2 activates read signal RD. Accordingly, column select line CSL0, corresponding to column address 00 inputted following row address 00 one clock after time T1, is selected, and the data read to sense amplifier 62 is transmitted to input/output circuit 14 through local IO lines LIO0, /LIO0, connection gate circuit G#0 and global IO lines GIO, /GIO.

A half clock after the activation of read signal RD, control circuit 2 sets signal Ready at H level, and outputs L-level signal /Ready to memory controller 8. As a result, memory controller 8 is notified that data is outputted in response to next clock CLK. From one clock after signal /Ready is notified to memory controller 8, data Q0 to Q3 corresponding to column addresses 00 to 03 are sequentially outputted.

At time T3, control circuit 2 generates refresh request signal REFREQ independently of the operation related to read command RD applied thereto from the outside at time T1.

If so, at time T5 two clocks after the activation of read signal RD, control circuit 2 activates refresh signal REF and a refresh operation thereby starts. If refresh signal REF is activated, then word line WL00 activated in accordance with read command RD is deactivated, signal BLTG0 is deactivated, bit line pair BL00, /BL00 are separated from bit line pair BL0, /BL0, respectively and bit line pair BL01, /BL01 are separated from bit line pair BL1, /BL1, respectively. Signal BLEQ0 is activated, and bit line pair BL00, /BL00 and bit line pair BL01, /BL01 are initialized while the data corresponding to word line WL00 remains in sense amplifiers 62 and 63.

Since it is unclear when the data corresponding to word line WL00 and read to sense amplifiers 62 and 63 is read again from the outside, the data is temporarily held in the spare memory cells connected to the spare word line so that the data can be restored at high rate. That is, control circuit 2 activates signal RCLSWLEN, and the data of sense amplifiers 62 and 63 is written to the spare memory cells connected to the spare word line for recall operation the mode of which is set in advance.

On the other hand, if bit line pair BL00, /BL00 and bit line pair BL01, /BL01 are initialized in accordance with signal BLEQ0, word line WL0F corresponding to a refresh target memory cell row is activated and data is read to bit line pair BL00, /BL00 and bit line pair BL01, /BL01. If the writing of data corresponding to word line WL00 and read to sense amplifiers 62 and 63 to the spare memory cells is finished, then drive signals S0 and /S0 are both set to have potential VBL, signal SAEQ0 is activated, and bit line pair BL0, /BL0 and bit line pair BL1, /BL1 are initialized.

Thereafter, signal BLTG0 is activated, bit line pair BL00, /BL00 are electrically connected to bit line pair BL0, /BL0, and bit line pair BL01, /BL01 are electrically connected to bit line pair BL1, /BL1, respectively. As a result, the potentials of bit line pair BL00, /BL00 and bit line pair BL01, /BL01 are amplified by sense amplifiers 62 and 63, respectively. The data the potentials of which are amplified by sense amplifiers 62 and 63 is written to the spare memory cells connected to the preset spare word line, and the refresh operation is finished in this stage.

At time T6, read command RD is inputted as command CMD and row address 00 is inputted as address signal ADDRESS independently of the refresh operation, row address register 7 compares the inputted row address with the row address stored therein. Since these addresses are both 00 and coincident, row address register 7 outputs internal signal HIT at H level.

If so, control circuit 2 activates recall signal RCL. Accordingly, word line WL0F activated in accordance with the refresh operation is deactivated, signals BLEQ0 and SAEQ0 are activated, drive signals S0 and /S0 are set to have potential VBL, bit line pair BL00, /BL00, BL0, /BL0, and BL01, /BL01, BL1, /BL1 are precharged with a predetermined potential.

At time T7 one clock after time T6, control circuit 2 activates signal RCLSWLEN again, and the data corresponding to word line WL00 and temporarily held in the spare memory cells is read to sense amplifiers 62 and 63.

In addition, at time T7, a column address 04 is inputted following row address 00, and control circuit 2 activates read signal RD. Accordingly, column select line CSL4 (not shown in FIG. 3 and the like) corresponding to column address 04 is selected, and the data read to the corresponding sense amplifiers is transmitted to input/output circuit 14 through local IO lines LIO0, /LIO0, connection gate circuit G#0, and global IO lines GIO, /GIO.

A half clock after the activation of read signal RD, control circuit 2 sets signal Ready at H level, and outputs L-level signal /Ready to memory controller 8. As a result, memory controller 8 is notified that data is outputted in response to next clock signal CLK. One clock after signal /Ready is notified to memory controller 8, data Q4 to Q7 corresponding to column addresses 04 to 07 are sequentially outputted.

At time T8 three clocks after the activation of read signal RD, control circuit 2 activates restore signal RST and a restore operation for restoring the data corresponding to word line WL0F and temporarily held in the spare memory cells starts. Accordingly, activated word line WL00 is deactivated, signal BLTG0 is deactivated, bit line pair BL00, /BL00 are electrically separated from bit line pair BL0, /BL0 and bit line pair BL01, /BL01 are electrically separated from bit line pair BL1, /BL1.

Thereafter, signals BLEQ0 and SAEQ0 are activated, drive signals S0 and /S0 are both set to have potential VBL, and bit line pairs BL00, /BL00, BL0, /BL0, BL01, /BL01 and BL1, /BL1 are precharged with a predetermined potential. Control circuit 2 activates signal REFSWLEN again, and the data corresponding to word line WL0F and temporarily held in the spare memory cells is read to sense amplifiers 62 and 63.

Further, control circuit 2 activates word line WL0F so as to write the data read to sense amplifiers 62 and 63 to the original memory cells. Signal BLTG0 is then activated again, the data read to sense amplifiers 62 and 63 is written to the original memory cells, and the recovery of the data in accordance with the refresh operation is completed.

At time T9, read command RD is inputted as command CMD and row address 01 is inputted as address signal ADDRESS independently of the refresh operation. If so, row address register 7 compares the inputted row address with the held row address. Since row address register 7 holds row address 00 in accordance with signal ACT at time T2, the addresses do not coincide and row address register 7 outputs internal signal HIT at L level.

In this case, therefore, the same operations as those at time T1 and the following are performed. Namely, at time T10 two clocks after time T9, control circuit 2 activates activation signal ACT. Accordingly, row address register 7 holds therein row address 01 inputted at time T9. At time T11 two clocks after time T10, control circuit 2 activates read signal RD. After signal /Ready is outputted to memory controller 8, signal data Q0 to Q3 are sequentially outputted to memory controller 8.

Alternatively, if data is temporarily stored in the spare memory cells during the recall operation and the refresh operation, adjacent spare word lines, e.g., spare word lines SWL00 and SWL01 may be activated simultaneously and the data of sense amplifier 62 may be stored in two spare memory cells SCell00 and SCell10 as complementary data to each other. By using thus the spare memory cells as so-called twin memory cells, it is possible to accelerate the amplification operation of the sense amplifier and accelerate the operation of semiconductor memory device 1 during the recall operation and the refresh operation.

As described so far, according to semiconductor memory device 1 in the first embodiment, the spare memory cells connected to the spare word line provided in the vicinity of the sense amplifier is used as a temporary data holding circuit and the refresh operation is executed in two stages using the spare memory cells. It is, therefore, possible to shorten a period in which an external command cannot be received during a refresh operation, to decrease delay caused by the refresh operation, and to thereby attain the high-rate operation of semiconductor memory device 1.

Further, during the refresh operation, the data read to the sense amplifier before the refresh operation is held in the spare memory cells. Access to the data thereafter is accelerated.

Furthermore, separation circuits 60, 61, 66 and 67 for separating memory cell array MA from sense amplifier band SAB are provided, and memory cell array MA is separated from sense amplifier band SAB when inputting and outputting data to and from the spare memory cells. It is, therefore, possible to accelerate the operation of the sense amplifier when inputting and outputting data to and from the spare memory cells.

Moreover, if data is temporarily stored in the spare memory cells, the spare memory cells can operate as twin memory cells, making it possible to further accelerate the operation.

In addition, according to semiconductor memory device 1 in the first embodiment, row address register 7 which manages row addresses is provided and the data input/output timing which differs according to the activated/deactivated state of each row address is notified to the outside of the memory. It is, therefore, possible to input row addresses and column addresses from the outside without consideration to the state of the internal row addresses. Besides, since memory controller 8 which controls semiconductor memory device 1 does not need to manage the row addresses, it is possible to realize a semiconductor memory device which an external controller can simply utilize.

Furthermore, according to semiconductor memory device 1, spare decoders 624 to 634 have functions to test spare word lines in advance. It is, therefore, possible to use only the spare word lines the normal operations of which are validated.

Further, since semiconductor memory device 1 can function as a conventional SDRAM in accordance with an external command, it can be used in place of the conventional SDRAM.

Second Embodiment

In the first embodiment, if a refresh operation is executed during the burst operation, it is necessary to stop the burst operation and execute the refresh operation or not to start the refresh operation until the burst operation is finished. In the second embodiment, measures are taken to solve this disadvantage and the refresh operation in the semiconductor memory device appears completely hidden from the outside of the memory.

In addition, in the semiconductor memory device according to the present invention, an address management circuit is included, so that the load of a controller which controls the semiconductor memory device is lessened. In the second embodiment, an SIP (System In Package) configuration in which a semiconductor memory device and a controller are included in a small-sized unit is adopted.

FIG. 13 is a schematic block diagram showing the overall configuration of the semiconductor memory device according to the second embodiment of the present invention.

Referring to FIG. 13, a semiconductor memory device 1A as well as a memory control section 9 is included in a unit 10. Semiconductor memory device 1A includes a control circuit 2A, a memory cell array 6A, and a row address register 7A in place of control circuit 2, memory cell array 6, and row address register 7 which are provided in semiconductor memory device 1 in the first embodiment, respectively. Since the configurations of the other circuits of semiconductor memory device 1A are the same as those of semiconductor memory device 1 in the first embodiment, they will not be repeatedly described herein.

A normal SDRAM generally employs a multiplexing method for inputting a row address and a column address from a common terminal at staggered time. In semiconductor memory device 1A in the second embodiment, row address RA, column address CA and bank address BA are simultaneously inputted from memory control section 9 into control circuit 2A. As for command CMD applied from memory control section 9, differently from semiconductor memory device 1 in the first embodiment, a combination of a plurality of signals are not applied but one command is applied by one signal.

Semiconductor memory device 1A in the second embodiment can adopt the same system configuration and interface configuration as those of the first embodiment without adopting the SIP configuration and the above-described interface configuration.

FIG. 14 is a circuit diagram showing the configuration of the periphery of a sense amplifier band included in memory cell array 6A shown in FIG. 13.

Referring to FIG. 14, a switch array SW is provided between memory blocks BLOCK0 and BLOCK1. Since the configurations of memory blocks BLOCK0 and BLOCK1 are the same as those of memory blocks BLOCK0 and BLOCK1 in semiconductor memory device 1 in the first embodiment, they will not be repeatedly described herein.

Switch array SW is arranged between memory cell array MA#01 included in memory block BLOCK0 and memory cell array MA#10 included in memory block BLOCK1. Switch array SW includes a connection circuit 450 which connects bit line pair BL10, /BL10 to a bit line pair BL20, /BL20, respectively, and a connection circuit 451 which connects bit line pair BL11, /BL11 to a bit line pair BL21, /BL21, respectively.

Connection circuit 450 consists of N-channel MOS transistors 460 and 461. N-channel MOS transistor 460 is connected between bit lines BL10 and BL20, and the gate thereof receives a signal ARTG01. N-channel MOS transistor 461 is connected between bit lines /BL10 and /BL20, and the gate thereof receives signal ARTG01. Connection circuit 451 consists of N-channel MOS transistors 462 and 463. N-channel MOS transistor 462 is connected between bit lines BL11 and BL21, and the gate thereof receives signal ARTG01. N-channel MOS transistor 463 is connected between bit lines /BL11 and /BL21, and the gate thereof receives signal ARTG01.

If signal ARTG01 is activated, connection circuit 450 electrically connects bit lines BL10, /BL10 to bit lines BL20, /BL20, respectively, and connection circuit 451 electrically connects bit lines BL11, /BL11 to bit lines BL21, /BL21, respectively.

In semiconductor memory device 1A, data read from a memory cell to a sense amplifier in memory block BLOCK0 is transferred to a sense amplifier in memory block BLOCK1 through memory cell array MA#01, switch array SW and memory cell array MA#10 of memory block BLOCK1. The data is read from the sense amplifier of memory block BLOCK1 to local IO lines LIO1, /LIO1, read to global IO lines GIO, /GIO through gate circuit G#1, and transmitted to input/output circuit 14.

By doing so, even if a refresh operation generates in memory block BLOCK0 while data is read from memory block BLOCK0 by a burst operation, the read data is transferred to the sense amplifier of memory block BLOCK1 and interfaces with the outside of the memory. It is, therefore, possible to employ the sense amplifier of memory block BLOCK0 for the refresh operation and to prevent the interruption of the burst operation or the delay of the start of the refresh operation.

There is a case where the data read from a memory cell to the sense amplifier in memory block BLOCK1 is transferred to the sense amplifier in memory block 0 through memory array MA#10, switch array SW and memory cell array MA#01 of memory block BLOCK0. Since this case is essentially equal in operation to the above-described case, the case where data is read from a memory cell in memory block BLOCK0 to the sense amplifier will be described hereinafter.

FIGS. 15 to 18 are circuit diagram showing the configurations of control circuit 2A shown in FIG. 13. For the convenience of description, FIGS. 15 to 18 only show sections corresponding to memory block BLOCK0 of bank 0 and the sections will be described without adding symbols corresponding to the bank and the memory block unless it is necessary to do so, as in the case of the first embodiment.

Referring to FIG. 15, control circuit 2A includes an signal input/output circuit 104. Signal input/output circuit 104 includes an OR gate 522, a mode setting circuit 516A and an inverter 524.

OR gate 522 performs an OR operation between read command RD and write command WRT received from memory control section 9 as command CMD, and output the operation result as an internal signal ADR. When mode select command MRS is at H level, mode setting circuit 516A set the mode of semiconductor memory device 1A in accordance with address signal ADDRESS received from memory control section 9 as a mode setting signal. Then, mode setting circuit 516A outputs signals SWL_test, /Spare_test and /REF_test in accordance with the set mode. Inverter 524 inverts internal signal Ready and outputs signal /Ready to memory control section 9.

Referring to FIG. 16, control circuit 2A includes an AND gate 802 which performs an AND operation between the inverted signal of internal signal HIT and an internal signal ADR and which outputs the operation result, an AND gate 804 which performs an AND operation between the output signal of AND gate 802 and the inverted signal of internal flag RCLflag and which outputs the operation result, and a delay circuit 806 which outputs a signal delayed from the output signal of AND gate 804 by two clocks.

Control circuit 2A also includes an AND gate 808 which performs an AND operation between the output signal of AND gate 802 and internal flag RCLflag and which outputs the operation result as recall signal RCL, and a delay circuit 810 which outputs a signal delayed from the output signal of AND gate 808 by two clocks.

Control circuit 2A further includes an AND gate 812 which performs an AND operation between the output signal of delay circuit 806 or 810 and the inverted signal of signal BLEQ and which outputs the operation result as precharge signal PRE, a delay circuit 814 which delays the output signal of AND gate 812 by two clocks and which outputs activation signal ACT, an AND gate 816 which performs an AND operation between the output signal of delay circuit 806 or 810 and signal BLEQ and which outputs the operation result as activation signal ACT, and a delay circuit 818 which delays activation signal ACT by a half clock and which outputs internal signal Ready.

Further, control circuit 2A includes an AND gate 820 which performs an AND operation between internal signals ADR and HIT and which outputs the operation result, and a delay circuit 822 which delays the output signal of AND gate 820 by a half clock and which outputs internal signal Ready.

Furthermore, control circuit 2A includes a delay circuit 824 which outputs a signal delayed from internal signal Ready by a half clock, an AND gate 826 which performs an AND operation between read command RD and the output signal of delay circuit 824 and which outputs the operation result as read signal RD, and an AND gate 828 which performs an AND operation between write command WRT and the output signal of delay circuit 824 and which outputs the operation result as write signal WRT.

Since recall signal RCL, precharge signal PRE, activation signal ACT, internal signal Ready, read signal RD and signal BLEQ are already described in the first embodiment, they will not be repeatedly described herein. Write signal WRT is a signal which indicates the write of an external signal.

Referring to FIG. 17, control circuit 2A further includes an internal flag set circuit 106. Internal flag set circuit 106 consists of SR flip-flop circuits 830, 832, 836, 840 and 844, and delay circuits 834, 838 and 842.

SR flip-flop circuit 830 receives refresh request signal REFREQ and refresh signal REF at a set input and a reset input, respectively, and outputs internal flag REFflag. SR flip-flop circuit 832 receives a transfer signal TRS to be described later and recall signal RCL at a set input and a reset input, respectively, and outputs internal flag RCLflag.

Delay circuit 834 outputs a signal delayed from refresh signal REF by one clock. SR flip-flop circuit 836 receives the output signal of delay circuit 834 and restore signal RST at a set input and a reset input, respectively, and outputs internal flag RSTflag.

Delay circuit 838 outputs a signal delayed from an equalization signal EQ to be described later by one clock. SR flip-flop circuit 840 receives the output signal of delay circuit 838 and activation signal ACT at a set input and a reset input, respectively, and outputs internal flag EQflag.

Delay circuit 842 outputs a signal delayed from restore signal RST by one clock. SR flip-flop circuit 844 receives the output signal of delay circuit 842 and refresh request signal REFREQ at a set input and a reset input, respectively, and outputs an internal flag NMLflag.

Referring to FIG. 18, control circuit 2A also includes a NAND gate 846 which performs an AND operation among signal NOP, the inverted signal of signal BLEQ, internal flag REFflag and the inverted signal of internal flag RCLflag and which outputs the inverted signal of the operation result, and an inverter 848 which inverts the output signal of NAND gate 846 and which outputs transfer signal TRS. Transfer signal TRS is a signal which indicates an operation for transferring the data of an activated sense amplifier to a sense amplifier in an adjacent memory block.

Further, control circuit 2A includes a NAND gate 850 which performs an AND operation among signal NOP, the inverted signal of internal signal EQflag and internal flag RCLflag and which outputs the inverted signal of the operation result, and an inverter 852 which inverts the output signal of NAND gate 850 and which outputs equalization signal EQ. Equalization signal EQ is a signal which indicates the initialization of a bit line pair in the corresponding memory block.

Furthermore, control circuit 2A includes a NAND gate 854 which performs an AND operation among signal NOP, internal signal EQflag and internal flag REFflag and which outputs the inverted signal of the operation result, and an inverter 856 which inverts the output signal of NAND gate 854 and which outputs refresh signal REF.

Moreover, control circuit 2A includes a NAND gate 858 which performs an AND operation between signal NOP and internal flag RSTflag and which outputs the inverted signal of the operation result, and an inverter 860 which inverts the output signal of NAND gate 858 and which outputs restore signal RST.

Control circuit 2A further includes a NAND gate 862 which performs an AND operation among signal NOP, internal flag RCLflag and internal flag NMLflag and which outputs the inverted signal of the operation result, and an inverter 864 which inverts the output signal of NAND gate 862 and which outputs recall signal RCL.

The circuit shown in FIG. 18 is activated when control circuit 2A does not receive an operation indication by command CMD from memory control section 9, i.e., when signal NOP is at H level in a non-operation state.

Furthermore, control circuit 2A includes a refresh timer 610 and a refresh address counter 612, not shown. Since the configurations of refresh timer 610 and refresh address counter 612 are already described in the first embodiment, they will not be repeatedly described herein.

FIG. 19 is a functional block diagram of row address register 7A shown in FIG. 13. Similarly to the first embodiment, row address register 7A is provided for each memory block of the respective banks of memory cell array 6A. In FIG. 19, the row address register corresponding to memory block BLOCK0 of bank 0 is shown.

Referring to FIG. 19, row address register 7A includes a register array 622A in place of register array 622 included in row address register 7 of semiconductor memory device 1 in the first embodiment shown in FIG. 9, and spare decoders 624A to 634A in place of spare decoders 624 to 634 included in row address register 7.

Register array 622A, similarly to register array 622, holds therein row addresses corresponding to a word line activated in response to activation signal ACT. However, register array 622A differs from register array 622 in that register array 622A receives internal signal ADR instead of internal signal RAS.

When receiving activation signal ACT, register array 622A receives row address signals RA<0:4> corresponding to the word line activated in response to activation signal ACT from control circuit 2A, and holds the row address signals until receiving next precharge signal PRE. If receiving internal signal ADR, register array 622A compares read or write target row address signals RA<0:4> which register array 622A receives together with internal signal ADR, with the held row addresses. If they coincide, register array 622A outputs internal signal HIT at H level.

Spare decoders 624A to 634A, similarly to spare decoders 624 to 634, set the operation modes of corresponding spare word lines SWL00 to SWL05, and output activation signals SWL0EN to SWL5EN corresponding to spare word lines SWL00 to SWL05, respectively. However, spare decoders 624A to 634A differ from spare decoders 624 to 634 in that spare decoders 624A to 634A receive internal signal ADR instead of internal signal RAS and do not receive signal /RCL_test.

Namely, each of spare decoders 624A to 634A sets the corresponding spare word line in either a first operation mode in which the spare word line is used as a spare line for a word line, or a second operation mode in which the spare word line is used as temporary storage memory cells for temporarily storing data read in accordance with the refresh operation.

Semiconductor memory device 1A in the second embodiment does not have an operation mode in which the spare word line is used as temporary storage memory cells for temporarily storing data for a recall operation, for the following reason. Since read data is read by a sense amplifier and then transferred to an adjacent sense amplifier in semiconductor memory device 1A, it is unnecessary to store the read data in the spare word line. Due to this, spare decoders 624A to 634A do not include a setting circuit for setting an operation mode in which the spare word line is used as temporary storage memory cells for temporarily storing data for a recall operation.

Register array 622A differs from register array 622 in that register array 622A receives internal signal ADR instead of internal signal RAS. Since the other circuit configurations of register array 622A are the same as those of register array 622, they will not be repeatedly described herein.

FIG. 20 is a circuit diagram showing the configuration of spare decoder 624A shown in FIG. 19.

Referring to FIG. 20, spare decoder 624A differs from spare decoder 624 of semiconductor memory device 1 according to the first embodiment in that spare decoder 624A receives internal signal ADR instead of internal signal RAS and does not include third mode setting section 760 and NAND gate 762. Since the other configurations of spare decoder 624A are the same as those of spare decoder 624, they will not be repeatedly described herein.

Since the configurations of other spare decoders 626A to 634A shown in FIG. 19 are the same as that of spare decoder 624A, they will not be repeatedly described herein.

FIG. 21 is an operation waveform view for describing the operation of semiconductor memory device 1A in the second embodiment. For the convenience of description, it is assumed in FIG. 21 that an operation is performed for one bank address and that a burst length is 4.

Referring to FIG. 21, before time T1, word line WL00 is already activated. Drive signals S0 and /S0 are activated to H level and L level, respectively, and sense amplifiers 62 and 63 of memory block BLOCK0 amplify the potentials of bit line pair BL0, /BL0 and bit line pair BL1, /BL1, respectively. Further, drive signals S1 and /S1 are initially set to have potential VBL, and sense amplifiers 62 and 63 of memory block BLOCK1 are deactivated.

At time T1, read command RD is inputted as command CMD and address 000 (two left figures represent a row address and one right figure represents a column address) is inputted as address signal ADDRESS. If so, row address register 7A compares the inputted row address with the row address stores therein. Since the addresses coincide, row address register 7A output internal signal HIT at H level.

If so, control circuit 2A sets internal signal Ready at H level a half clock later, and outputs L-level signal /Ready to memory control section 9. As a result, memory control section 9 is notified that data is outputted in response to next clock CLK. Control circuit 2A activates read signal RD at time T2 a half clock after time T1, whereby data Q0 to Q3 corresponding to column addresses 0 to 3 are sequentially outputted one clock after time T2.

At time T3, control circuit 2A generates refresh request signal REFREQ independently of the operation related to read command RD applied thereto from the outside at time T1.

At time T4 at which there is the rising edge of next clock signal CLK, control circuit 2A activates transfer signal TRS and a transfer operation for transferring the data read to the sense amplifier of memory block BLOCK0 starts. Namely, if transfer signal TRS is activated, then signals BLEQ2 and SAEQ1 are deactivated, signals BLTG1 and ARTG1 are activated, and the sense amplifier of memory block BLOCK1 is electrically connected to that of memory block BLOCK0.

The data read to the sense amplifier of memory block BLOCK0 is transmitted to the sense amplifier of memory block BLOCK1 through memory cell array MA#01, switch array SW and memory cell array MA#10. Drive signals S1 and /S1 are activated to H level and L level, respectively, and the sense amplifier of memory block BLOCK1 holds the same data as that of the sense amplifier of memory block BLOCK0. If data transfer is completed, signal BLTG1 is deactivated.

At this moment, a transfer processing for transferring fourth output data Q3 to the sense amplifier of memory block BLOCK1 is already completed during the data output. Therefore, a signal IOSW1 is activated, and data Q3 is outputted from the sense amplifier of memory block BLOCK1 to the outside.

Next, at time T5, write command WRT is inputted as command CMD and 004 is inputted as address signal ADDRESS independently of the refresh operation, row address register 7A compares the inputted row address with the internally held row address. Since they coincide, row address register 7A outputs internal signal HIT at H level.

Accordingly, control circuit 2A sets internal signal Ready at H level a half clock after time T5, and outputs L-level signal /Ready to memory control section 9. One clock after output of signal /Ready, data D4 to D7 are inputted. Since data at row address 00 is already transferred to the sense amplifier of memory block BLOCK1, data D4 to D7 are written to the sense amplifier of memory block BLOCK1.

At time T6, control circuit 2A activates internal flag RCLflag in accordance with the activation of transfer signal TRS, and activates equalization signal EQ accordingly. Accordingly, word line WL00 is deactivated, signals BLEQ0 and SAEQ0 are activated, and drive signals S0 and /S0 are both set to have potential VBL. Control circuit 2A activates signal REFSWLEN so as to store the data read to the sense amplifier of memory block BLOCK0 in accordance with a refresh operation to be executed later in spare memory cells. It is noted that control circuit 2A deactivates signals BLEQ0 and SAEQ0 when the initialization of a bit line pair is completed.

Next, at time T7 two clocks after the activation of equalization signal EQ, control circuit 2A activates refresh signal REF and a refresh operation thereby starts. If refresh signal REF is activated, refresh target word line WL0F is activated and data is read to the sense amplifier of memory block BLOCK0.

To accelerate the amplification operation of the sense amplifier, after the data is read to the bit line pair, signal BLTG0 is deactivated, bit line pair BL00, /BL00 are separated from bit line pair BL0, /BL0 and bit line pair BL01, /BL01 are separated from bit line pair BL1, /BL1, respectively. If the data is read to the sense amplifier, word line WL0F is deactivated and signal BLEQ0 is activated.

In semiconductor memory device 1A according to the second embodiment, as in the case of semiconductor memory device 1 according to the first embodiment, the refresh operation is executed in two stages. Due to this, the data read to the sense amplifier in accordance with the refresh operation is not promptly written to the original memory cells but temporarily written to the spare memory cells. If the data is written to the spare memory cells, control circuit 2A deactivates signal REFSWLEN and the data is held in the spare memory cells.

At time T8, independently of the refresh operation, write command WRT is inputted as command CMD and 200 is inputted as address signal ADDRESS. If so, row address register 7A compares inputted row address 20 with internally held row address 00. Since these row addresses do not coincide, row address register 7A outputs internal signal HIT at L level.

While inputted row address 20 corresponds to the word line included in memory block BLOCK1, the data corresponding to word line WL00 of memory block BLOCK0 is held in the sense amplifier of memory block BLOCK1. Due to this, control circuit 2A activates recall signal RCL, and the data held in the sense amplifier of memory block BLOCK1 is transferred again to the sense amplifier of memory block BLOCK0.

Since a write operation is performed in accordance with write command WRT input at time T5, four input data D7 inputted after the completion of retransfer is written to the sense amplifier of memory block BLOCK0. Thereafter, control circuit 2A activates word line WL00 and these pieces of input data are written to memory cells connected to word line WL00.

After the completion of the retransfer of data, control circuit 2A deactivates signal ARTG01, and memory blocks BLOCK0 and BLOCK1 are electrically separated from each other by switch array SW.

At time T9, control circuit 2A activates precharge signal PRE and equalization signal EQ, whereby a data write preparation operation in memory block BLOCK1 and an initialization operation for performing a restore operation to refresh data in memory block BLOCK0 are executed in parallel.

At time T10, control circuit 2A activates activation signal ACT and restore signal RST, whereby the activation of word line WL20 in memory block BLOCK1 and a restore operation for the refresh data in memory block BLOCK0 are executed in parallel.

At time T11, control circuit 2A activates write signal WRT, whereby data is written to the memory cells connected to word line WL20 in memory block BLOCK1.

As described in the first embodiment, in semiconductor memory device 1A, if data is temporarily stored in the spare memory cells during the refresh operation, adjacent spare word lines, e.g., spare word lines SWL00 and SWL01 may be activated simultaneously and the data held in sense amplifier 62 may be stored in two spare memory cells SCell00 and SCell10 as complementary data to each other. By thus using the spare memory cells, it is possible to accelerate the amplification operation of the sense amplifier and accelerate the operation of semiconductor memory device 1A during the refresh operation.

As described so far, according to semiconductor memory device 1A in the second embodiment, switch array SW which connects adjacent memory blocks to each other is provided so that the data read to the sense amplifier included in one memory block can be transferred to the sense amplifier included in the other memory block. Therefore, even if a refresh operation is executed during a burst operation, read data is continuously outputted. Consequently, it is possible to realize the high-rate operation of semiconductor memory device 1A.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device requiring a refresh operation, comprising:

a memory block; and a control circuit controlling an operation of the semiconductor memory device, wherein said memory block includes:

a memory cell array including a plurality of memory cells;

a plurality of word lines and a plurality of bit line pairs; and a sense amplifier band connected to said memory cell array through said plurality of bit line pairs, said sense amplifier band includes:

a plurality of sense amplifiers provided to correspond to said plurality of bit line pairs; and a data holding circuit holding data read by said sense amplifiers, and said control circuit executes said refresh operation while dividing said refresh operation into a first operation for holding the data read from a refresh target memory cell to said plurality of sense amplifiers in said data holding circuit, and a second operation for reading said data held in said data holding circuit to said plurality of sense amplifiers and writing the read data to said refresh target memory cell.

2. The semiconductor memory device according to claim 1, wherein said sense amplifier band further includes a separation circuit separating said memory cell array from the sense amplifier band on the basis of an indication from said control circuit, said data holding circuit is provided between said plurality of sense amplifiers and said separation circuit, and said control circuit executes an operation for activating said separation circuit when executing an operation for reading and writing the data from and to said data holding circuit.

3. The semiconductor memory device according to claim 1, wherein when the data is already read to said plurality of sense amplifiers during said refresh operation, said control circuit further executes an operation for holding the read data in said data holding circuit.

4. The semiconductor memory device according to claim 3, wherein said data holding circuit includes:

a plurality of spare memory cells operable as backup memory cells for said plurality of memory cells; and a plurality of spare word lines provided to correspond to said plurality of spare memory cells.

5. The semiconductor memory device according to claim 4, wherein said plurality of spare memory cells include a plurality of first spare memory cells and a plurality of second spare memory cells, the first spare memory cells and the second spare memory cells forming pairs, respectively, each of said plurality of first spare memory cells is connected to one bit line constituting one bit line pair included in said plurality of bit line pairs, and each of said plurality of second spare memory cells is connected to the other bit line constituting said one bit line pair, and stores inverted data of the data stored in said first spare memory cell constituting the pair.

6. The semiconductor memory device according to claim 4, further comprising:

a row address management circuit holding a row address inputted from an outside of the semiconductor memory device, and managing input and output of data to and from said plurality of memory cells and said plurality of spare memory cells for each of said word lines and said spare word lines; and a control signal output terminal notifying the outside of a data input and output timing different in accordance with said row address inputted from the outside.

7. The semiconductor memory device according to claim 6, wherein said row address management circuit includes:

a row address comparison circuit holding a first row address applied from the outside together with a command to activate one word line included in said plurality of word lines, and comparing a second row address inputted after said first row address with said first row address; and a plurality of decoders provided to correspond to said plurality of spare word lines, and activating corresponding spare word line on the basis of operation modes preset for said corresponding spare word line.

8. The semiconductor memory device according to claim 7, wherein said operation modes include:

a first operation mode in which said spare word line is used as spare line for said plurality of word lines;

a second operation mode in which said spare memory cells connected to said spare word line are used as memory cells temporarily storing refresh target data during said refresh operation; and a third operation mode in which said spare memory cells connected to said spare word line are used as memory cells temporarily storing the data already read to said plurality of sense amplifiers during said refresh operation.

9. The semiconductor memory device according to claim 8, wherein during the refresh operation, said control circuit outputs a signal, indicating activation of one spare word line included in said plurality of spare word lines, to said row address management circuit, and the decoder corresponding to the spare word line set in said second operation mode activates corresponding said spare word line in accordance with said signal.

10. The semiconductor memory device according to claim 8, wherein during data read, said row address comparison circuit compares said second row address applied together with the read command from the outside with said first row address, and outputs a comparison result to said control circuit, when receiving the comparison result, showing that said second row address coincides with said first row address, from said row address comparison circuit, and executing said refresh operation after the input of said first row address, said control circuit outputs a signal, indicating activation of the spare word line to which the spare memory cells temporarily storing the data of the memory cells connected to said first row address are connected, to said row address management circuit, and executes an operation for outputting, to the outside of the semiconductor memory device, said data read from said spare memory cells to said sense amplifier band in accordance with said signal, and the decoder corresponding to the spare word line set in said third operation mode activates corresponding said spare word line in accordance with said signal.

11. The semiconductor memory device according to claim 7, wherein during data read, said row address comparison circuit compares said second row address applied together with the read command from the outside with said first row address, and outputs a comparison result to said control circuit, when receiving the comparison result, showing that said second row address coincides with said first row address, from said row address comparison circuit, and not executing said refresh operation after the input of said first row address, said control circuit executes an operation for outputting the data held in said sense amplifier band to the outside of the semiconductor memory device.

12. The semiconductor memory device according to claim 7, wherein during data read, said row address comparison circuit compares said second row address applied together with the read command from the outside with said first row address, and outputs a comparison result to said control circuit, when receiving the comparison result, showing that said second row address does not coincide with said first row address, from said row address comparison circuit, said control circuit executes an operation for reading the data from the memory cells included in said memory cell array and connected to the word line corresponding to said second row address, and outputting the read data to the outside of the semiconductor memory device.

13. The semiconductor memory device according to claim 1, further comprising:

another memory block; and a connection circuit connecting said memory block to said another memory block on the basis of an indication from said control circuit, wherein when reading the data from the memory cell array included in said memory block, said control circuit executes an operation for activating said connection circuit, executes an operation for transferring said data from said sense amplifier band included in said memory block to a sense amplifier band included in said another memory block, and executes an operation for outputting said data from the sense amplifier band included in said another memory block to the outside of the semiconductor memory device.

* * * * *